US012457838B2

(12) United States Patent
Tak et al.

(10) Patent No.: US 12,457,838 B2
(45) Date of Patent: Oct. 28, 2025

(54) DISPLAY DEVICE AND METHOD OF FABRICATING THE SAME

(71) Applicant: Samsung Display Co., LTD., Yongin-si (KR)

(72) Inventors: Kyung Seon Tak, Yongin-si (KR); Young Gu Kim, Yongin-si (KR); Yun Hee Park, Yongin-si (KR); Ji Yun Park, Yongin-si (KR); Suk Kung Chei, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 593 days.

(21) Appl. No.: 17/703,490

(22) Filed: Mar. 24, 2022

(65) Prior Publication Data

US 2023/0041748 A1 Feb. 9, 2023

(30) Foreign Application Priority Data

Aug. 9, 2021 (KR) ........................ 10-2021-0104714

(51) Int. Cl.

| | |
|---|---|
| ***H10H 29/14*** | (2025.01) |
| ***H10H 20/821*** | (2025.01) |
| ***H10H 20/831*** | (2025.01) |
| ***H10H 20/84*** | (2025.01) |
| ***H10H 20/851*** | (2025.01) |
| ***H10H 20/855*** | (2025.01) |
| *H10H 20/01* | (2025.01) |

(52) U.S. Cl.

CPC ........ *H10H 29/142* (2025.01); *H10H 20/821* (2025.01); *H10H 20/831* (2025.01); *H10H 20/84* (2025.01); *H10H 20/851* (2025.01); *H10H 20/855* (2025.01); *H10H 20/032* (2025.01); *H10H 20/0361* (2025.01)

(58) Field of Classification Search

CPC ..... H10H 29/142; H10H 29/352; H10H 29/49

See application file for complete search history.

(56) References Cited

U.S. PATENT DOCUMENTS

| | | | | |
|---|---|---|---|---|
| 10,691,237 | B2 | 6/2020 | Cho et al. | |
| 10,916,722 | B2 | 2/2021 | Park et al. | |
| 2020/0073169 | A1* | 3/2020 | Jung | G02F 1/133617 |

(Continued)

FOREIGN PATENT DOCUMENTS

| | | | |
|---|---|---|---|
| KR | 10-2005972 | B1 | 8/2019 |
| KR | 10-2020-0032294 | A | 3/2020 |
| KR | 10-2021-0036099 | A | 4/2021 |

*Primary Examiner* — Matthew L Reames

(74) *Attorney, Agent, or Firm* — Womble Bond Dickinson (US) LLP

(57) ABSTRACT

A display device may include: a substrate including a display area including a pixel area, and a non-display area including a pad area and located at at least one side of the display area; a pixel in the pixel area, the pixel including an emission area in which at least one light emitting element is located, and a non-emission area adjacent to the emission area; a pad in the pad area, the pad being electrically connected to the pixel; a first layer on the light emitting element at the pixel area; and a second layer in the pixel area and the pad area, the second layer including a pad opening formed exposing at least a portion of the pad. The first layer may include an organic layer including a hollow particle. The first layer may be spaced from the pad opening and covered with the second layer.

20 Claims, 33 Drawing Sheets

(56) References Cited

U.S. PATENT DOCUMENTS

| | | | | |
|---|---|---|---|---|
| 2020/0105826 | A1 | 4/2020 | Kim et al. | |
| 2021/0134877 | A1 | 5/2021 | Kim et al. | |
| 2021/0408480 | A1* | 12/2021 | Kato | G09F 9/30 |

* cited by examiner

DISPLAY DEVICE AND METHOD OF FABRICATING THE SAME

CROSS-REFERENCE TO RELATED APPLICATION

This application claims priority to and the benefit of Korean patent application number 10-2021-0104714, filed on Aug. 9, 2021, the entire disclosure of which is incorporated by reference herein.

BACKGROUND

1. Field

Various embodiments of the present disclosure relate to a display device and a method of fabricating the display device.

2. Description of Related Art

Recently, as interest in information display increases, research and development on display devices have been continuously conducted.

SUMMARY

Various embodiments of the present disclosure are directed to a display device in which a first layer (or a low refractive layer) is disposed at a position spaced from a pad opening of a pad area so that a separation defect (or a delamination phenomenon) of the first layer may be reduced or prevented.

Furthermore, various embodiments of the present disclosure are directed to a method of fabricating the display device.

A display device in accordance with one or more embodiments may include: a substrate including a display area including a pixel area, and a non-display area including a pad area and located at at least one side of the display area; a pixel in the pixel area, the pixel including an emission area in which at least one light emitting element is located, and a non-emission area adjacent to the emission area; a pad in the pad area, the pad being electrically connected to the pixel; a first layer on the light emitting element at the pixel area; and a second layer in the pixel area and the pad area, the second layer including a pad exposing at least a portion of the pad. The first layer may include an organic layer including a hollow particle. The first layer may be spaced from the pad opening and covered with the second layer.

In one or more embodiments, the pixel may include: a bank in the non-emission area, the bank including a first opening corresponding to the emission area, and a second opening spaced from the first opening; the light emitting element in the first opening; a first electrode and a second electrode in at least the emission area, and electrically connected to the light emitting element; a color conversion layer on the first and the second electrodes, the color conversion layer being located at the emission area and corresponding to the light emitting element, the color conversion layer including color conversion particles; and a color filter on the second layer and corresponding to the color conversion layer.

In one or more embodiments, the first layer may be on the color conversion layer and include an organic layer configured to recycle light that is emitted from the light emitting element and does not react to the color conversion layer. The second layer may be on the first layer and include an organic layer having a planar surface.

In one or more embodiments, the first layer may not be in the pad area.

In one or more embodiments, the first layer may extend from the pixel area to one area of the pad area. The second layer may be on the first layer and covers the first layer.

In one or more embodiments, the non-display area may further include a dummy pixel area between the display area and the pad area. The substrate, a pixel circuit layer, and the bank may be in the dummy pixel area.

In one or more embodiments, the first layer may extend from the pixel area to the dummy pixel area. The second layer may be on the first layer and cover the first layer.

In one more embodiments, the display device may further include: a first capping layer between the color conversion layer and the first layer; and a second capping layer between the first layer and the second layer.

In one or more embodiments, the first and second capping layers may be located in the pixel area, the dummy pixel area, and the pad area. Each of the first and the second capping layers may include an inorganic layer.

In one or more embodiments, the first and the second capping layers may be partially open in the pad area so that at least a portion of the pad exposed through the pad opening of the second layer is exposed.

In one or more embodiments, the display device may further include a base layer on the second layer. The base layer may include a window component.

In one or more embodiments, the display device may further include a third layer on the base layer. The third layer may include a low reflective film.

In one or more embodiments, the pixel may further include a light block pattern between the second layer and the base layer, the light block pattern corresponding to the non-emission area. The light block pattern may include a black matrix.

In one or more embodiments, the light block pattern may include a first color filter, a second color filter, and a third color filter on one surface of the second layer. The first, the second, and the third color filters may include respective different color filter materials.

A display device in accordance with one or more embodiments may include: a substrate including a display area and a non-display area, the display area including a pixel area including an emission area and a non-emission area, and the non-display area including a dummy pixel area and a pad area and located at at least one side of the display area; a pixel circuit layer in the pixel area and including at least one transistor; a pad in the pad area, and electrically connected to a pixel; a bank on the pixel circuit layer, the bank corresponding to the non-emission area; at least one light emitting element on the pixel circuit layer, the light emitting element corresponding to the emission area, and electrically connected to the transistor; a first electrode and a second electrode in at least the emission area and electrically connected to the light emitting element; a color conversion layer on the first and the second electrodes, the color conversion layer being located in the emission area and corresponding to the light emitting element, the color conversion layer including color conversion particles; a first capping layer in the display area, the dummy pixel area, and the pad area, the first capping layer being directly on the color conversion layer in the display area; a first layer in the display area and located directly on the first capping layer; a second capping layer in the display area, the dummy pixel area, and the pad area, the second capping layer being directly on the first layer and the first capping layer; a second layer on the second capping layer in the display area, the dummy pixel area, and the pad area, the second layer including a pad opening exposing at least a portion of the pad; and a color filter on the second layer and corresponding to the emission area. The first layer may be spaced from the pad opening and covered with the second layer.

In one or more embodiments, the first layer may be on the color conversion layer and include an organic layer configured to recycle light that is emitted from the light emitting element and does not react to the color conversion layer. The second layer may be on the first layer and include an organic layer having a planar surface.

In one or more embodiments, the first layer may not be in the pad area.

A method of fabricating a display device in accordance with one or more embodiments may include: preparing a substrate including a display area including an emission area and a non-emission area, and a non-display area including a pad area; forming a pixel circuit layer including at least one transistor on the substrate in the display area, and forming a pad on the substrate in the non-display area; forming a bank on the pixel circuit layer in the non-emission area; disposing, on the pixel circuit layer in the emission area, a light emitting element electrically connected to the transistor; forming a first electrode and a second electrode that are electrically connected to the light emitting element; forming a color conversion layer including color conversion particles on the first and the second electrodes; forming a first capping layer on the color conversion layer and the bank; forming a first layer on the first capping layer on the color conversion layer; forming a second capping layer on the first layer and the first capping layer; and forming, on the second capping layer, a second layer including a pad opening formed exposing at least a portion of the pad.

In one or more embodiments, the first layer may be spaced from the pad opening and covered with the second layer.

DETAILED DESCRIPTION

Figure 1:
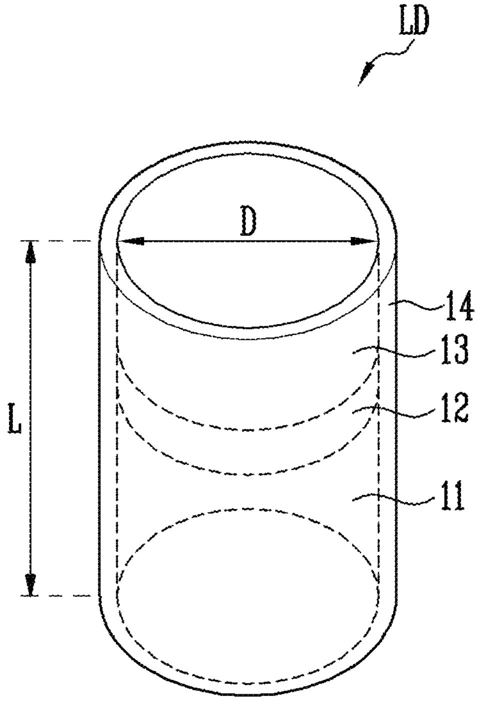
FIGS. 1 and 2 are perspective views schematically illustrating a light emitting element in accordance with one or more embodiments.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the technical scope of the present disclosure are encompassed in the present disclosure.

Throughout the present disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

Embodiments and required details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural form as long as it is not specifically mentioned in a sentence.

Figure 2:
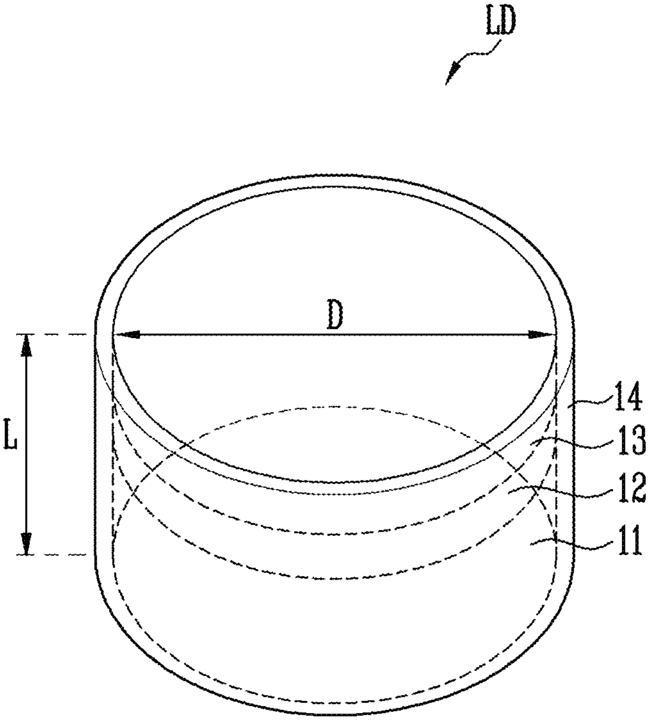
Figure 3:
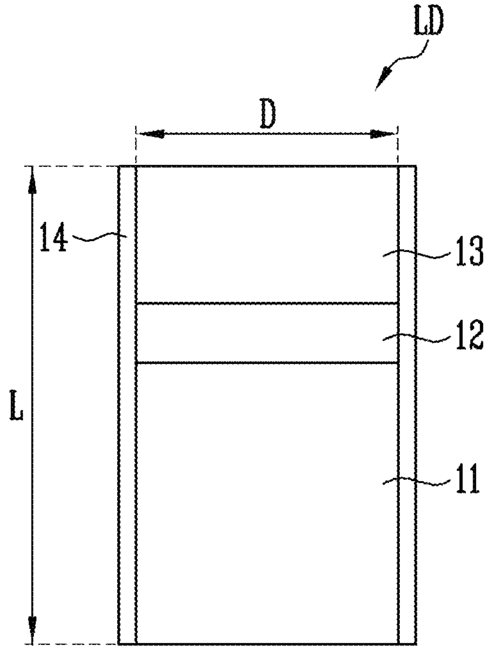
FIG. 3 is a schematically cross-sectional view illustrating the light emitting element of FIG. 1.

FIGS. 1 and 2 are perspective views schematically illustrating a light emitting element LD in accordance with one or more embodiments. FIG. 3 is a schematically cross-sectional view illustrating the light emitting element LD of FIG. 1.

In one or more embodiments, the type and/or shape of the light emitting element LD is not limited to the embodiment illustrated in FIGS. 1 to 3.

Referring to FIGS. 1 to 3, the light emitting element LD may include a first semiconductor layer 11, a second semiconductor layer 13, and an active layer 12 interposed between the first and second semiconductor layers 11 and 13. For example, the light emitting element LD may be implemented as an emission stack (or referred to as "stack") formed by successively stacking the first conductive semiconductor layer 11, the active layer 12, and the second conductive semiconductor layer 13.

The light emitting element LD may be formed in a shape extending in one direction. If the direction in which the light emitting element LD extends is defined as a longitudinal direction, the light emitting element LD may have one end (or a lower end) and a remaining end (or an upper end) with respect to the longitudinal direction. Any one of the first and second semiconductor layers 11 and 13 may be disposed on the one end of the light emitting element LD, and the other one of the first and second semiconductor layers 11 and 13 may be disposed on the remaining end of the light emitting element LD. For example, the first semiconductor layer 11 may be disposed on the one end of the light emitting element LD, and the second semiconductor layer 13 may be disposed on the remaining end of the light emitting element LD.

The light emitting element LD may have various shapes. For example, as illustrated in FIG. 1, the light emitting element LD may have a rod-like shape, a bar-like shape, or a pillar-like shape that is long (i.e., to have an aspect ratio greater than 1) with respect to the longitudinal direction. In one or more embodiments, a length L of the light emitting element LD with respect to the longitudinal direction may be greater than a diameter D (or a width of a cross-section) thereof. However, the present disclosure is not limited thereto. In one or more embodiments, as illustrated in FIG. 2, the light emitting element LD may have a rod-like shape, a bar-like shape, or a pillar-like shape that is short with respect to the longitudinal direction (i.e., to have an aspect ratio less than 1). In one or more embodiments, the light emitting element LD may have a rod-like shape, a bar-like shape, or a pillar-like shape in which the length L there and the diameter D thereof are the same as each other.

The light emitting element LD may include a light emitting diode (LED) fabricated to have a subminiature size, e.g., with a diameter D and/or a length L corresponding to the nanoscale (or the nanometer scale) to the microscale (or the micrometer scale).

In case that the light emitting element LD is long (i.e., to have an aspect ratio greater than 1) with respect to the longitudinal direction, the diameter D of the light emitting element LD may approximately range from 0.5 μm to 6 μm, and the length L thereof may approximately range from 1 μm to 10 μm. However, the diameter D and the length L of the light emitting element LD are not limited thereto. The size of the light emitting element LD may be changed to meet requirements (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant (or an n-type dopant) such as Si, Ge, or Sn. However, the constituent material of the first semiconductor layer 11 is not limited to thereto, and various other materials may be used to form the first conductive semiconductor layer 11. The first semiconductor layer 11 may include, with regard to the longitudinal direction of the light emitting element LD, an upper surface that contacts the active layer 12, and a lower surface exposed to the outside. The lower surface of the first semiconductor layer 11 may correspond to the one end (or the lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer that are provided as one unit. The stain reinforcing layer may have a lattice constant less than that of the barrier layer so that strain, e.g., compressive strain, to be applied to the well layer can be further reinforced. However, the structure of the active layer 12 is not limited to that of the foregoing embodiment.

The active layer 12 may emit light having a wavelength ranging from 400 nm to 900 nm, and use a double hetero structure. In one or more embodiments, a clad layer doped with a conductive dopant may be formed over or under the active layer 12 with respect to the longitudinal direction of the light emitting element LD. For example, the cladding layer may be formed of an AlGaN layer or an InAlGaN layer. In one or more embodiments, material such as AlGaN or InAlGaN may be used to form the active layer 12, and various other materials may be used to form the active layer 12. The active layer 12 may include a first surface that contacts the first semiconductor layer 11, and a second surface which contacts the second semiconductor layer 13.

If an electric field having a desired voltage (e.g., a set or predetermined voltage) or more is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source (e.g., a light emitting source) of various light emitting devices as well as a pixel of the display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant (or a p-type dopant) such as Mg, Zn, Ca, Sr, or Ba. However, the material for forming the second semiconductor layer 13 is not limited thereto, and the second semiconductor layer 13 may be formed of various other materials. The second semiconductor layer 13 may include, with regard to the longitudinal direction of the light emitting element LD, a lower surface that contacts the second surface of the active layer 12, and an upper surface exposed to the outside. Here, the upper surface of the second semiconductor layer 13 may correspond to the remaining end (or the upper end) of the light emitting element LD.

In one or more embodiments, the first semiconductor layer 11 and the second semiconductor layer 13 may have different thicknesses with respect to the longitudinal direction of the light emitting element LD. For example, the first semiconductor layer 11 may have a thickness greater than that of the second semiconductor layer 13 with respect to the longitudinal direction of the light emitting element LD. Hence, the active layer 12 of the light emitting element LD may be disposed at a position closer to the upper surface of the second semiconductor layer 13 than to the lower surface of the first semiconductor layer 11.

Although the first semiconductor layer 11 and the second semiconductor layer 13 each is formed of a single layer, the present disclosure is not limited thereto. In one or more embodiments, depending on the material of the active layer 12, the first semiconductor layer 11, and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the present disclosure is not limited thereto.

In one or more embodiments, the light emitting element LD may further include a contact electrode (hereinafter referred to as 'first contact electrode') disposed over the second semiconductor layer 13 (e.g., the upper end of the light emitting element LD), as well as including the first semiconductor layer 11, the active layer 12, and the second semiconductor layer 13. Furthermore, in one or more embodiments, the light emitting element LD may further include another contact electrode (hereinafter referred to as 'second contact electrode') disposed on one end of the first semiconductor layer 11 (e.g., the lower end of the light emitting element LD).

Each of the first and second contact electrodes may be an ohmic contact electrode, but the present disclosure is not limited thereto. In one or more embodiments, each of the first and second contact electrodes may be a Schottky contact electrode. The first and second contact electrodes may include conductive material. For example, the first and second contact electrodes may include opaque metal such as chrome (Cr), titanium (Ti), aluminum (Al), gold (Au), nickel (Ni), and oxides or alloys thereof, which are used alone or in combination, but the present disclosure is not limited thereto. In one or more embodiments, the first and second contact electrodes may also include transparent conductive oxides such as indium tin oxide (ITO), indium zinc oxide (IZO), zinc oxide ($ZnO_x$), indium gallium zinc oxide (IGZO), and indium tin zinc oxide (ITZO). Here, the zinc oxide ($ZnO_x$) may be zinc oxide (ZnO) and/or zinc peroxide ($ZnO_2$).

Materials included in the first and second contact electrodes may be equal to or different from each other. The first and second contact electrodes may be substantially transparent or translucent. Therefore, light generated from the light emitting element LD may pass through the first and second contact electrodes and then be emitted outside the light emitting element LD. In one or more embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In one or more embodiments, the light emitting element LD may further include an insulating film 14 (or referred to as "insulating layer"). However, in one or more embodiments, the insulating film 14 may be omitted, or may be provided to cover only some of the outer surfaces (e.g., outer peripheral or circumferential surfaces) of the first semiconductor layer 11, the active layer 12, and the second semiconductor layer 13.

The insulating film 14 may prevent the active layer 12 from short-circuiting due to making contact with conductive material except the first and second semiconductor layers 13. Furthermore, the insulating film 14 may reduce or minimize a surface defect of the light emitting element LD, thus enhancing the lifetime of the light emitting element LD and the emission efficiency thereof. In case that a plurality of light emitting elements LD are disposed in close contact with each other, the insulating film 14 may prevent an undesired short-circuit from occurring between the light emitting elements LD. It is not limited whether the insulating film 14 is provided or not, so long as the active layer 12 can be prevented from short-circuiting with external conductive material.

The insulating film 14 may be provided to enclose an overall outer surface (e.g., an overall outer peripheral or circumferential surface) of the emission stack including the first semiconductor layer 11, the active layer 12, and the second semiconductor layer 13.

Although in the foregoing embodiment the insulating film 14 has been described as enclosing the entirety of the respective outer surfaces (e.g., the respective outer peripheral or circumferential surfaces) of the first semiconductor layer 11, the active layer 12, and the second semiconductor layer 13, the present disclosure is not limited thereto. In one or more embodiments, in case that the light emitting element LD includes the first contact electrode, the insulating film 14 may enclose the entirety of the respective outer surfaces (e.g., the respective outer peripheral or circumferential surfaces) of the first semiconductor layer 11, the active layer 12, the second semiconductor layer 13, and the first contact electrode. In one or more embodiments, the insulating film 14 may not enclose the entirety of the outer surface (e.g., the outer peripheral or circumferential surface) of the first contact electrode, or may enclose only a portion of the outer circumferential surface of the first contact electrode but not enclose the other portion of the outer surface (e.g., the outer peripheral or circumferential surface) of the first contact electrode. Furthermore, in one or more embodiments, in case that the first contact electrode is disposed on the remaining end (or the upper end) of the light emitting element LD and the second contact electrode is disposed on the one end (or the lower end) of the light emitting element LD, the insulating film 14 may allow at least one area of each of the first and second contact electrodes to be exposed.

The insulating film 14 may include transparent insulating material. For example, the insulating film 14 may be include one or more insulating materials selected from the group constituting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($CoxO_y$), magnesium oxide (MgO), zinc oxide ($ZnO_x$), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the present disclosure is not limited thereto, and various materials having insulation may be used as the material of the insulating film 14.

The insulating film 14 may be provided in the form of a single layer or in the form of multiple layers including at least double layers. For example, in case that the insulating film 14 is formed of a double layer structure including a first layer and a second layer that are successively stacked, the first layer and the second layer may be made of different materials (or substances) and be formed through different processes. In one or more embodiments, the first layer and the second layer may include the same material and may be formed through a successive process.

In one or more embodiments, the light emitting element LD may be implemented as a light emitting pattern having a core-shell structure. In this case, the first semiconductor layer 11 may be disposed in a core of the light emitting element LD, i.e., a central portion of the light emitting element LD. The active layer 12 may be provided and/or formed to enclose the outer surface (e.g., the outer peripheral surface) of the first semiconductor layer 11. The second semiconductor layer 13 may be provided and/or formed to enclose the outer surface (e.g., the outer peripheral surface) of the active layer 12. Furthermore, the light emitting element LD may further include a contact electrode formed to cover or enclose at least one side of the outer surface (e.g., the outer peripheral surface) of the second semiconductor layer 13. In one or more embodiments, the light emitting element LD may further include an insulating film 14 that is provided on the outer surface (e.g., the outer peripheral surface) of the light emitting pattern having a core-shell structure and has transparent insulating material. The light emitting element LD implemented as the light emitting pattern having the core-shell structure may be fabricated in a growth manner.

The light emitting element LD may be employed as a light emitting source (or a light source) for various display devices. The light emitting element LD may be fabricated through a surface treatment process. For example, the light emitting element LD may be surface-treated so that, when a plurality of light emitting elements LD are mixed with a fluidic solution (or solvent) and then supplied to each pixel area (e.g., an emission area of each pixel or an emission area of each sub-pixel), the light emitting elements LD can be evenly distributed rather than unevenly aggregating in the solution. For example, the light emitting element LD may be surface-treated using hydrophobic material such that the insulating film 14 itself is formed of a hydrophobic layer. Furthermore, for example, the light emitting element LD may be surface-treated such that a hydrophobic layer including hydrophobic material is formed on the insulating film 14.

A light emitting unit (or a light emitting device) including the light emitting element LD described above may be used in various types of devices including a display device that requires a light source. For instance, in case that a plurality of light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires a light source.

Figure 4A:
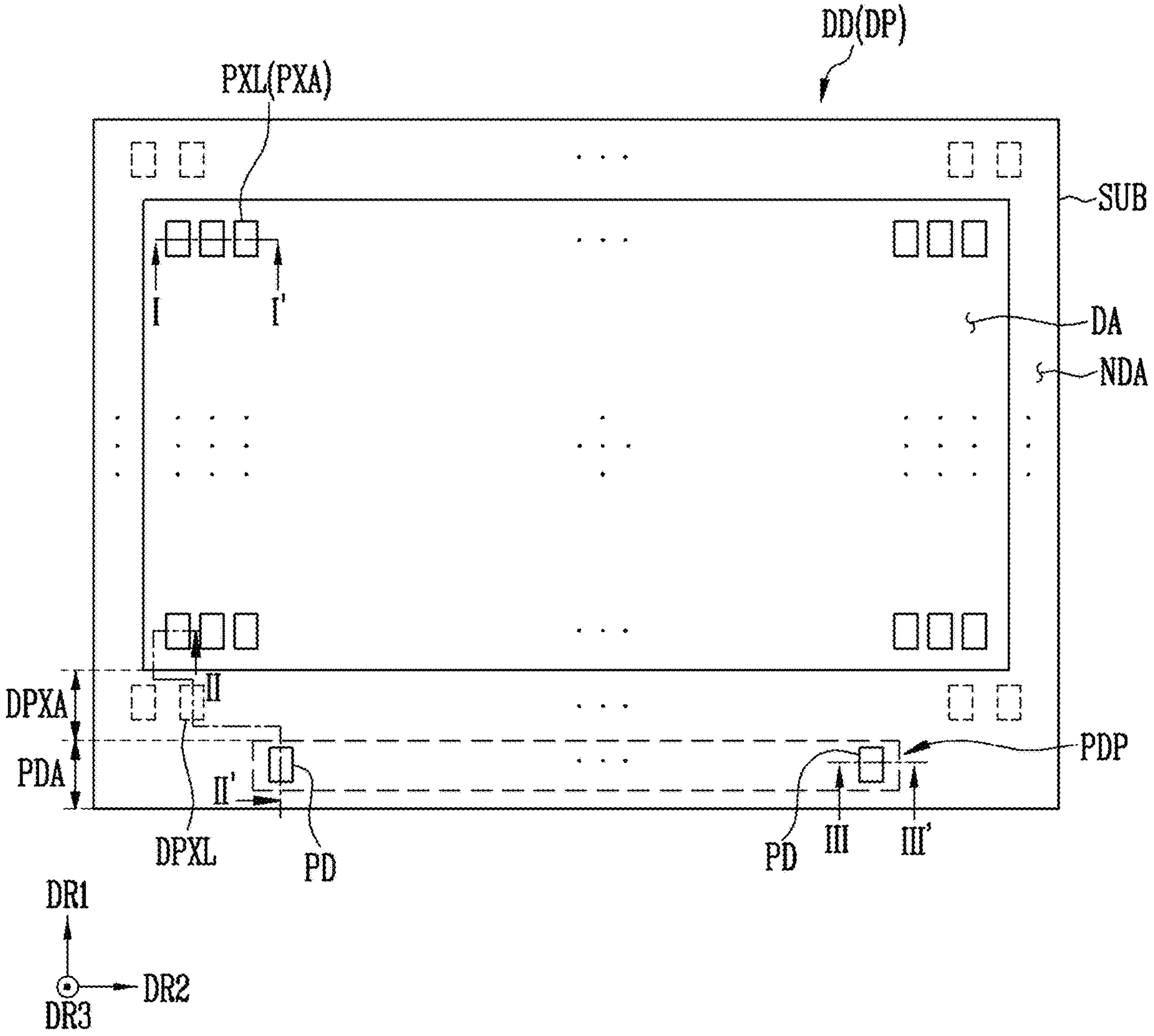
FIGS. 4A and 4B are plan views schematically illustrating a display device in accordance with one or more embodiments.
Figure 4B:
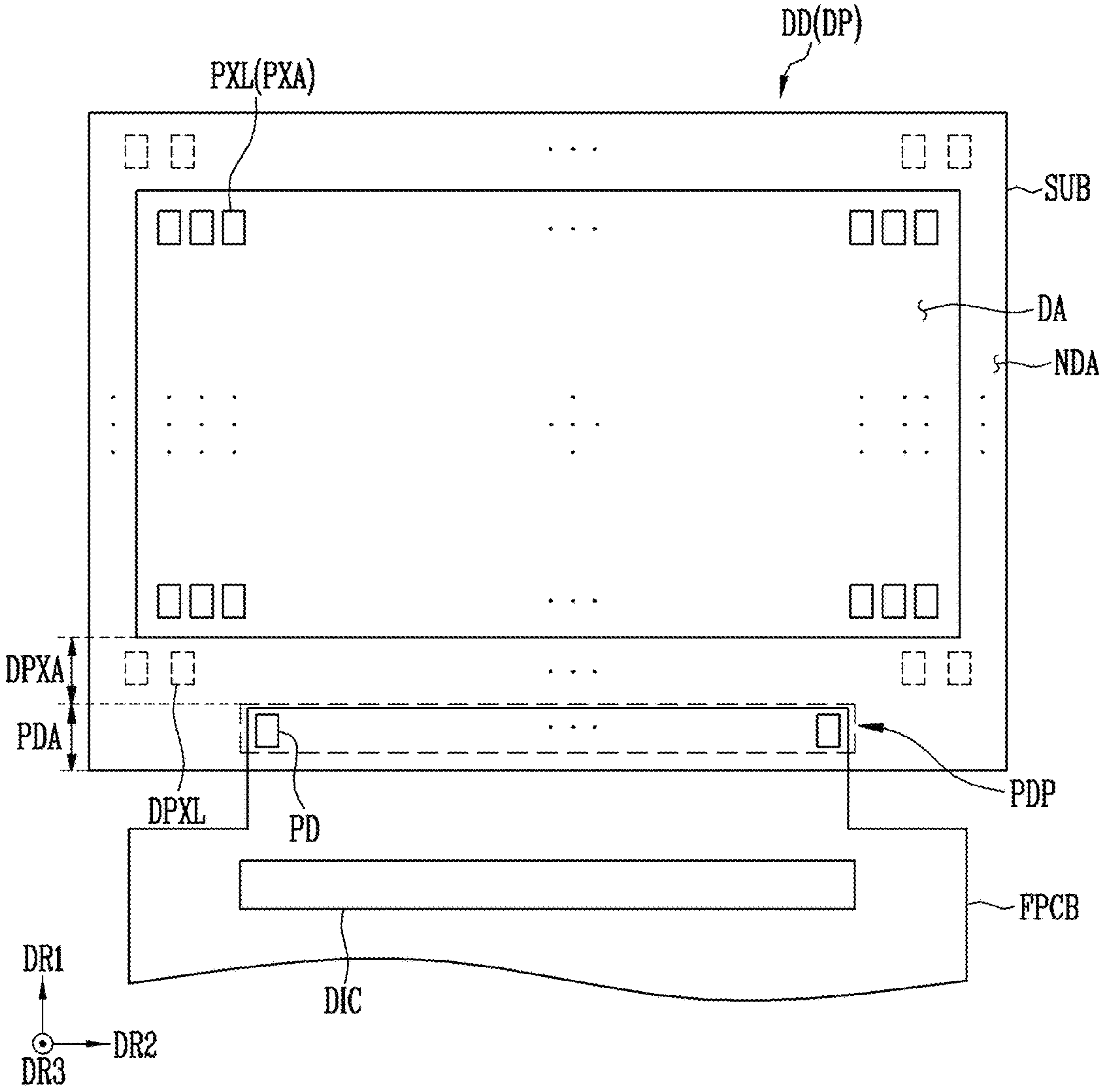

FIGS. 4A and 4B are plan views schematically illustrating a display device DD in accordance with one or more embodiments.

In FIGS. 4A and 4B, for the sake of explanation, there is schematically illustrated the display device DD, particularly, the structure of a display panel DP provided in the display device DD, centered on a display area DA in which an image is displayed.

In one or more embodiments, the term "connection" between two components may embrace electrical connection and physical connection.

If the display device DD is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a PDA, a portable multimedia player (PMP), an MP3 player, a medical appliance, a camera, or a wearable device, the present disclosure may be applied to the display device DD.

Referring to FIGS. 1 to 4B, the display device DD may include a substrate SUB, a plurality of pixels PXL provided (or disposed) on the substrate SUB and each including at least one light emitting element LD, a driver DIC disposed on the substrate SUB and configured to drive the pixels PXL, and a line component configured to connect the pixels PXL with the driver DIC.

The display device DD may be classified into a passive matrix type display device and an active matrix type display device according to a method of driving the light emitting element LD. For example, in case that the display device DD is implemented as an active matrix type, each of the pixels PXL may include a driving transistor configured to control the amount of current to be supplied to the light emitting element LD, and a switching transistor configured to transmit data signals to the driving transistor.

The display device DD may be provided in various forms, for example, in the form of a rectangular plate having two pairs of parallel sides, but the present disclosure is not limited thereto. In case that the display device DD is provided in the form of a rectangular plate, any one pair of sides of the two pairs of sides may be longer than the other pair of sides. For the sake of explanation, there is illustrated the case where the display device DD has a rectangular shape with a pair of long sides and a pair of short sides. A direction in which the long sides extend is indicated by a second direction DR2, a direction in which the short sides extend is indicated by a first direction DR1, and a thickness-wise direction of the substrate SUB is indicated by a third direction DR3. In the display device DD provided in a rectangular planar shape, each corner on which one long side and one short side contact (or meet) each other may have a round shape.

The substrate SUB may include a display area DA and a non-display area NDA around the edge or periphery of the display area DA.

The display area DA may be an area in which the pixels PXL for displaying an image are provided. The non-display area NDA may be an area in which the driver DIC for driving the pixels PXL and a portion of the line component for connecting the pixels PXL to the driver DIC are provided.

The non-display area NDA may be disposed adjacent to the display area DA. The non-display area NDA may be provided in at least one side of the display area DA. For example, the non-display area NDA may enclose the perimeter (or edges) of the display area DA. The line component that is electrically connected to the pixels PXL, and the driver DIC that is electrically connected to the line component and configured to drive the pixels PXL may be provided in the non-display area NDA.

The non-display area NDA may be an area in which lines (e.g., set or predetermined lines, e.g., fanout lines), pads PD, dummy pixels DPXL, and/or an internal circuit that are electrically connected with the pixels PXL to drive the pixels PXL are provided.

In one or more embodiments, the dummy pixels DPXL, the line component, and a pad component PDP may be disposed in the non-display area NDA.

The dummy pixels DPXL may have a structure equal or substantially similar to that of the pixels PXL provided in the display area DA. In one or more embodiments, the dummy pixels DPXL may be disposed in one area of the non-display area NDA, e.g., a dummy pixel area DPXA, and electrically disconnected (or separated) from the pixels PXL. The dummy pixels DPXL may be provided in an isolated shape in the dummy pixel area DPXA. The dummy pixels DPXL may be provided in the dummy pixel area DPXA so as to prevent a defect attributable to a deviation from being caused during a fabricating process, and may be selectively provided depending on embodiments.

The line component may electrically connect the driver DIC with the pixels PXL. The line component may include a fanout line electrically connected with signal lines, e.g., a scan line, a data line, and an emission control line, which are electrically connected to each pixel PXL to provide signals to the pixel PXL. Furthermore, in one or more embodiments, the line component may include a fanout line electrically connected to signal lines, e.g., a control line, and a sensing line, which are electrically connected to each pixel PXL to compensate in real time for variation in electrical characteristics of the pixel PXL. In addition, the line component may include a fanout line electrically connected with power lines that are configured to provide suitable voltages (e.g., set or predetermined voltages) to the respective pixels PXL and electrically connected to the respective pixels PXL.

The pad component PDP may be located in one area of the non-display area NDA, e.g., in a pad area PDA, and include at least one or more pads (or pad electrodes) PD. In one or more embodiments, the pad area PDA may be one area of the non-display area NDA that is located most adjacent to the perimeter (or an edge) of the non-display area NDA. The pads PD may supply (or transmit) driving power voltages and signals for driving the pixels PXL and/or the internal circuit provided in the display area DA. The pads PD may be electrically connected to the corresponding fanout line of the line component to supply the driving power voltages and signals to the corresponding pixels PXL. Each of the pads PD may be exposed to the outside and may be electrically connected to the driver DIC through a separate connector such as a conductive adhesive component.

The substrate SUB may include transparent insulating material to allow light transmission. The substrate SUB may be a rigid substrate or a flexible substrate.

One area on the substrate SUB may be provided as the display area DA in which the pixels PXL are disposed, and the other area thereof may be provided as the non-display area NDA. For example, the substrate SUB may include a display area DA including a plurality of pixel areas in which the respective pixels PXL are disposed, and a non-display area NDA disposed around the perimeter of the display area DA (or adjacent to the display area DA).

The pixels PXL may be provided in the display area DA on the substrate SUB. In one or more embodiments, the pixels PXL may be arranged in the display area DA in a stripe arrangement manner or the like, but the arrangement structure of the pixels PXL is not limited thereto.

Each of the pixels PXL may include at least one light emitting element LD configured to be driven in response to a corresponding scan signal and a corresponding data signal. The light emitting element LD may have a small size ranging from the nanoscale to the microscale and may be electrically connected in parallel to light emitting elements LD disposed adjacent thereto, but the present disclosure is not limited thereto. The light emitting element LD may form a light source of each pixel PXL.

Each of the pixels PXL may include at least one light source, e.g., the light emitting element LD illustrated in FIGS. 1 to 3, which is driven by a suitable signal (e.g., a set or predetermined signal, e.g., a scan signal and a data signal) and/or a suitable power supply (e.g., a set or predetermined power supply, e.g., a first driving power supply and a second driving power supply). However, in one or more embodiments, the type of the light emitting element LD that may be used as a light source of each of the pixels PXL is not limited thereto.

The display device DD may further include a circuit board FPCB electrically connected to the display panel DP through the pad component PDP, as illustrated in FIG. 4B. The circuit board FPCB may be a flexible printed circuit board, but the present disclosure is not limited thereto.

The circuit board FPCB may process various signals input from a printed circuit board and output the processed signals to the display panel DP. To this end, one end of the circuit board FPCB may be attached to the display panel DP, and a remaining end of the circuit board FPCB that is opposite to the one end may be attached to the printed circuit board. The circuit board FPCB may be electrically connected to each of the display panel DP and the printed circuit board by a conductive adhesive component. The conductive adhesive component may include an anisotropic conductive film.

The driver DIC may be located on the circuit board FPCB. The driver DIC may include input/output pads electrically connected to the pads PD included in the pad component PDP. For example, the driver DIC may be an integrated circuit (IC). The driver DIC may receive driving signals output from the printed circuit board, and output suitable signals (e.g., set or predetermined signals) and/or power voltages (e.g., set or predetermined driving power voltages, etc.) to be supplied to the pixels PXL based on the received driving signals. The signals (e.g., the set or predetermined signals) and the driving power voltages (e.g., the set or predetermined driving power voltages) may be supplied to corresponding pads PD of the pad component PDP through some of the input/output pads.

Figure 5:
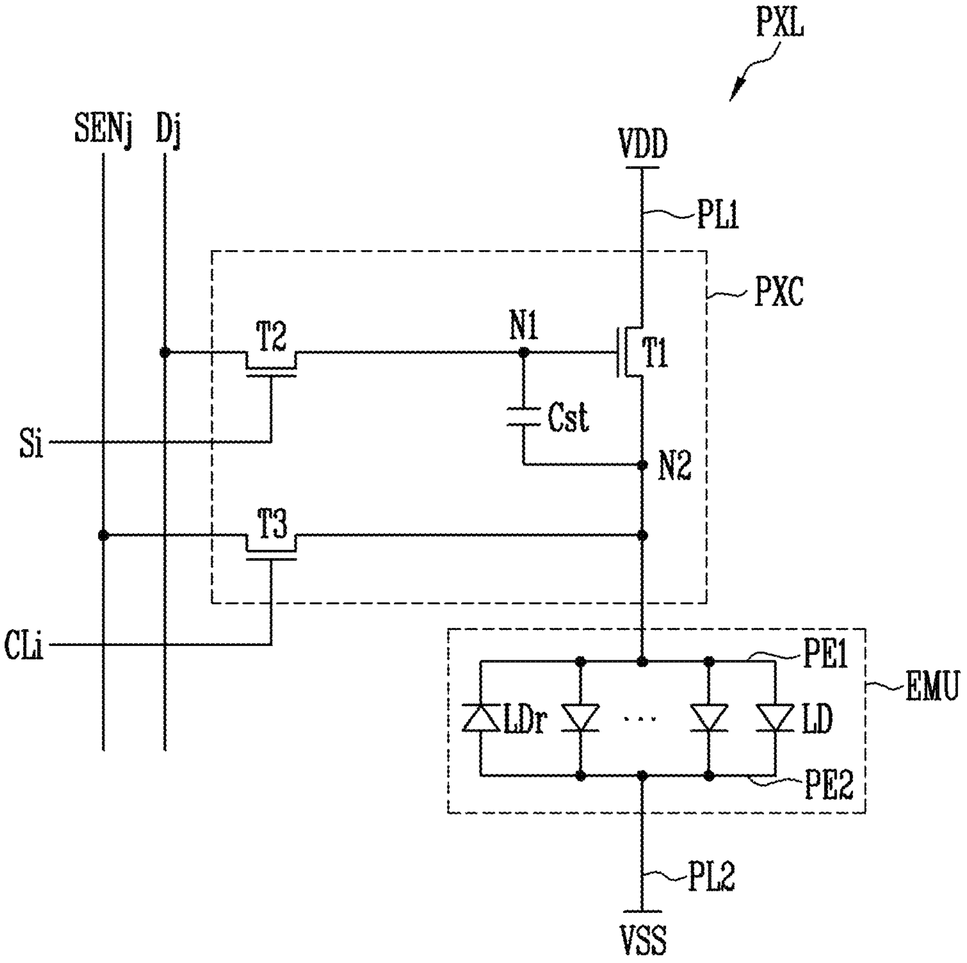
FIGS. 5 and 6 are circuit diagrams illustrating various embodiments of an electrical connection relationship of components included in each pixel illustrated in FIG. 4.
Figure 6:
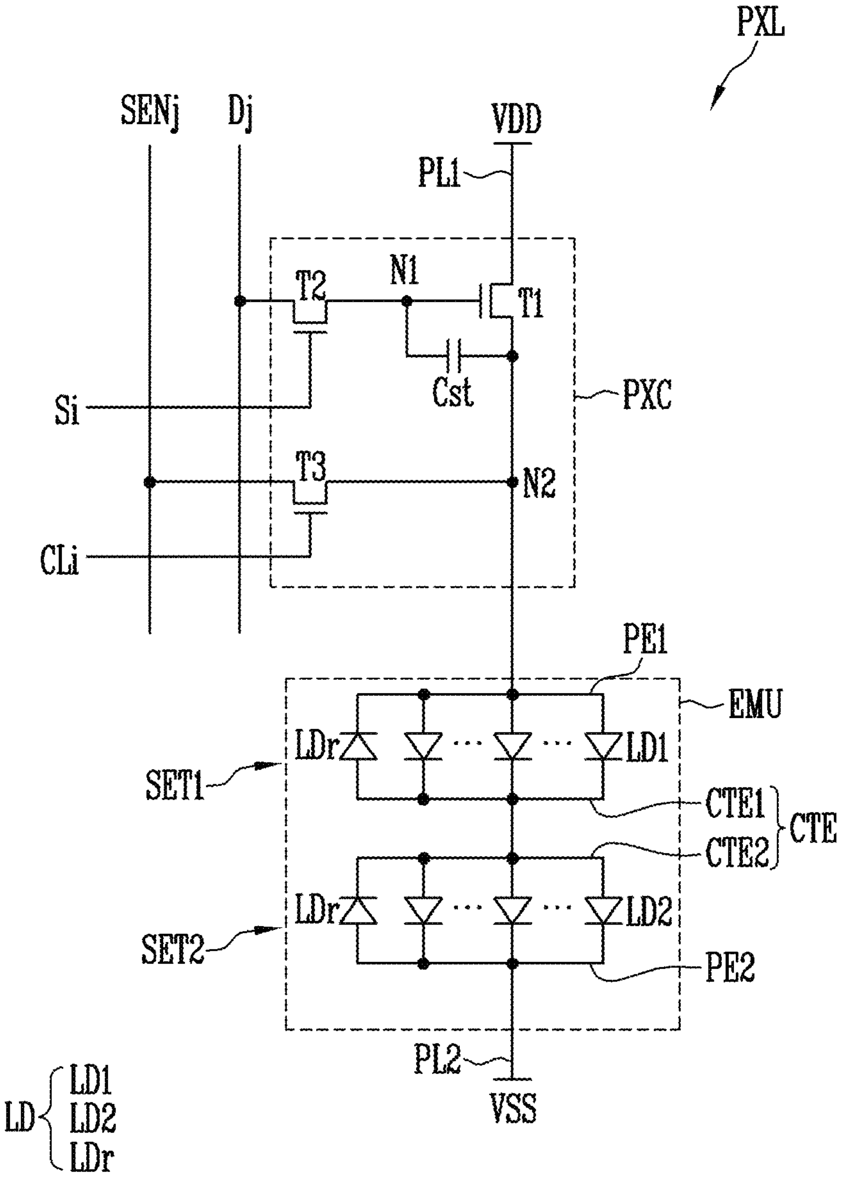

FIGS. 5 and 6 are circuit diagrams illustrating various embodiments of an electrical connection relationship of components included in the pixel PXL illustrated in FIG. 4A.

For example, FIGS. 5 and 6 illustrate various embodiments of the electrical connection relationship of components included in the pixel PXL that may be employed in an active matrix type display device. However, the types of the components included in the pixel PXL to which embodiments of the disclosure may be applied are not limited thereto.

In FIGS. 5 and 6, not only the components included in the pixel PXL illustrated in FIG. 4A but also an area in which the components are provided (or located) may be embraced in the definition of the term "pixel PXL".

Referring to FIGS. 1 to 6, the pixel PXL may include an emission unit EMU (or an emitter) configured to generate light having a luminance corresponding to a data signal. Furthermore, the pixel PXL may selectively further include a pixel circuit PXC configured to drive the emission unit EMU.

In one or more embodiments, the emission unit EMU may include a plurality of light emitting elements LD electrically connected in parallel between a first power line PL1 that is electrically connected to a first driving power supply VDD and to which a voltage of the first driving power supply VDD is applied, and a second power line PL2 that is electrically connected to a second driving power supply VSS and to which a voltage of the second driving power supply VSS is applied. For example, the emission unit EMU may include a first pixel electrode (or a first electrode) PE1 electrically connected to the first driving power supply VDD via the pixel circuit PXC and the first power line PL1, a second pixel electrode (or a second electrode) PE2 electrically connected to the second driving power supply VSS through the second power line PL2, and a plurality of light emitting elements LD electrically connected in parallel to each other in the same direction between the first and second pixel electrodes PE1 and PE2. In one or more embodiments, the first pixel electrode PE1 may be an anode, and the second pixel electrode PE2 may be a cathode.

Each of the light emitting elements LD included in the emission unit EMU may include one end electrically connected to the first driving power supply VDD through the first pixel electrode PE1, and a remaining end electrically connected to the second driving power supply VSS through the second pixel electrode PE2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are electrically connected in parallel to each other in the same direction (e.g., in a forward direction) between the first pixel electrode PE1 and the second pixel electrode PE2 to which the voltages of the different power supplies are supplied may form respective valid light sources.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of corresponding frame data to the emission unit EMU. The driving current supplied to the emission unit EMU may be divided into parts that flow into the respective light emitting elements LD. Hence, each of the light emitting elements LD may emit light having a luminance corresponding to current applied thereto, so that the emission unit EMU may emit light having a luminance corresponding to the driving current.

Although there has been described the embodiment in which the opposite ends of the light emitting elements LD are electrically connected in the same direction between the first and second driving power supplies VDD and VSS, the present disclosure is not limited thereto. In one or more embodiments, the emission unit EMU may further include at least one invalid light source, e.g., a reverse light emitting element LDr (e.g., see, FIG. 5), as well as including the light emitting elements LD that form the respective valid light sources. The reverse light emitting element LDr, along with the light emitting elements LD that form the valid light sources, may be electrically connected in parallel to each other between the first and second pixel electrodes PE1 and PE1. Here, the reverse light emitting element LDr may be electrically connected between the first and second pixel electrodes PE1 and PE2 in a direction opposite to that of the light emitting elements LD. Even if a suitable driving voltage (e.g., a set or predetermined driving voltage, e.g., a forward driving voltage) is applied between the first and second pixel electrodes PE1 and PE2, the reverse light emitting element LDr remains disabled. Hence, current substantially does not flow through the reverse light emitting element LDr.

The pixel circuit PXC may be electrically connected to a scan line Si and a data line Dj of the pixel PXL. The pixel circuit PXC may be electrically connected to a control line CLi and a sensing line SENj of the pixel PXL. For example, in case that the pixel PXL is disposed on an i-th row and a j-th column of the display area DA, the pixel circuit PXC of the pixel PXL may be electrically connected to an i-th scan line Si, a j-th data line Dj, an i-th control line CLi, and a j-th sensing line SENj of the display area DA.

The pixel circuit PXC may include first to third transistors T1 to T3, and a storage capacitor Cst.

The first transistor T1 may be a driving transistor configured to control driving current to be applied to the emission unit EMU and may be electrically connected between the first driving power supply VDD and the emission unit EMU. In detail, a first terminal of the first transistor T1 may be electrically connected (or coupled) to the first driving power supply VDD through the first power line PL1. A second terminal of the first transistor T1 may be electrically connected to a second node N2. A gate electrode of the first transistor T1 may be electrically connected to a first node N1. The first transistor T1 may control, in response to a voltage applied to the first node N1, the amount of driving current to be applied from the first driving power supply VDD to the emission unit EMU through the second node N2. In one or more embodiments, the first terminal of the first transistor T1 may be a drain electrode, and the second terminal of the first transistor T1 may be a source electrode, however, the present disclosure is not limited thereto. In one or more embodiments, the first terminal may be a source electrode, and the second terminal may be a drain electrode.

The second transistor T2 may be a switching transistor that selects a pixel PXL in response to a scan signal and activates the pixel PXL, and may be electrically connected between the data line Dj and the first node N1. A first terminal of the second transistor T2 may be electrically connected to the data line Dj. A second terminal of the second transistor T2 may be electrically connected to the first node N1. A gate electrode of the second transistor T2 may be electrically connected to the scan line Si. The first terminal and the second terminal of the second transistor T2 are different terminals, and, for example, if the first terminal is a drain electrode, and the second terminal is a source electrode.

When a scan signal having a gate-on voltage (e.g., a high level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are electrically connected to each other. The second transistor T2 may transmit a data signal to the gate electrode of the first transistor T1.

The third transistor T3 may obtain a sensing signal through the sensing line SENj by connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL can be compensated for. A second terminal of the transistor T3 may be electrically connected to the second terminal of the first transistor T1 (e.g., source terminal of the first transistor T1) and the second node N2. A first terminal of the third transistor T3 may be electrically connected to the sensing line SENj. A gate electrode of the third transistor T3 may be electrically connected to the control line CLi. Furthermore, in one or more embodiments, the first terminal of the third transistor T3 may be electrically connected to an initialization power supply. The third transistor T3 may be an initialization transistor configured to initialize the second node N2, and may be turned on when a sensing control signal is supplied thereto from the control line CLi, so that a voltage of the initialization power supply may be transmitted to the second node N2. Hence, a second storage electrode of the storage capacitor Cst electrically connected to the second node N2 may be initialized.

A first storage electrode of the storage capacitor Cst may be electrically connected to the first node N1. A second storage electrode of the storage capacitor Cst may be electrically connected to the second node N2. The storage capacitor Cst may be charged with a data voltage (or holds a charge) corresponding to a data signal to be supplied to the first node N1 during one frame period. Hence, the storage capacitor Cst may store a voltage corresponding to a difference between a voltage of the gate electrode of the first transistor T1 and a voltage of the second node N2 (i.e., the source electrode of the first transistor T1).

Although FIG. 5 illustrates an embodiment in which all of the light emitting elements LD that form the emission unit EMU are electrically connected in parallel to each other, the present disclosure is not limited thereto. In one or more embodiments, the emission unit EMU may include at least one serial set (or stage) including a plurality of light emitting elements LD electrically connected in parallel to each other. In one or more embodiments, as illustrated in FIG. 6, the emission unit EMU may have a serial/parallel combination structure.

Referring to FIG. 6, the emission unit EMU may include first and second serial sets SET1 and SET2 that are successively electrically connected between the first and second driving power supplies VDD and VSS. Each of the first and second serial sets SET1 and SET2 may include two electrodes PE1 and CTE1, and CTE2 and PE2, respectively, that form an electrode pair of the corresponding serial set, and a plurality of light emitting elements LD electrically connected in parallel to each other in the same direction between the two electrodes PE1 and CTE1, and CTE2 and PE2.

The first serial set (or the first stage) SET1 may include a first pixel electrode PE1, a first intermediate electrode CTE1, and at least one first light emitting element LD1 electrically connected between the first pixel electrode PE1 and the first intermediate electrode CTE1. Furthermore, the first serial set SET1 may include a reverse light emitting element LDr electrically connected between the first pixel electrode PE1 and the first intermediate electrode CTE1 in a direction opposite to that of the first light emitting element LD1.

The second serial set (or the second stage) SET2 may include a second intermediate electrode CTE2, a second pixel electrode PE2, and at least one second light emitting element LD2 electrically connected between the second intermediate electrode CTE2 and the second pixel electrode PE2. Furthermore, the second serial set SET2 may include a reverse light emitting element LDr electrically connected between the second intermediate electrode CTE2 and the second pixel electrode PE2 in a direction opposite to that of the second light emitting element LD2.

The first intermediate electrode CTE1 and the second intermediate electrode CTE2 may be electrically and/or physically connected with each other. The first intermediate electrode CTE1 and the second intermediate electrode CTE2 may form an intermediate electrode CTE that electrically connect the first serial set SET1 and the second serial set SET2 that are successively provided.

In the foregoing embodiment, the first pixel electrode PE1 of the first serial set SET1 may be an anode of each pixel PXL, and the second pixel electrode PE2 of the second serial set SET2 may be a cathode of the corresponding pixel PXL.

As described above, the emission unit EMU of the pixel PXL including the serial sets SET1 and SET2 (or the light emitting elements LD) electrically connected to each other in the serial/parallel combination structure may easily adjust driving current/voltage conditions in response to specifications of a product to which the emission unit EMU is to be applied.

For example, the emission unit EMU of the pixel PXL including the serial sets SET1 and SET2 (or the light emitting elements LD) electrically connected to each other in the serial/parallel combination structure may reduce driving current, compared to that of the emission unit EMU having a structure such that the light emitting elements LD are electrically connected only in parallel to each other. Furthermore, the emission unit EMU of the pixel PXL including the serial sets SET1 and SET2 electrically connected to each other in the serial/parallel combination structure may reduce driving current to be applied to the opposite ends of the emission unit EMU, compared to that of the emission unit having a structure such that all of the light emitting elements LD, the number of which is the same as that of the emission unit EMU, are electrically connected in series to each other. In addition, the emission unit EMU of the pixel PXL including the serial sets SET1 and SET2 (or the light emitting elements LD) electrically connected to each other in the serial/parallel combination structure may increase the number of light emitting elements LD included between the electrodes PE1, CTE1, CTE2, and PE2, compared to that of the emission unit having a structure such that all of the serial sets (or stages) are electrically connected in series to each other. In this case, the light output efficiency of the light emitting elements LD may be enhanced. Even if a defect is caused in a specific serial set (or stage), the ratio of light emitting elements LD that cannot emit light due to the defect may be reduced, so that a reduction in the light output efficiency of the light emitting elements LD may be mitigated.

Although FIGS. 5 and 6 illustrate one or more embodiments where all of the first, second, third transistors T1, T2, and T3 included in the pixel circuit PXC are formed of N-type transistors, the present disclosure is not limited thereto. For example, at least one of the first, second, and third transistors T1, T2, and T3 may be changed to a P-type transistor. Furthermore, although FIGS. 5 and 6 illustrate one or more embodiments where the emission unit EMU is electrically connected between the pixel circuit PXC and the second driving power supply VSS, the emission unit EMU may be electrically connected between the first driving power supply VDD and the pixel circuit PXC.

The structure of the pixel circuit PXC may be changed in various ways. For example, the pixel circuit PXC may further include at least one transistor element such as a transistor element configured to initialize the first node N1, and/or a transistor element configured to control an emission time of the light emitting elements LD, or other circuit elements such as a boosting capacitor for boosting the voltage of the first node N1.

The structure of the pixel PXL that may be applied to the present disclosure is not limited to the embodiments illustrated in FIGS. 5 and 6, and the pixel PXL may have various structures. For example, the pixel PXL may be configured in a passive light emitting display device, or the like. In this case, the pixel circuit PXC may be omitted, and the opposite ends of the light emitting elements LD included in the emission unit EMU may be directly electrically connected to the scan lines Si, the data linen Dj, the first power line PL1 to which a voltage of the first driving power supply VDD is to be applied, the second power line PL2 to which a voltage of the second driving power supply VSS is to be applied, and/or a control line (e.g., a set or predetermined control line).

Figure 7:
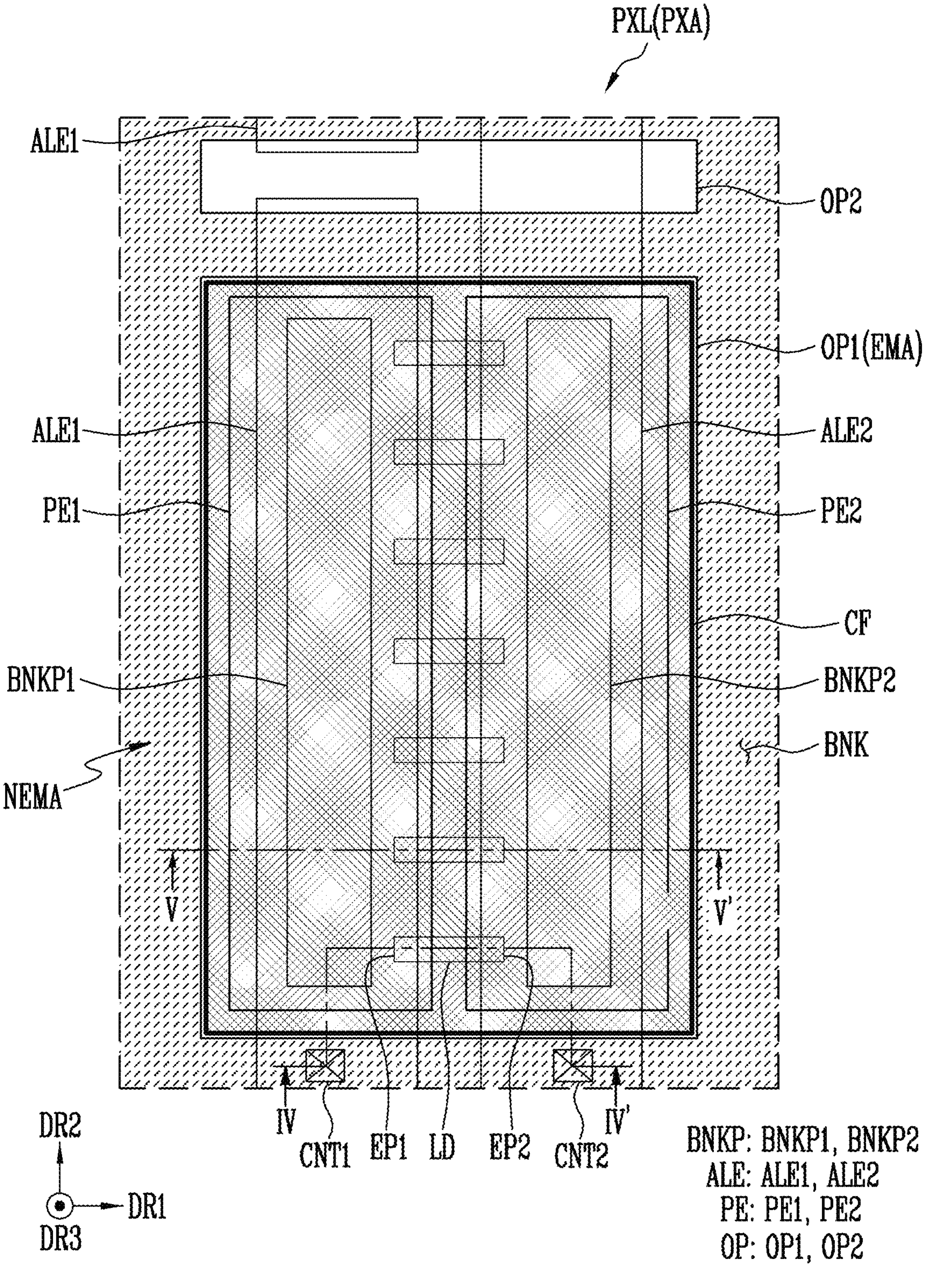
FIG. 7 is a plan view schematically illustrating each pixel illustrated in FIG. 4A.

FIG. 7 is a plan view schematically illustrating each pixel PXL illustrated in FIG. 4A.

In FIG. 7, for the sake of explanation, a transverse direction (or a horizontal direction) in a plan view is indicated by a first direction DR1, a longitudinal direction (or a vertical direction) in a plan view is indicated by a second direction DR2, and a thickness-wise direction of the substrate SUB is indicated by a third direction DR3. The first, second, third directions DR1, DR2, and DR3 may refer to the directions indicated by the first, second, third directions DR1, DR2, and DR3, respectively.

In addition, in one or more embodiments, the term "connection" between two components may embrace electrical connection and physical connection, but the present disclosure is not limited thereto.

Referring to FIGS. 1 to 5, and 7, the pixel PXL may be disposed in a pixel area PXA provided (or defined) on the substrate SUB. The pixel area PXA may include an emission area EMA and a non-emission area NEMA.

The pixel PXL may include a bank BNK disposed in the non-emission area NEMA, and a color filter CF disposed in the emission area EMA.

The bank BNK may be a structure for defining (or partitioning) the respective pixel areas PXA (or the respective emission areas EMA) of the pixel PXL and pixels PXL adjacent thereto and, for example, may be a pixel defining layer.

In one or more embodiments, the bank BNK may be a pixel defining layer or a dam structure for defining each emission area EMA to which the light emitting elements LD are to be supplied, during a process of supplying (or inputting) the light emitting elements LD to the pixel PXL. For example, because the emission area EMA of the pixel PXL is defined by the bank BNK, a mixed solution (e.g., ink) including a target amount and/or type of light emitting elements LD may be supplied (or input) to the emission area EMA.

The bank BNK may include at least one light block material and/or reflective material, thus preventing a light leakage defect in which light (or rays) leaks between the pixel PXL and the pixels PXL adjacent thereto. In one or more embodiments, the bank BNK may include transparent material (or substance). The transparent material may include, for example, polyamides resin, polyimides resin, etc., but the present disclosure is not limited thereto. In one or more embodiments, in order to enhance the efficiency of light emitted from the pixel PXL, a separate reflective material layer may be provided and/or formed on the bank BNK.

The bank BNK may include, in the pixel area PXA, at least one opening OP that expose components disposed thereunder. For example, the bank BNK may include a first opening OP1 and a second opening OP2 that exposes components disposed under the bank BNK in the pixel area PXA. In one or more embodiments, the emission area EMA of the pixel PXL and the first opening OP1 of the bank BNK may correspond to each other.

In the pixel area PXA, the second opening OP2 may be disposed at a position spaced from the first opening OP1, and disposed adjacent to one side of the pixel area PXA, e.g., an upper side of the pixel area PXA.

In one or more embodiments, the second opening OP2 may be an electrode separation area where at least one alignment electrode ALE is separated from at least one alignment electrode ALE provided in pixels PXL adjacent thereto in the second direction DR2.

The color filter CF may be disposed over the light emitting elements LD and correspond to the emission area EMA of the pixel PXL. The color filter CF may allow light that travels to the color filter CF to selectively pass therethrough. The color filter CF may include a red color filter, a green color filter, or a blue color filter. For example, if the pixel PXL is a red pixel, the color filter CF may include a red color filter. If the pixel PXL is a green pixel, the color filter CF may include a green color filter. If the pixel PXL is a blue pixel, the color filter CF may include a blue color filter. The color filter CF may correspond to the first opening OP1 of the bank BNK and may be disposed in the emission area EMA of the pixel PXL.

The pixel PXL may include pixel electrodes PE provided in at least the emission area EMA, light emitting elements LD electrically connected to the pixel electrodes PE, alignment electrodes ALE provided at positions corresponding to the pixel electrodes PE, and bank patterns BNKP provided under the alignment electrodes ALE such that each overlaps (or covers) at least one alignment electrode ALE in the third direction DR3. For example, the pixel PXL may include first and second pixel electrodes PE1 and PE2, light emitting elements LD, first and second alignment electrodes ALE1 and ALE2, and first and second bank patterns BNKP1 and BNKP2, which are provided in at least the emission area EMA.

The pixel PXL may include at least one pair of pixel electrodes PE, at least one pair of alignment electrodes ALE, and/or bank patterns BNKP. The pixel electrodes PE, the alignment electrodes ALE, and/or the bank patterns BNKP each may be changed in number, shape, size, arrangement structure, etc. in various ways depending on the structure of the pixel PXL (particularly, the emission unit EMU).

In one or more embodiments, based on one surface of the substrate SUB on which the pixel PXL is provided, the bank patterns BNKP, the alignment electrodes ALE, the light emitting elements LD, and the pixel electrodes PE may be provided in the order listed, but the present disclosure is not limited thereto. The positions and formation sequence of the electrode patterns and/or insulating patterns that form the pixel PXL may be changed in various ways depending on embodiments. Description of a stacked structure of the pixel PXL will be described below with reference to FIGS. 8 to 13.

The bank patterns BNKP may be provided in at least the emission area EMA, and may be spaced from each other with respect to the first direction DR1 in the emission area EMA, and each may extend in the second direction DR2.

Each bank pattern BNKP (referred also to as "wall pattern", "protrusion pattern", or "support pattern") may have a uniform width in the emission area EMA. For example, each of the first and second bank patterns BNKP1 and BNKP2 may have a bar-like shape having a uniform width in the emission area EMA, in a plan view.

The bank pattern BNKP may be a support component that supports each of the first and second alignment electrodes ALE1 and ALE2 to change a surface profile (or a surface shape) of each of the first and second alignment electrodes ALE1 and ALE2 so that light emitted from the light emitting elements LD can be guided in an image display direction of the display device DD.

The bank patterns BNKP may have the same width or different widths. For example, the first and second bank patterns BNKP1 and BNKP2 may have the same width or different widths with respect to the first direction DR1 in at least the emission area EMA.

Each of the first and second bank patterns BNKP1 and BNKP2 may partially overlap at least one alignment electrode ALE in at least the emission area EMA in the third direction DR3. For example, the first bank pattern BNKP1 may be disposed under the first alignment electrode ALE1 to overlap one area of the first alignment electrode ALE1 in the third direction DR3. The second bank pattern BNKP2 may be disposed under the second alignment electrode ALE2 to overlap one area of the second alignment electrode ALE2 in the third direction DR3.

Because the bank patterns BNKP are provided under one area of each of the alignment electrodes ALE in the emission area EMA, the one area of each of the alignment electrodes ALE in areas where the bank patterns BNKP are formed may protrude in an upward direction of the pixel PXL. Consequently, a wall structure may be formed around the light emitting elements LD. For example, the wall structure may be formed in the emission area EMA and face the first and second ends EP1 and EP2 of the light emitting elements LD.

In one or more embodiments, in case that the bank patterns BNKP and/or the alignment electrodes ALE include reflective material, a reflective wall structure may be formed around the light emitting elements LD. Hence, light emitted from the light emitting elements LD may be oriented in an upward direction of the pixel PXL (e.g., in the image display direction of the display device DD), so that the light efficiency of the pixel PXL may be further improved.

The alignment electrodes ALE may be disposed at least in the emission area EMA, and may be spaced from each other with respect to the first direction DR1 in the emission area EMA, and each may extend in the second direction DR2. Furthermore, the alignment electrodes ALE may be separated, by removing a portion thereof in the second opening OP2 of the bank BNK, from the alignment electrodes ALE of the pixels PXL that are adjacent to each other in the second direction DR2.

In one or more embodiments, the alignment electrodes ALE may include a first alignment electrode (or a first alignment line) ALE1 and a second alignment electrode (or a second alignment line) ALE2 that are arranged at positions spaced from each other with respect to the first direction DR1.

At least one of the first and second alignment electrodes ALE1 and ALE2 may be separated from other electrodes (e.g., an alignment electrode ALE provided in each of pixels PXL adjacent thereto in the second direction DR2) in the second opening OP2 (or the electrode separation area) of the bank BNK after the light emitting elements LD are supplied to and aligned in the pixel area PXA (or the emission area EMA) during a process of fabricating the display device DD. For example, one end of the first alignment electrode ALE1 may be separated, in the second opening OP2 of the bank BNK, from the first alignment electrode ALE1 of the pixel PXL that is disposed on an upper side of the corresponding pixel PXL in the second direction DR2.

The first alignment electrode ALE1 may be electrically connected with the first transistor T1 described with reference to FIG. 5 through a first contact portion CNT1. The second alignment electrode ALE2 may be electrically connected with the second power line PL2 described with reference to FIG. 5 through a second contact portion CNT2.

The first contact portion CNT1 may be formed by removing a portion of at least one insulating layer disposed between the first alignment electrode ALE1 and the first transistor T1. The second contact portion CNT2 may be formed by removing a portion of at least one insulating layer disposed between the second alignment electrode ALE2 and the second power line PL2. The first contact portion CNT1 and the second contact portion CNT2 may be disposed in the non-emission area NEMA and overlap the bank BNK in the third direction DR3, but the present disclosure is not limited thereto. In one or more embodiments, the first and second contact portions CNT1 and CNT2 may be disposed in the second opening OP2 of the bank BNK that is an electrode separation area, and may be disposed in the emission area EMA.

The first alignment electrode ALE1 may be disposed on the first bank pattern BNKP1 in at least the emission area EMA and overlap the first bank pattern BNKP1. The second alignment electrode ALE2 may be disposed on the second bank pattern BNKP2 in at least the emission area EMA and overlap the second bank pattern BNKP2. As described above, each of the first and second alignment electrodes ALE1 and ALE2 may be provided and/or formed on the corresponding bank pattern BNKP and have a surface profile corresponding to the shape of the bank pattern BNKP disposed thereunder. Hence, light emitted from the light emitting elements LD may be reflected by each of the first and second alignment electrodes ALE1 and ALE2 and more reliably travel in the image display direction of the display device DD. The bank pattern BNKP and the alignment electrodes ALE may be used as a reflective component configured to guide light emitted from the light emitting elements LD in a desired direction and thus enhance the light efficiency of the display device DD. Consequently, the light output efficiency of the light emitting elements LD in each pixel PXL may be enhanced.

Each of the first alignment electrode ALE1 and the second alignment electrode ALE2 may be supplied with a suitable signal (e.g., a set or predetermined signal or a set or predetermined alignment signal) from an alignment pad disposed in one area of the non-display area NDA, e.g., in the pad area PDA, at the step of aligning the light emitting elements LD. For example, the first alignment electrode ALE1 may be supplied with a first alignment signal (or a first alignment voltage) from a first alignment pad. The second alignment electrode ALE2 may be supplied with a second alignment signal (or a second alignment voltage) from a second alignment pad. The above-mentioned first and second alignment signals may be signals having a voltage difference and/or a phase difference enabling the light emitting elements LD to be aligned between the first and second alignment electrodes ALE1 and ALE2. At least one of the first and second alignment signals may be an AC signal, but the present disclosure is not limited thereto.

Each alignment electrode ALE may have a bar-like shape having a uniform width with respect to the second direction DR2, but the present disclosure is not limited thereto. In one or more embodiments, each alignment electrode ALE may or may not have a bent portion in the non-emission area NEMA and/or the second opening OP2 of the bank BNK that is an electrode separation area, and the shape and/or size thereof in areas other than the emission area EMA may be changed in various ways rather than being particularly limited.

Although at least two to several tens of light emitting elements LD may be aligned and/or provided in the emission area EMA (or the pixel area PXA), the number of light emitting elements LD is not limited thereto. In one or more embodiments, the number of light emitting elements LD aligned and/or provided in the emission area EMA (or the pixel area PXA) may be changed in various ways.

The light emitting elements LD may be disposed between the first alignment electrode ALE1 and the second electrode ALE2. Each of the light emitting elements LD may be the light emitting element LD described with reference to FIGS. 1 and 3. Each of the light emitting elements LD may include a first end EP1 (or one end) and a second end EP2 (or a remaining end) that are disposed on opposite ends thereof with respect to the longitudinal direction. In one or more embodiments, the second semiconductor layer 13 including a p-type semiconductor layer may be disposed on the first end EP1, and the first semiconductor layer 11 including an n-type semiconductor layer may be disposed on the second end EP2. The light emitting elements LD may be electrically connected in parallel between the first alignment electrode ALE1 and the second electrode ALE2.

Each of the light emitting elements LD may emit any one light of color light and/or white light. Each of the light emitting elements LD may be aligned between the first alignment electrode ALE1 and the second alignment electrode ALE2 such that the longitudinal direction is parallel with the first direction DR1. In one or more embodiments, the light emitting elements LD may be aligned between the first alignment electrode ALE1 and the second alignment electrode ALE2 such that at least some of the light emitting elements LD are not completely parallel with the first direction DR1. For example, some light emitting elements LD may be aligned to be inclined with respect to the first direction DR1 between the first alignment electrode ALE1 and the second alignment electrode ALE2. The light emitting elements LD may be provided in a diffused form in a solution and then supplied (or input) to the pixel area PXA (or the emission area EMA).

The light emitting elements LD may be input (or supplied) to the pixel area PXA (or the emission area EMA) by an inkjet printing method, a slit coating method, or other various methods. For example, the light emitting elements LD may be mixed with a volatile solvent and then input (or supplied) to the pixel area PXA by an inkjet printing method or a slit coating method. Here, if the first alignment electrode ALE1 and the second alignment electrode ALE2 are respectively supplied with corresponding alignment signals, an electric field may be formed between the first alignment electrode ALE1 and the second alignment electrode ALE2. Consequently, the light emitting elements LD may be aligned between the first alignment electrode ALE1 and the second alignment electrode ALE2. After the light emitting elements LD are aligned, the solvent may be removed by a volatilization scheme or other schemes. In this way, the light emitting elements LD may be reliably aligned between the first alignment electrode ALE1 and the second alignment electrode ALE2.

The pixel electrodes (or the electrodes) PE may be provided in at least the emission area EMA, and each may be provided at a position corresponding to at least one alignment electrode ALE and the light emitting elements LD. For example, each pixel electrode PE may be formed on the corresponding alignment electrode ALE and the corresponding light emitting elements LD to overlap the corresponding alignment electrode ALE and the corresponding light emitting elements LD, and thus electrically connected to at least the light emitting elements LD.

The first pixel electrode ("first electrode" or "anode") PE1 may be formed on the first alignment electrode ALE1 and the respective first ends EP1 of the light emitting elements LD, and thus electrically connected to the respective first ends EP1 of the light emitting elements LD. Furthermore, the first pixel electrode PE1 may directly contact, in at least the emission area EMA, the first alignment electrode ALE1 that is exposed by removing a portion of at least one insulating layer disposed between the first pixel electrode PE1 and the first alignment electrode ALE1, and may be electrically and/or physically connected with the first alignment electrode ALE1. Although a connection point (or a contact point) between the first pixel electrode PE1 and the first alignment electrode ALE1 is located in the emission area EMA, the present disclosure is not limited thereto. In one or more embodiments, the connection point (or the contact point) between the first pixel electrode PE1 and the first alignment electrode ALE1 may be located in the non-emission area NEMA, e.g., the second opening OP2 of the bank BNK that is an electrode separation area. Descriptions of an embodiment in which the connection point (or the contact point) between the first pixel electrode PE1 and the first alignment electrode ALE1 is located in the second opening OP2 of the bank BNK will be described below with reference to FIGS. 19 to 21.

The first pixel electrode PE1 may have a bar-like shape extending in the second direction DR2, but the present disclosure is not limited thereto. In one or more embodiments, the shape of the first pixel electrode PE1 may be changed in various ways so long as the first pixel electrode PE1 can be electrically and/or physically reliably connected with the first ends EP1 of the light emitting elements LD. Furthermore, the shape of the first pixel electrode PE1 may be changed in various ways, taking into account the connection relationship with the first alignment electrode AEL1 disposed thereunder.

The second pixel electrode ("second electrode" or "cathode") PE2 may be formed on the second alignment electrode ALE2 and the respective second ends EP2 of the light emitting elements LD, and thus electrically connected to the respective second ends EP2 of the light emitting elements LD. Furthermore, the second pixel electrode PE2 may directly contact, in at least the emission area EMA, the second alignment electrode ALE2 that is exposed by removing a portion of at least one insulating layer disposed between the second pixel electrode PE2 and the second alignment electrode ALE2, and may be electrically and/or physically connected with the second alignment electrode ALE2. A connection point (or a contact point) between the second pixel electrode PE2 and the second alignment electrode ALE2 may be located in the emission area EMA or the non-emission area NEMA.

The second pixel electrode PE2 may have a bar-like shape extending in the second direction DR2, but the present disclosure is not limited thereto. In one or more embodiments, the shape of the second pixel electrode PE2 may be changed in various ways so long as the second pixel electrode PE2 can be electrically and physically reliably connected with the second ends EP2 of the light emitting elements LD. Furthermore, the shape of the second pixel electrode PE2 may be changed in various ways, taking into account the connection relationship with the second alignment electrode AEL2 disposed thereunder.

Hereinafter, the stacked structure of the pixel PXL in accordance with the foregoing embodiment will be mainly described with reference to FIGS. 8 to 13.

Figure 8:
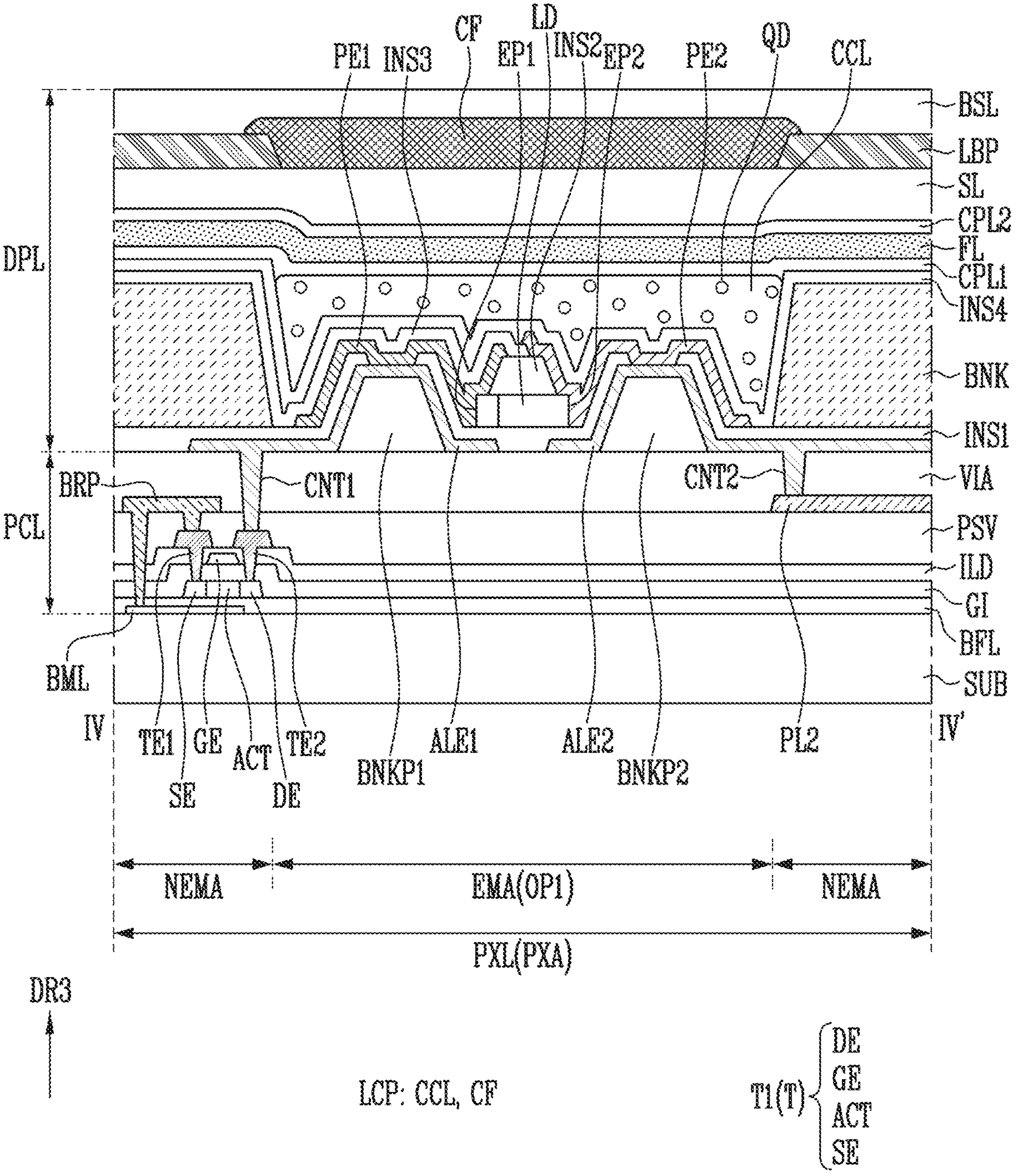
FIG. 8 is a schematically cross-sectional view taken along the line IV-IV' of FIG. 7.

FIG. 8 is a schematically cross-sectional view taken along the line IV-IV' of FIG. 7, and FIGS. 9 to 13 are schematically cross-sectional views taken along the line V-V' of FIG. 7.

In the description of embodiments, "components are provided and/or formed on the same layer" may mean that the components are formed through the same process, and "components are provided and/or formed on different layers may mean that the components are formed through different processes.

Figure 9:
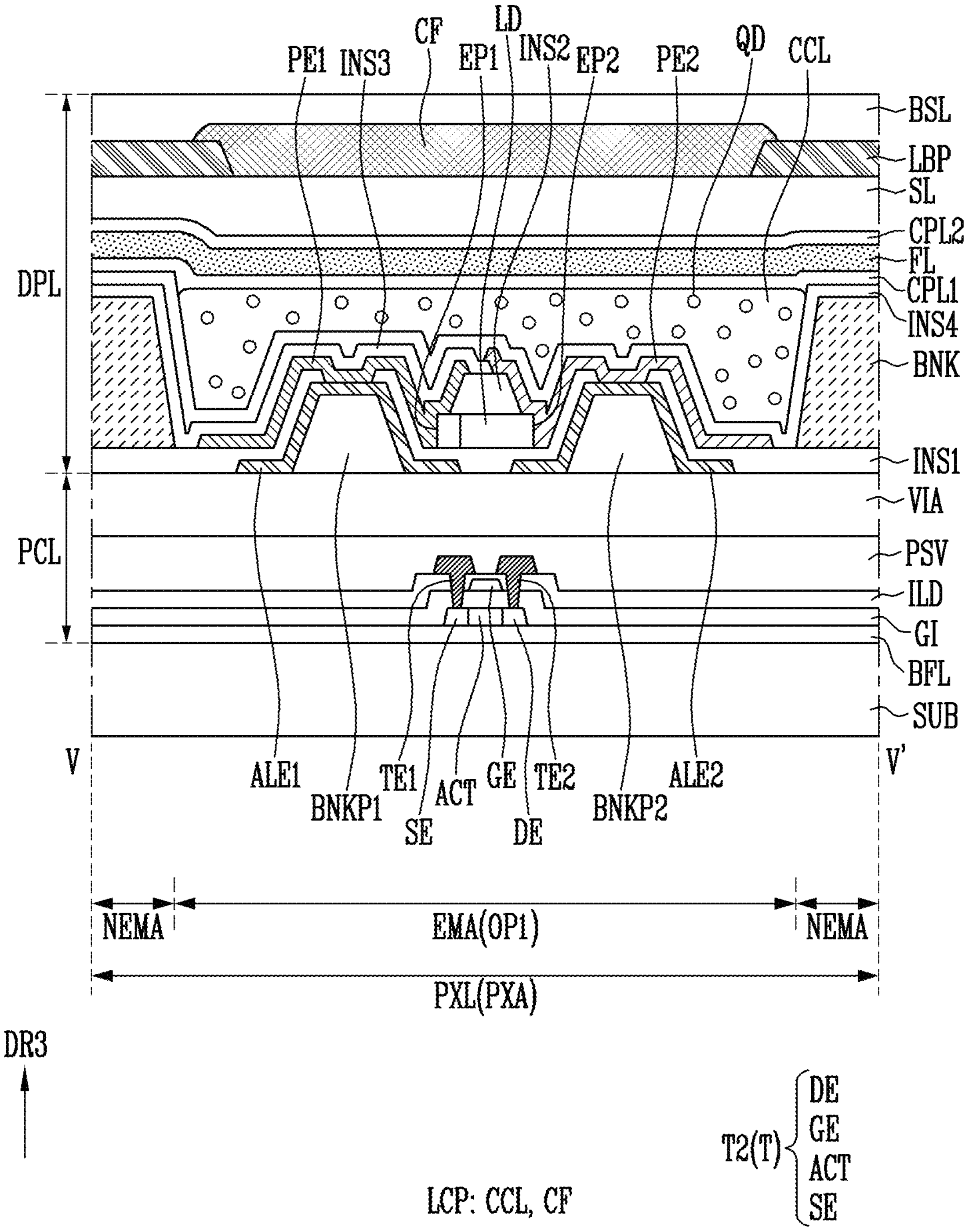
FIGS. 9 to 13 are schematically cross-sectional views taken along the line V-V' of FIG. 7.
Figure 11:
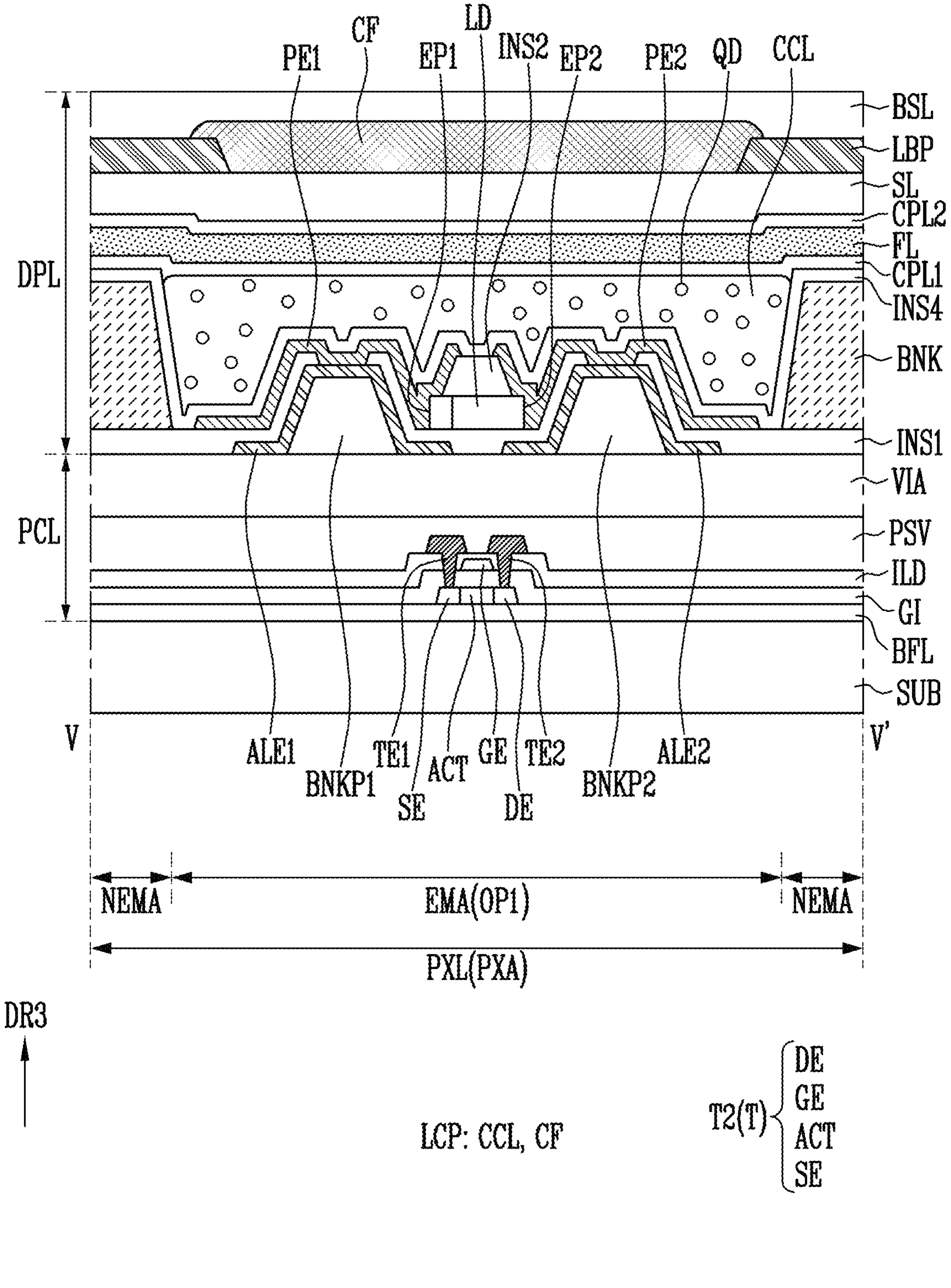

FIGS. 9 and 11 illustrate different embodiments pertaining to the step of forming the first and second pixel electrodes PE1 and PE2 and whether the first insulating layer INS3 is present or not. For example, FIG. 9 illustrates an embodiment in which the second pixel electrode PE2 is formed after the first pixel electrode PE1 and a third insulating layer INS3 are formed. FIG. 11 illustrates an embodiment in which the first pixel electrode PE1 and the second pixel electrode PE2 are formed on the same layer.

Figure 10:
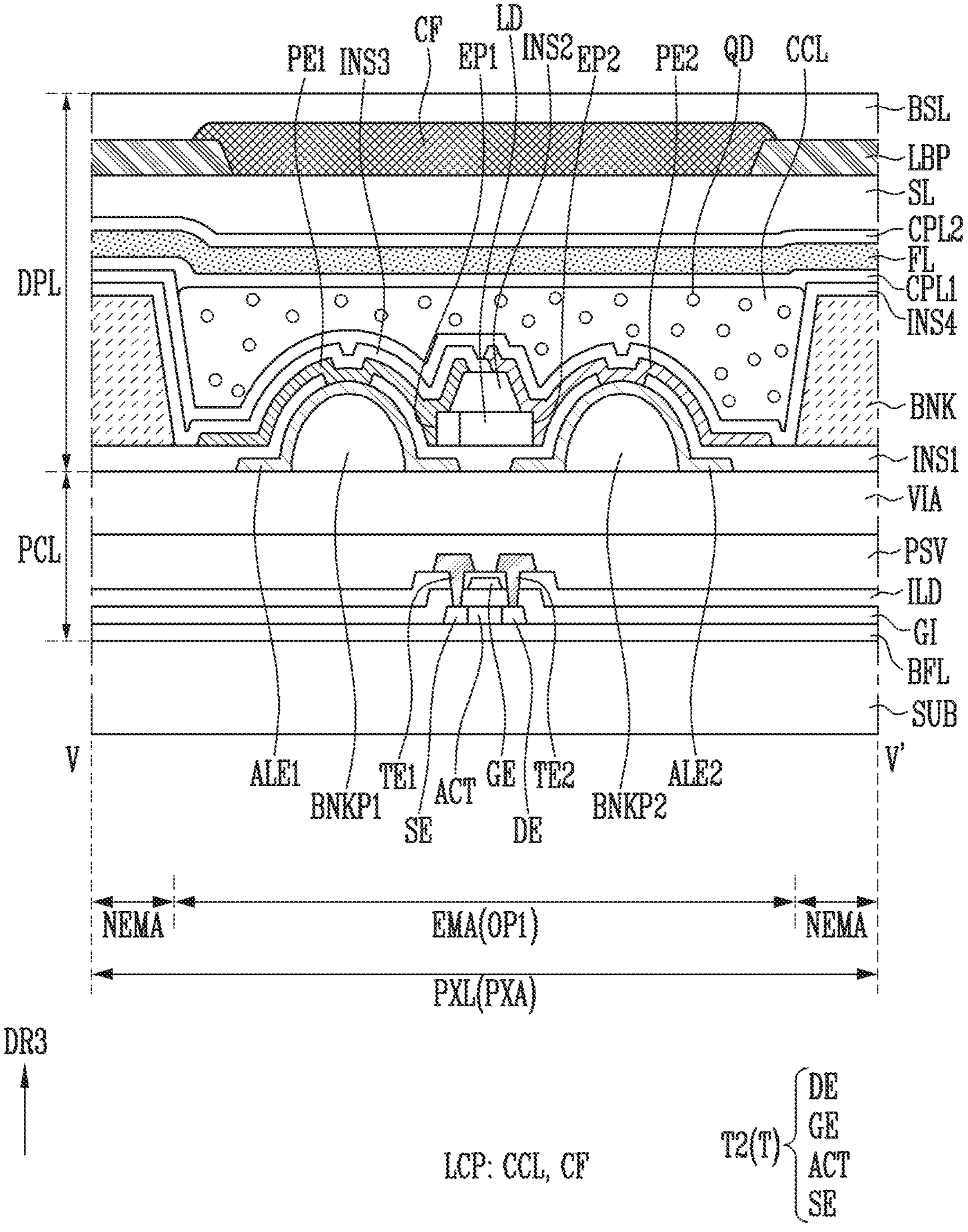

FIG. 10 illustrates a modification of the embodiment of FIG. 9 with regard to the bank pattern BNKP, etc.

Figure 12:
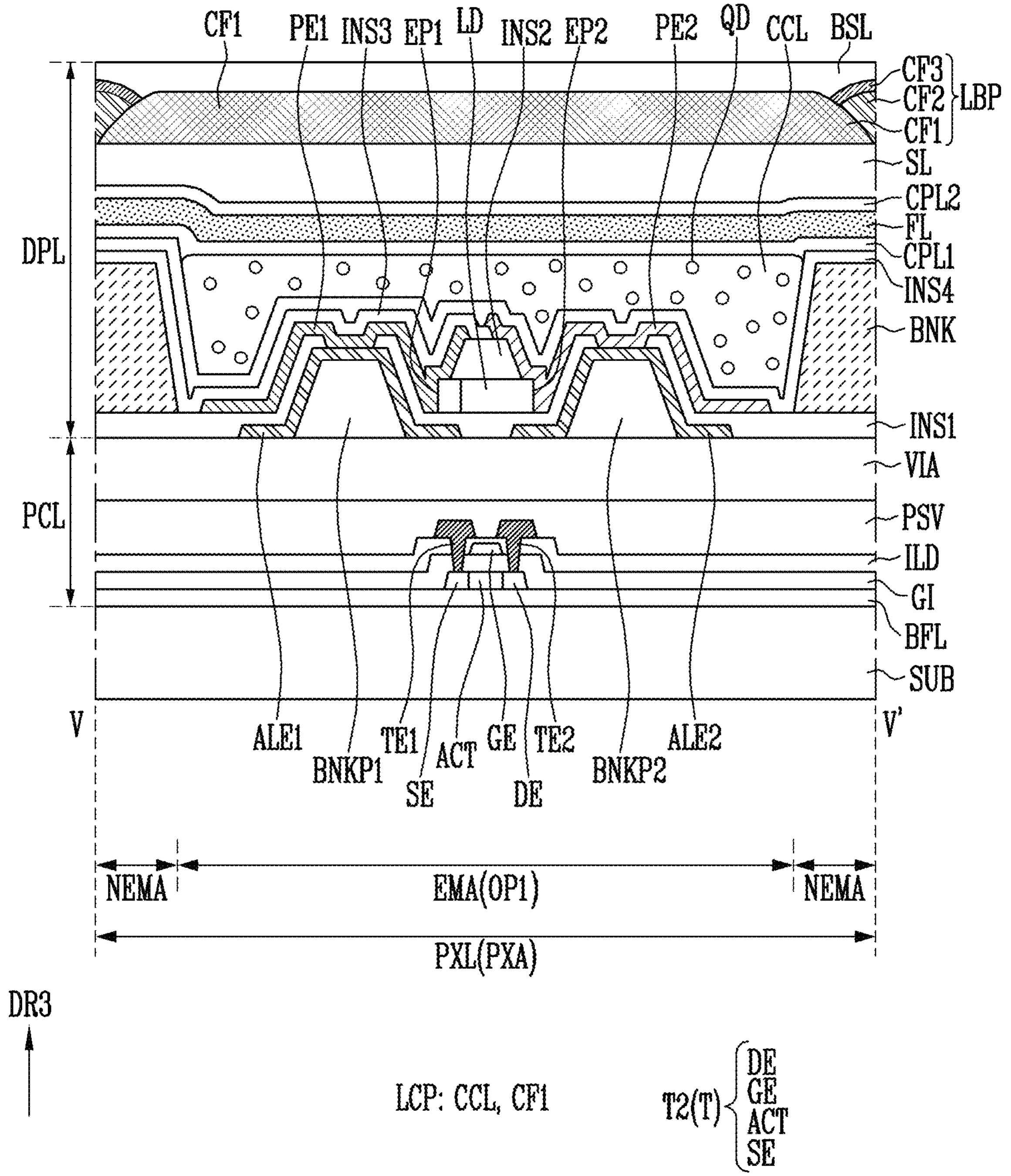

FIG. 12 illustrates a modification of the embodiment of FIG. 9 with regard to a light block pattern LBP, etc.

Figure 13:
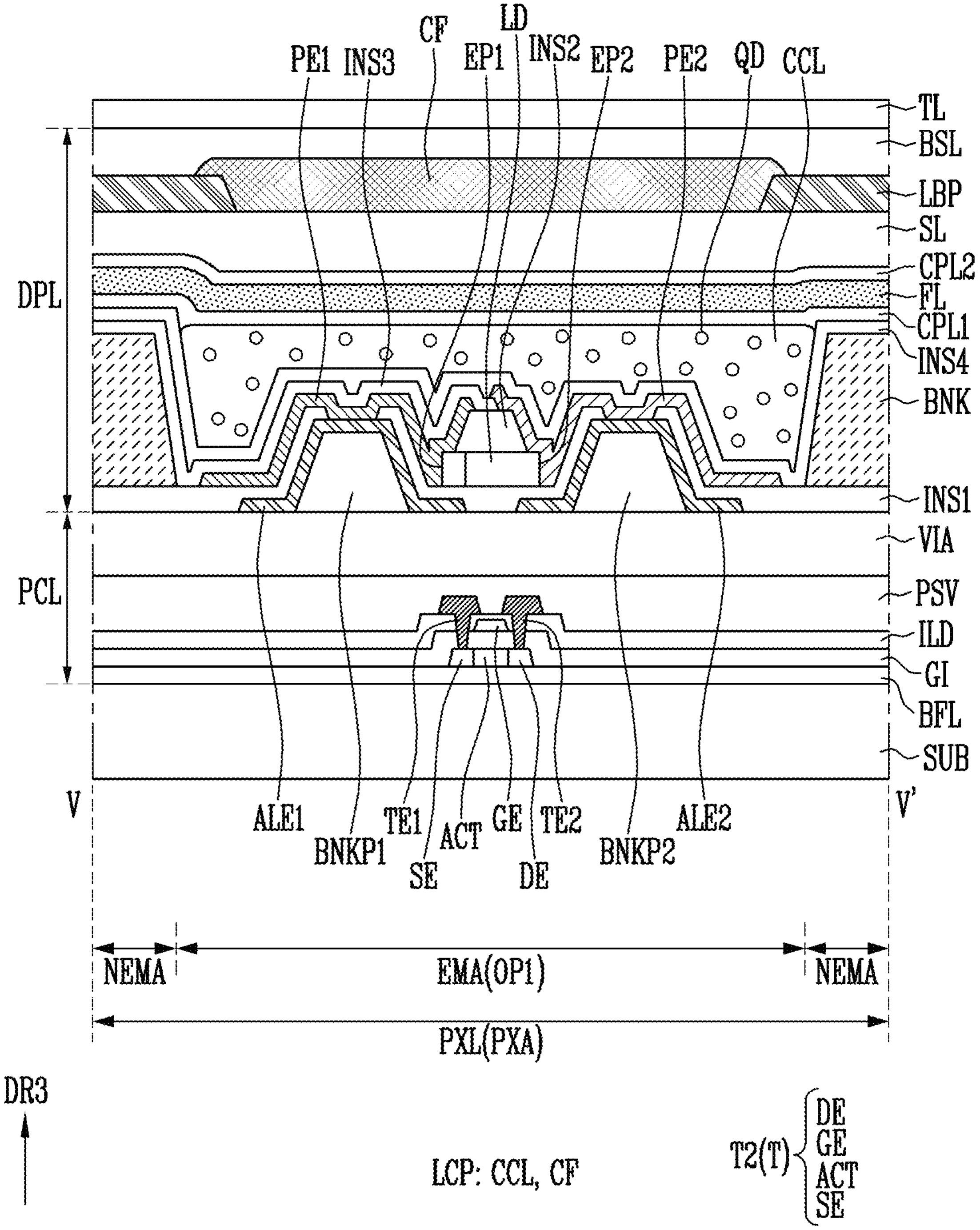

FIG. 13 illustrates a modification of the embodiment of FIG. 9 with regard to a third layer TL, etc.

Although FIGS. 8 to 13 simply illustrate a pixel PXL, e.g., illustrating that each electrode is formed of an electrode having a single-layer (or single-film) structure and each insulating layer is formed of an insulating layer having a single-layer (or single-film) structure, the present disclosure is not limited thereto.

Furthermore, in FIGS. 8 to 13, a height direction (or a vertical direction) in a cross-sectional view is represented by a third direction DR3.

Referring to FIGS. 1 to 5 and 7 to 13, the pixel PXL may include a substrate SUB, a pixel circuit layer PCL, and a display element layer DPL.

The pixel circuit layer PCL and the display element layer DPL may be disposed on one surface of the substrate SUB and overlap each other. For example, the display area DA of the substrate SUB may include the pixel circuit layer PCL disposed on the one surface of the substrate SUB, and the display element layer DPL disposed on the pixel circuit layer PCL. However, relative positions of the pixel circuit layer PCL and the display element layer DPL on the substrate SUB may be changed depending on embodiments. In case that the pixel circuit layer PCL and the display element layer DPL are separated from each other as separate layers and overlap each other, layout space sufficient to form each of the pixel circuit PXC and the emission unit EMU may be secured.

The substrate SUB may include transparent insulating material to allow light transmission. The substrate SUB may be a rigid substrate or a flexible substrate.

For example, the rigid substrate SUB may be one of a glass substrate, a quartz substrate, a glass ceramic substrate, and a crystalline glass substrate.

The flexible substrate SUB may be either a film substrate or a plastic substrate that includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In each pixel area PXA of the pixel circuit layer PCL, circuit elements (e.g., transistors T) for forming the pixel circuit PXC of the corresponding pixel PXL and signal lines (e.g., set or predetermined signal lines) electrically connected to the circuit elements may be disposed. Furthermore, in each pixel area PXA of the display element layer DPL, the alignment electrodes ALE, the light emitting elements LD, and the pixel electrodes PE that form the emission unit EMU of the corresponding pixel PXL may be disposed.

The pixel circuit layer PCL may include at least one insulating layer as well as including the circuit elements and the signal lines. For example, the pixel circuit layer PCL may include a buffer layer BFL, a gate insulating layer GI, an interlayer insulating layer ILD, a passivation layer PSV, and a via layer VIA that are successively stacked on the substrate SUB in the third direction DR3.

The buffer layer BFL may prevent impurities from diffusing into a transistor T included in the pixel circuit PXC. The buffer layer BFL may be an inorganic insulating layer formed of inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single-layer structure or a multi-layer structure having at least two or more layers. In case that the buffer layer BFL has a multi-layer structure, the respective layers may be formed of the same material or different materials. The buffer layer BFL may be omitted depending on the material of the substrate SUB or processing conditions.

The pixel circuit PXC may include a first transistor T1 (or a driving transistor) configured to control driving current of the light emitting elements LD, and a second transistor T2 (or a switching transistor) electrically connected to the first transistor T1. However, the present disclosure is not limited thereto. The pixel circuit PXC may further include circuit elements configured to perform other functions, as well as including the first transistor T1 and the second transistor T2. In the following embodiments, the first transistor T1 and the second transistor T2 may be embraced in the term "transistor T" or "transistors T".

The transistors T may include a semiconductor pattern and a gate electrode GE that overlaps at least a portion of the semiconductor pattern in the third direction DR3. The semiconductor pattern may include a channel area ACT, a first contact area SE, and a second contact area DE. The first contact area SE may be a source area, and the second contact area DE may be a drain area.

The gate electrode GE may be provided and/or formed on the gate insulating layer GI and correspond to the channel area ACT of the semiconductor pattern. The gate electrode GE may be disposed on the gate insulating layer GI and overlap the channel area ACT of the semiconductor pattern. The gate electrode GE may have a single-layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer or multilayer structure formed of molybdenum (Mo), titanium (Ti), copper (Cu), aluminum (Al), or silver (Ag) to reduce line resistance.

A gate insulating layer GI may be provided and/or formed on the overall surfaces of the semiconductor pattern and the buffer layer BFL. The gate insulating layer GI may be an inorganic layer (or an inorganic insulating layer) including inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to that of the foregoing embodiments. In one or more embodiments, the gate insulating layer GI may be formed of an organic layer (an organic insulating layer) including organic material. Although the gate insulating layer GI may be provided in a single-layer structure, the gate insulating layer GI may be provided in a multi-layer structure having at least two or more layers.

The semiconductor pattern may be provided and/or formed on the buffer layer BFL. The channel area ACT, the first contact area SE, and the second contact area DE each may be a semiconductor pattern formed of poly silicon, amorphous silicon, an oxide semiconductor, etc. The channel area ACT, the first contact area SE, and the second contact area DE each may be formed of an undoped semiconductor layer or a semiconductor layer doped with an impurity. For example, each of the first contact area SE and the second contact area DE may be formed of a semiconductor layer doped with an impurity. The channel area ACT may be formed of an undoped semiconductor layer. For example, an n-type impurity may be used as the impurity, but the present disclosure is not limited thereto.

The channel area ACT may overlap the gate electrode GE of the corresponding transistor T in the third direction DR3. For example, the channel area ACT of the first transistor T1 may overlap the gate electrode GE of the first transistor T1. The channel area ACT of the second transistor T2 may overlap the gate electrode GE of the second transistor T2.

The first contact area SE of the first transistor T1 may be electrically connected to (or brought into contact with) one end of the channel area ACT of the corresponding transistor T. Furthermore, the first contact area SE of the first transistor T1 may be electrically connected to the bridge pattern BRP through a first connector TE1.

The first connector TE1 may be provided and/or formed on the interlayer insulating layer ILD. One end of the first connector TE1 may be electrically and/or physically connected with the first contact area SE of the first transistor T1 through a contact hole successively passing through the interlayer insulating layer ILD and the gate insulating layer GI. Furthermore, a remaining end of the first connector TE1 may be electrically and/or physically connected to the bridge pattern BRP through a contact hole passing through the passivation layer PSV disposed on the interlayer insulating layer ILD. The first connector TE1 may include the same material as that of the gate electrode GE, or include one or more materials selected from among materials exemplified as the material for forming the gate electrode GE. The passivation layer PSV may be formed on the first connector TE1 and the second connector TE2.

The interlayer insulating layer ILD may be provided and/or formed on the overall surfaces of the gate electrode GE and the gate insulating layer GI. The interlayer insulating layer ILD may include the same material as that of the gate insulating layer GI, or may include one or more materials selected from among materials exemplified as the material for forming the gate insulating layer GI.

The bridge pattern BRP may be provided and/or formed on the passivation layer PSV. One end of the bridge pattern BRP may be electrically connected to the first contact area SE of the first transistor T1 by the first connector TE1. Furthermore, a remaining end of the bridge pattern BRP may be electrically and/or physically connected with a bottom metal layer BML through a contact hole that successively passes through the passivation layer PSV, the interlayer insulating layer ILD, the gate insulating layer GI, and the buffer layer BFL. The bottom metal layer BML and the first contact area SE of the first transistor T1 may be electrically connected to each other by the bridge pattern BRP and the first connector TE1.

The bottom metal layer BML may be a first conductive layer of the conductive layers disposed on the substrate SUB. For example, the bottom metal layer BML may be a first conductive layer disposed between the substrate SUB and the buffer layer BFL. The bottom metal layer BML may be electrically connected to the first transistor T1 and thus increase a driving range of a voltage (e.g., a set or predetermined voltage) to be supplied to the gate electrode GE of the first transistor T1. For example, the bottom metal layer BML may be electrically connected to the first contact area SE of the first transistor T1 and stabilize the channel area ACT of the first transistor T1. Furthermore, the bottom metal layer BML may be electrically connected to the first contact area SE of the first transistor T1, thus preventing the bottom metal layer BML from floating.

The second contact area DE of the first transistor T1 may be electrically connected to (or brought into contact with) a remaining end of the active pattern ACT of the corresponding transistor T. Furthermore, the second contact area DE of the first transistor T1 may be electrically connected to (or brought into contact with) a second connector TE2.

The second connector TE2 may be provided and/or formed on the interlayer insulating layer ILD. One end of the second connector TE2 may be electrically and/or physically connected to the second contact area DE of the first transistor T1 through a contact hole passing through the interlayer insulating layer ILD and the gate insulating layer GI. A remaining end of the second connector TE2 may be electrically and/or physically connected with the first alignment electrode ALE1 of the display element layer DPL through the first contact portion CNT1 that successively passes through the passivation layer PSV and the via layer VIA. In one or more embodiments, the second connector TE2 may be a medium for connecting the first transistor T1 of the pixel circuit layer PCL with the first alignment electrode ALE1 of the display element layer DPL.

The first contact area SE of the second transistor T2 may be electrically connected to (or brought into contact with) one end of the channel area ACT of the corresponding transistor T. Furthermore, although not directly illustrated in the drawings, the first contact area SE of the second transistor T2 may be electrically connected with the gate electrode GE of the first transistor T1. For example, the first contact area SE of the second transistor T2 may be electrically connected with the gate electrode GE of the first transistor T1 by an additional first connector TE1. The additional first connector TE1 may be provided and/or formed on the interlayer insulating layer ILD.

The second contact area DE of the second transistor T2 may be electrically connected to (or brought into contact with) a remaining end of the channel area ACT of the corresponding transistor T. Furthermore, although not directly illustrated in the drawings, the second contact area DE of the second transistor T2 may be electrically connected with the data line Dj. For example, the second contact area DE of the second transistor T2 may be electrically connected with the data line Dj through an additional second connector TE2. The additional second connector TE2 may be provided and/or formed on the interlayer insulating layer ILD.

The interlayer insulating layer ILD may be provided and/or formed on the first transistor T1 and the second transistor T2.

Although in the foregoing embodiment there has been illustrated the case where each of the transistors T is a thin-film transistor having a top gate structure, the present disclosure is not limited thereto. The structure of the transistors T may be changed in various ways.

The passivation layer PSV may be provided and/or formed on the transistors T and the first and second connectors TE1 and TE2.

The passivation layer (or referred to as "protective layer") PSV may be provided and/or formed on the overall surfaces of the first and second connectors TE1 and TE2 and the interlayer insulating layer ILD. The passivation layer PSV may be formed of an inorganic layer (or an inorganic insulating layer) including inorganic material, or an organic layer (or an organic insulating layer) including organic material. The inorganic layer may include, for example, at least one of silicon oxide ($SiO_x$), silicon nitride ($SiN_x$), silicon oxynitride ($SiO_xN_y$), and metal oxide such as aluminum oxide ($AlO_x$). The organic layer may include, for example, at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

In one or more embodiments, the passivation layer PSV may have material identical with that of the interlayer insulating layer ILD, but the present disclosure is not limited thereto. The passivation layer PSV may be provided in a single layer structure or a multilayer structure having at least two or more layers.

The pixel circuit layer PCL may include a power line (e.g., a set or predetermined power line) provided and/or formed on the passivation layer PSV. For example, the power line (e.g., a set or predetermined power line) may include the second power line PL2. The second power line PL2 may be provided on the same layer as that of the bridge pattern BRP. A voltage of the second driving power supply VSS may be applied to the second power line PL2. Although not directly illustrated in FIGS. 8 to 13, the pixel circuit layer PCL may further include the first power line PL1 described with reference to FIG. 5. The first power line PL1 may be provided on the same layer as that of the second power line PL2 or may be provided on a layer different from that of the second power line PL2. Although in the foregoing embodiment the second power line PL2 has been described as being provided and/or formed on the passivation layer PSV, the present disclosure is not limited thereto. In one or more embodiments, the second power line PL2 may be disposed on an insulating layer (e.g., a set or predetermined insulating layer) on which any one conductive layer of the conductive layers disposed on the pixel circuit layer PCL is disposed. In other words, the position of the second power line PL2 in the pixel circuit layer PCL may be changed in various ways.

Each of the first power line PL1 and the second power line PL2 may include conductive material (or substance). For example, each of the first power line PL1 and the second power line PL2 may have a single-layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer or multilayer structure formed of molybdenum (Mo), titanium (Ti), copper (Cu), aluminum (Al), or silver (Ag) to reduce line resistance.

The first power line PL1 may be electrically connected with some components of the display element layer DPL. The second power line PL2 may be electrically connected with other components of the display element layer DPL.

The via layer VIA may be provided and/or formed on the bridge pattern BRP and the second power line PL2.

The via layer VIA may be provided in the form of an organic insulating layer, an inorganic insulating layer, or a structure including an organic insulating layer disposed on an inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

The via layer VIA may include a first contact portion CNT1 that corresponds to the first contact portion CNT1 of the passivation layer PSV that exposes the second connector TE2 electrically connected with the first transistor T1, and a second contact portion CNT2 that exposes the second power line PL2.

The display element layer DPL may be provided and/or formed on the via layer VIA.

The display element layer DPL may include the bank patterns BNKP, the alignment electrodes ALE, the bank BNK, the light emitting elements LD, the pixel electrodes PE, a light conversion pattern LCP, first and second capping layers CPL1 and CPL2, a light block pattern LBP, and a base layer BSL. Furthermore, the display element layer DPL may include at least one or more insulating layers disposed between the foregoing components. For example, the display element layer DPL may include a first insulating layer INS1, a second insulating layer INS2, a third insulating layer INS3, and a fourth insulating layer INS4. In one or more embodiments, the third insulating layer INS3 may be selectively provided.

The bank patterns BNKP may be provided and/or formed on the via layer VIA.

The bank patterns BNKP may be disposed on one surface of the via layer VIA. For example, the bank patterns BNKP may protrude in the third direction DR3 on the one surface of the via layer VIA. Hence, one area of each of the alignment electrodes ALE disposed on the bank patterns BNKP may protrude in the third direction DR3 (or the thickness-wise direction of the substrate SUB).

The bank patterns BNKP each may be an inorganic insulating layer including inorganic material or an organic insulating layer including organic material. In one or more embodiments, the bank patterns BNKP may include an organic insulating layer having a single layer structure and/or an inorganic insulating layer having a single layer structure, but the present disclosure is not limited thereto. In one or more embodiments, the bank patterns BNKP may be provided in a multilayer structure formed by stacking at least one organic insulating layer and at least one inorganic insulating layer. However, the material of the bank patterns BNKP is not limited to the foregoing embodiment. In one or more embodiments, the bank patterns BNKP may include conductive material (or conductive substance).

The bank patterns BNKP may have a trapezoidal cross-section that is reduced in width from one surface (e.g., an upper surface) of the via layer VIA upward in the third direction DR3, but the present disclosure is not limited thereto. In one or more embodiments, as illustrated in FIG. 10, the bank patterns BNKP may include a curved surface having a cross-sectional shape such as a semi-elliptical shape or a semi-circular shape (or a hemispherical shape) that is reduced in width from one surface of the via layer VIA upward in the third direction DR3. In a sectional view, the shape of the bank patterns BNKP is not limited to the foregoing examples, and may be changed in various ways within a range in which the efficiency of light emitted from each of the light emitting elements LD can be enhanced. Furthermore, in one or more embodiments, at least one of the bank patterns BNKP may be omitted, or the position thereof may be changed.

In one or more embodiments, the bank patterns BNKP each may be used as a reflector. For example, the bank patterns BNKP, along with the alignment electrodes ALE disposed thereover, may be used as reflectors to guide light emitted from each light emitting element LD in a desired direction, so that the light output efficiency of the pixel PXL can be enhanced.

The alignment electrodes ALE may be provided and/or formed on the bank patterns BNKP.

The alignment electrodes ALE may be provided and/or formed on the via layer VIA and the bank patterns BNKP. The alignment electrodes ALE may be disposed on the same plane and have the same thickness with respect to the third direction DR3. For example, the first alignment electrode ALE1 and the second alignment electrode ALE2 may be disposed on the via layer VIA and the corresponding bank patterns BNKP and have the same thickness with respect to the third direction DR3. The first alignment electrode ALE1 and the second alignment electrode ALE2 may be concurrently (or simultaneously) formed through the same process.

The first alignment electrode ALE1 may have a shape corresponding to an inclination of the first bank pattern BNKP1 disposed thereunder. The second alignment electrode ALE2 may have a shape corresponding to an inclination of the second bank pattern BNKP2 disposed thereunder.

The alignment electrodes ALE may be formed of material having a constant (or uniform) reflectivity to allow light emitted from the light emitting elements LD to travel in an image display direction of the display device DD. For example, the alignment electrodes ALE may be formed of conductive material (or substance). The conductive material may include opaque metal that is suitable for reflecting, in the image display direction of the display device DD, light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. However, the material of the alignment electrodes ALE is not limited to the foregoing embodiment. In one or more embodiments, the alignment electrodes ALE may include transparent conductive material (or substance). The transparent conductive material (or substance) may include transparent conductive oxides such as indium tin oxide (ITO), indium zinc oxide (IZO), zinc oxide ($ZnO_x$), indium gallium zinc oxide (IGZO), and indium tin zinc oxide (ITZO), and a conductive polymer such as PEDOT (poly(3,4-ethylenedioxythiophene)). In case that the alignment electrodes ALE include transparent conductive material (or substance), a separate conductive layer formed of opaque metal for reflecting light emitted from the light emitting elements LD in the image display direction of the display device DD may be added. However, the material of the alignment electrodes ALE is not limited to the foregoing materials.

Each of the alignment electrodes ALE may be provided and/or formed to have a single-layer structure, but the present disclosure is not limited thereto. In one or more embodiments, each of the alignment electrodes ALE may be provided and/or formed in a multilayer structure formed by stacking at least two materials among metals, alloys, conductive oxides, and conductive polymers. Each of the alignment electrodes ALE may be formed of a multi-layer structure including at least two layers to reduce or minimize distortion resulting from a signal delay when signals (or voltages) are transmitted to the opposite ends EP1 and EP2 of the respective light emitting elements LD. For example, each of the alignment electrodes ALE may have a multi-layer structure that selectively further includes at least one among at least one reflective electrode layer, at least one transparent electrode layer disposed over and/or under the reflective electrode layer, and/or at least one conductive capping layer configured to cover an upper portion of the transparent electrode layer.

As described above, in case that the alignment electrodes ALE are formed of conductive material having a constant reflectivity, light emitted from the opposite ends, i.e., the first and second ends EP1 and EP2, of each of the light emitting elements LD may more effectively travel in the image display direction (or the third direction DR3) of the display device DD. For example, if the alignment electrodes ALE have inclined or curved surfaces corresponding to the shape of the bank pattern BNKP and are disposed to face the first and second ends EP1 and EP2 of the light emitting elements LD, light emitted from the first and second ends EP1 and EP2 of each of the light emitting elements LD may be reflected by the alignment electrodes ALE and thus more reliably travel in the image display direction of the display device DD. Consequently, the efficiency of light emitted from the light emitting elements LD may be enhanced.

The first alignment electrode ALE1 may be electrically connected with the first transistor T1 of the pixel circuit layer PCL through the first contact portion CNT1. The second alignment electrode ALE2 may be electrically connected with the second power line PL2 of the pixel circuit layer PCL through the second contact portion CNT2.

The first insulating layer INS1 may be provided and/or formed on the alignment electrodes ALE.

The first insulating layer INS1 may be partially open in at least the emission area EMA so that components disposed thereunder can be exposed. For example, the first insulating layer INS1 may be partially open so that one area thereof in the emission area EMA may be removed to allow a portion of the first alignment electrode ALE1 to be exposed, and another area thereof in the emission area EMA may be removed to allow a portion of the second alignment electrode ALE2 to be exposed.

The first insulating layer INS1 may be formed of an inorganic insulating layer including inorganic material, or an organic insulating layer including organic material. The first insulating layer INS1 may be formed of an inorganic insulating layer that is adapted for protecting the light emitting elements LD from the pixel circuit layer PCL. For example, the first insulating layer INS1 may include at least one of silicon nitride ($SiN_x$), silicon oxide ($SiO_x$), silicon oxynitride ($SiO_xN_y$), and metal oxide such as aluminum oxide ($AlO_x$), but the present disclosure is not limited thereto.

The first insulating layer INS1 may be provided to have a single-layer or multilayer structure. In case that the first insulating layer INS1 is formed of multiple layers, the first insulating layer INS1 may have a distributed bragg reflector (DBR) structure formed by alternately stacking first layers and second layers that are formed of inorganic insulating layers and have different refractive indexes. For example, the first insulating layer INS1 may have a stacked structure by alternating the first layers having a low refractive index and the second layers having a refractive index greater than that of the first layers. As described above, in case that the first insulating layer INS1 is formed of multiple layers, the first insulating layer INS1 may be used as a reflector configured to reflect light emitted from the light emitting elements LD in a target direction using constructive interference due to a difference in refractive index between the first layers and the second layers. Here, each of the first and second layers may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), silicon oxycarbide ($SiO_xC_y$), aluminum oxide ($AlO_x$), aluminum nitride ($AlN_x$), hafnium oxide ($HfO_x$), zirconium oxide ($ZrO_x$), titanium oxide ($TiO_x$), and tantalum oxide ($TaO_x$).

The bank BNK may be provided and/or formed on the first insulating layer INS1.

The bank BNK may be formed, to enclose the emission area EMA of the pixel SPX, between adjacent pixels PXL so that a pixel defining layer for defining the emission area EMA of the corresponding pixel SPX may be formed. At the step of supplying the light emitting elements LD to the emission area EMA, the bank BNK may be a dam structure configured to prevent a solution mixed with the light emitting elements LD from being drawn into the emission area EMA of an adjacent pixel PXL or control the amount of solution such that a constant amount of solution is supplied to each emission area EMA.

The light emitting elements LD may be supplied onto and aligned in the emission area EMA on which the first insulating layer INS1 is formed. For example, the light emitting elements LD may be supplied (or input) to the emission area EMA through an inkjet printing scheme or the like. The light emitting elements LD may be aligned between the alignment electrodes ALE by a suitable signal (e.g., a set or predetermined signal or an alignment signal) applied to each of the alignment electrodes ALE.

In the emission area EMA, the second insulating layer INS2 may be provided and/or formed on the light emitting elements LD. The second insulating layer INS2 may be provided and/or formed on the light emitting elements LD to partially cover the outer surface (e.g., the outer peripheral or circumferential surface or the surface) of each of the light emitting elements LD such that the first end EP1 and the second end EP2 of each of the light emitting element LD are exposed to the outside.

The second insulating layer INS2 may be formed of a single layer or multiple layers, and include an inorganic insulating layer including at least one inorganic material or an organic insulating layer including at least one organic material. The second insulating layer INS2 may include an inorganic insulating layer that is adapted for protecting the active layer (refer to "12" of FIG. 1) of each of the light emitting elements LD from external oxygen, water, etc. However, the present disclosure is not limited thereto. The second insulating layer INS2 may be formed of an organic insulating layer including organic material, depending on design conditions, etc. of the display device DD to which the light emitting elements LD are applied. Because the second insulating layer INS2 is formed on the light emitting elements LD after the alignment of the light emitting elements LD in the pixel area PXA (or the emission area EMA) of the pixel PXL has been completed, the light emitting elements LD may be prevented from being removed from the aligned positions.

At least one of the pixel electrodes PE may be disposed, in at least the emission area EMA, on the light emitting elements LD, the second insulating layer INS2 disposed on the light emitting elements LD, and the first insulating layer INS1 disposed on the alignment electrodes ALE. For example, in at least the emission area EMA, the first pixel electrode PE1 may be disposed on the first ends EP1 of the light emitting elements LD, the second insulating layer INS2 disposed on the light emitting elements LD, and the first insulating layer INS1 disposed on the first alignment electrode ALE1. In at least the emission area EMA, the first pixel electrode PE1 may be brought into direct contact with and connected to the first alignment electrode ALE1 exposed from the first insulating layer INS1 that is partially open.

As illustrated in FIGS. 8 to 10, 12, and 13, the third insulating layer INS3 may be disposed on the first pixel electrode PE1 and cover the first pixel electrode PE1. The third insulating layer INS3 may be formed of an inorganic insulating layer including inorganic material, or an organic insulating layer including organic material. For example, the third insulating layer INS3 may include at least one of silicon nitride ($SiN_x$), silicon oxide ($SiO_x$), silicon oxynitride ($SiO_xN_y$), and metal oxide such as aluminum oxide ($AlO_x$), but the present disclosure is not limited thereto. The third insulating layer INS3 may have a single-layer structure or a multi-layer structure.

If the second and/or third insulating layers INS2 and/or INS3 are formed over the light emitting elements LD, electrical stability between the first and second ends EP1 and EP2 of the light emitting elements LD may be secured. In this case, a short-circuit defect between the first and second ends EP1 and EP2 of the light emitting elements LD may be prevented from occurring.

As illustrated in FIG. 11, in one or more embodiments where the first pixel electrode PE1 and the second pixel electrode PE2 are disposed on the same layer, the third insulating layer INS3 may not be provided.

The rest of the pixel electrodes PE may be disposed, at least in the emission area EMA, on the light emitting elements LD, the second insulating layer INS2 disposed on the light emitting elements LD, the first insulating layer INS1 disposed on the alignment electrode ALE, and the third insulating layer INS3 disposed on the second insulating layer INS2. For example, in at least the emission area EMA, the second pixel electrode PE2 may be disposed on the second ends EP2 of the light emitting elements LD, the second insulating layer INS2 disposed on the light emitting elements LD, the first insulating layer INS1 disposed on the second alignment electrode ALE2, and the third insulating layer INS3 disposed on the second insulating layer INS2. In at least the emission area EMA, the second pixel electrode PE2 may be brought into direct contact with and connected to the second alignment electrode ALE2 exposed from the first insulating layer INS1 that is partially open.

The first pixel electrode PE1 and the second pixel electrode PE2 may be formed through different processes and may be provided on different layers. However, the present disclosure is not limited thereto. In one or more embodiments, the first pixel electrode PE1 and the second pixel electrode PE2 may be formed through the same process and may be provided on the same layer, as illustrated in FIG. 11.

The pixel electrodes PE may be formed of various transparent conductive materials. For example, the pixel electrodes PE may include at least one of various transparent conductive materials (or substances) including indium tin oxide (ITO), indium zinc oxide (IZO), zinc oxide ($ZnO_x$), indium gallium zinc oxide (IGZO), and indium tin zinc oxide (ITZO), and be substantially transparent or translucent to satisfy a predetermined transmittancy (or transmittance). However, the material of the pixel electrodes PE is not limited to the foregoing embodiment. In one or more embodiments, the pixel electrodes PE may be formed of various opaque conductive materials (or substances). The pixel electrodes PE each may have a single-layer structure or a multi-layer structure.

The fourth insulating layer INS4 may be provided and/or formed on the pixel electrodes PE and the bank BNK. The fourth insulating layer INS4 may be an inorganic insulating layer including inorganic material or an organic insulating layer including organic material. For example, the fourth insulating layer INS4 may have a structure formed by alternately stacking at least one inorganic insulating layer and at least one organic insulating layer. The fourth insulating layer INS4 may cover the entirety of the display element layer DPL and prevent water or moisture from being drawn into the display element layer DPL including the light emitting elements LD from the outside.

In at least the emission area EMA, a color conversion layer CCL may be provided and/or formed on the fourth insulating layer INS4.

The color conversion layer CCL may be disposed over the light emitting elements LD and the pixel electrodes PE in the emission area EMA of the pixel PXL (or the first opening OP1 of the bank BNK) enclosed by the bank BNK. The color conversion layer CCL may include color conversion particles QD corresponding to a specific color. For example, the color conversion layer CCL may include color conversion particles QD that convert a first color of light emitted from the light emitting elements LD to a second color (or a specific color) of light.

In case that the pixel PXL is a red pixel (or a red sub-pixel), the color conversion layer CCL of the corresponding pixel PXL may include color conversion particles QD formed of red quantum dots that convert a first color of light emitted from the light emitting elements LD to a second color of light, e.g., red light. In case that the pixel PXL is a green pixel (or a green sub-pixel), the color conversion layer CCL of the corresponding pixel PXL may include color conversion particles QD formed of green quantum dots that convert a first color of light emitted from the light emitting elements LD to a second color of light, e.g., green light. In case that the pixel PXL is a blue pixel (or a blue sub-pixel), the color conversion layer CCL of the corresponding pixel PXL may include color conversion particles QD formed of blue quantum dots that convert a first color of light emitted from the light emitting elements LD to a second color of light, e.g., blue light. In one or more embodiments, in case that the pixel PXL is a blue pixel (or a blue sub-pixel), there may be provided a light scattering layer having light scattering particles, in place of the color conversion layer CCL having the color conversion particles QD. For example, in case that the light emitting elements LD emit blue-based light, the pixel PXL may include a light scattering layer including light scattering particles. The light scattering layer may be omitted depending on embodiments. In one or more embodiments, in case that the pixel PXL is a blue pixel (or a blue sub-pixel), there may be provided a transparent polymer, in place of the color conversion layer CCL.

The first capping layer CPL1 may be provided and/or formed on the color conversion layer CCL and the fourth insulating layer INS4.

The first capping layer CPL1 may be provided in the entirety (or the overall surface) of the pixel area PXA of the pixel PXL and disposed directly on the color conversion layer CCL and the fourth insulating layer INS4 on the bank BNK. In one or more embodiments, the first capping layer CPL1 may also be provided in the dummy pixel area DPXA and one area of the pad area PDA. The first capping layer CPL1 may be an inorganic layer (or an inorganic insulating layer) including inorganic material. The first capping layer CPL1 may include at least one of silicon nitride ($SiN_x$), silicon oxide ($SiO_x$), silicon oxynitride ($SiO_xN_y$), and metal oxide such as aluminum oxide ($AlO_x$). The first capping layer CPL1 may be disposed on the color conversion layer CCL and cover the color conversion layer CCL, thus protecting the color conversion layer CCL.

A first layer FL may be disposed on the first capping layer CPL1.

The first layer (or a low refraction layer) FL may change, using a difference in refractive index, the direction of a path of a lost part of light (or rays) emitted from the color conversion layer CCL to the frontal direction (or the image display direction of the display device DD), thus enhancing frontal light output luminance. Furthermore, the first layer FL may recycle blue-based light that does not react to the color conversion layer CCL to enable the blue-based light to react to the color conversion layer CCL, thus increasing the light output luminance of the color conversion layer CCL.

The first layer FL may be a porous organic layer including resin and hollow particles (or particles including hollow holes) dispersed in the resin. The first layer FL may have a refractive index ranging from 1.1 to 1.3. Here, the hollow particles may refer to particles each having a form in which space is present in a surface and/or interior of an organic or inorganic particle. The hollow particles may be hollow silica particles. "hollow silica particles" may be silica particles extracted from a silicide or an organic silicide, and refer to particles each having a form in which space is present in a surface and/or interior of a silica particle.

The second capping layer CPL2 may be provided and/or formed on the first layer FL.

The second capping layer CPL2 may be provided in the overall surface (or the entirety) of the pixel area PXA of the pixel PXL and disposed directly on the first layer FL. In one or more embodiments, the second capping layer CPL2 may also be provided in the dummy pixel area DPXA and one area of the pad area PDA. The second capping layer CPL2 may be an inorganic layer (or an inorganic insulating layer)

including inorganic material. The second capping layer CPL2 may include the same material as that of the first insulating layer INS1, or may include one or more materials selected from among materials exemplified as the constituent material of the first capping layer CPL1.

The second layer SL may be provided and/or formed on the second capping layer CPL2.

The second layer (or a planarization layer) SL may mitigate a step difference formed by components disposed thereunder and have a planar surface. In an embodiment, the second layer SL may include an organic layer (or an organic insulating layer) including organic material. The second layer SL may be provided in the entirety of the pixel area PXA of the pixel PXL and disposed directly on the second capping layer CPL2. The second layer SL may also be provided in the dummy pixel area DPXA and the pad area PDA.

The first capping layer CPL1, the second capping layer CPL2, and the second layer SL may be common layers that are provided in common to the pad area PDA, the dummy pixel are DPXA, and the display area DA including the pixel area PXA, but the present disclosure is not limited thereto.

The color filter CF and the light block pattern LBP may be provided and/or formed on the second layer SL.

The color filter CF may allow a specific color of light to selectively pass therethrough. The color filter CF along with the color conversion layer CCL may form the light conversion pattern LCP, and include color filter material that allows a specific color of light converted by the color conversion layer CCL to selectively pass therethrough. The color filter CF may include a red color filter, a green color filter, and a blue color filter. The color filter CF may be disposed on one surface of the second layer SL and correspond to the color conversion layer CCL.

The light conversion pattern LCP including the color conversion layer CCL and the color filter CF may correspond to the emission area EMA of the pixel PXL.

The light block pattern LBP may be disposed on one surface of the second layer SL at a position adjacent to the color filter CF. For example, the light block pattern LBP may be disposed on one surface of the second layer SL and correspond to the non-emission area NEMA. The light block pattern LBP may correspond to the bank BNK. The light block pattern LBP may include light block material for preventing light leakage failure in which light (or rays) leaks between the pixel PXL and pixels PXL adjacent thereto. For example, the light block pattern LBP may include a black matrix. The light block pattern LBP may prevent different colors of light emitted from respective adjacent pixels PXL from being mixed.

The light block pattern LBP may have a multi-layer structure in which two or more color filters allowing different colors of light to selectively pass therethrough overlap each other. For example, as illustrated in FIG. 12, the light block pattern LBP may include a first color filter CF1 disposed on the second layer SL of the non-emission area NEMA, a second color filter CF2 disposed on the first color filter CF1 and overlapping the first color filter CF1, and a third color filter CF3 disposed on the second color filter CF2 and overlapping the second color filter CF2 in the third direction DR3. In this case, the first color filter CF1 may be provided and/or formed on the second layer SL of the emission area EMA. The first color filter CF1 may have the same configuration as that of the color filter CF of FIGS. 8 to 11.

The first, second, and third color filters CF1, CF2, and CF3 that overlap each other on the second layer SL of the non-emission area NEMA allow different colors of light to selectively pass therethrough. For example, the first color filter CF1 may be a red color filter configured to allow red light to selectively pass therethrough. The second color filter CF2 may be a green color filter configured to allow green light to selectively pass therethrough. The third color filter CF3 may be a blue color filter configured to allow blue light to selectively pass therethrough. In other words, in one or more embodiments, the light block pattern LBP may be provided in the form of a structure formed by successively stacking the red color filter, the green color filter, and the blue color filter. In this case, in the non-emission area NEMA of the pixel area PXA, the first color filter CF1, the second color filter CF2, and the third color filter CF3 may be used as the light block pattern LBP for blocking transmission of light.

The base layer BSL may be provided and/or formed on the light block pattern LBP and the color filter CF.

The base layer BSL may be formed of an inorganic layer (or an inorganic insulating layer) including inorganic material, or an organic layer (or an organic insulating layer) including organic material. The base layer BSL may cover the entirety of the display element layer DPL and prevent water or moisture from being drawn into the display element layer DPL including the light emitting elements LD and the light conversion pattern LCP from the outside. In one or more embodiments, the base layer BSL may be an organic layer provided in the entirety of the display area DA including the pixel area PXA by an inkjet printing method, and may be cured through a curing process and thus used as an encapsulation substrate (or a thin-film encapsulation layer) and/or a window component of the display device DD.

In one or more embodiment, as illustrated in FIG. 13, the third layer TL may be provided and/or formed on the base layer BSL.

The third layer TL may be a reflective prevention film (or a low reflection film) for reducing or minimizing reflection of external light that is incident on a display surface of the display device DD. For example, the third layer TL may include a reflective prevention film formed by alternately stacking layers made of respective materials having different refractive indexes. In this case, each layer may be formed of an organic insulating layer including organic material, but the present disclosure is not limited thereto. In one or more embodiments, each layer may be formed of an inorganic insulating layer including inorganic material.

In the foregoing embodiment, the second layer SL may form a planarization layer having a planar surface for mitigating a step difference formed by components disposed thereunder, and may be disposed on the overall surfaces of the pad area PDA, the dummy pixel area DPXA, and the display area DA including the pixel area PXA. The second layer SL may be partially open so that each of the pads PD disposed in the pad area PDA can be exposed to the outside. For example, the second layer SL may include, in the pad area PDA, a pad opening through which each of the pads PD is exposed to the outside.

In one or more embodiments, the first layer FL may be selectively changed in position using an inkjet printing method so that the first layer FL can be spaced from the pad opening of the second layer SL and completely covered with the second layer SL. Detailed descriptions pertaining thereto will be made below with reference to FIGS. 14A to 18.

Figure 14A:
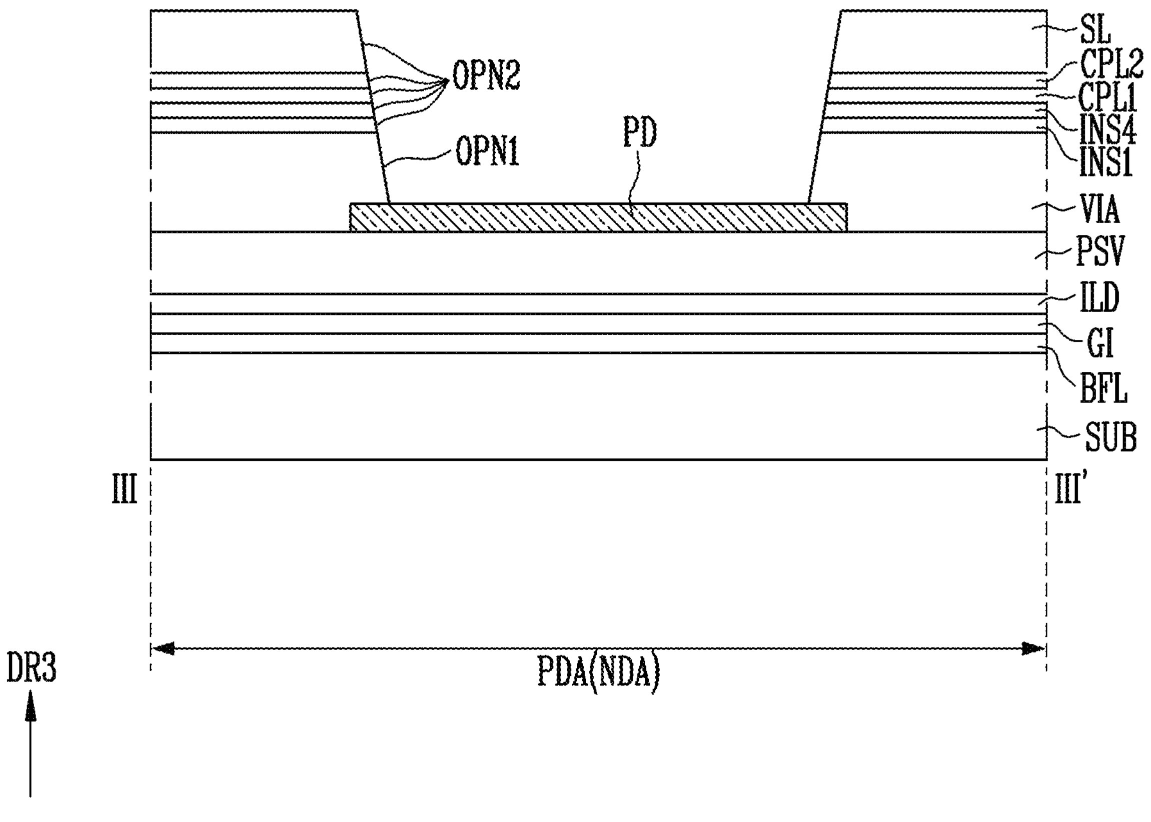
FIGS. 14A and 14B are schematically cross-sectional views taken along the line III-III' of FIG. 4A.
Figure 14B:
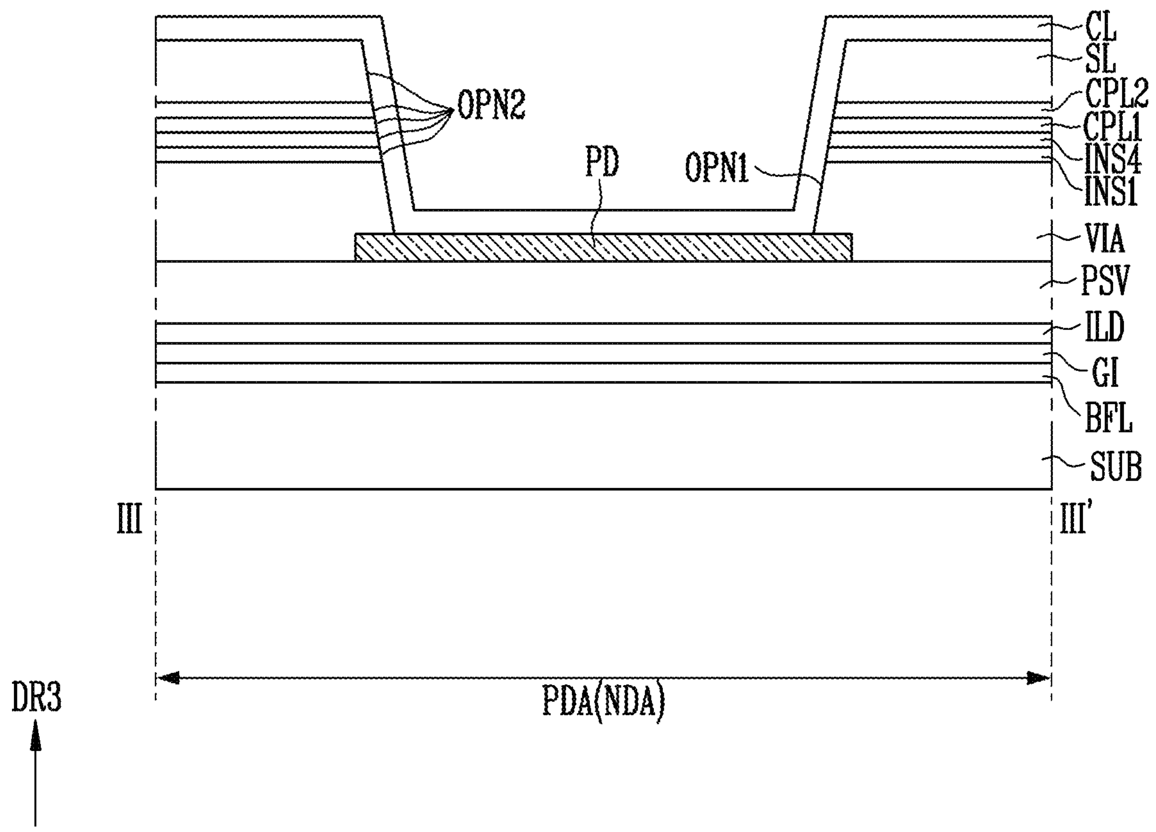

FIGS. 14A and 14B are schematically cross-sectional views taken along the line III-III' of FIG. 4A.

FIG. 14B illustrates a modification of the embodiment of FIG. 14A with regard to a connector CL electrically connected with the pad PD.

The description with reference to FIGS. 14A and 14B will be focused on differences from the above-mentioned embodiments so as to avoid redundant description. Components that are not separately explained in the following description of the embodiment of FIGS. 14A and 14B comply with that of the foregoing embodiments. The same reference numeral will be used to designate the same component, and a similar reference numeral will be used to designate a similar component.

Referring to FIGS. 4A, 14A, and 14B, a plurality of pads (or pad electrodes) PD may be disposed in the pad area PDA of the non-display area NDA. Each of the pads PD may be provided and/or formed on at least one insulating layer among insulating layers disposed on the substrate SUB. For example, each pad PD may be provided and/or formed on the passivation layer PSV included in the pixel circuit layer PCL described with reference to FIGS. 8 to 13. In this case, each pad PD may be provided on the same layer as that of the bridge pattern BRP and the second power line PL2 that are described with reference to FIGS. 8 to 13, and may have the same material as that of the bridge pattern BRP and the second power line PL2. For example, each pad PD may be formed through the same process as that of the bridge pattern BRP and the second power line PL2.

The via layer VIA may be provided and/or formed on each pad PD.

The via layer VIA may be partially open so that a portion of each pad PD may be exposed in one area of at least the non-display area NDA, e.g., in the pad area PDA. For example, the via layer VIA may be partially open to include, in the pad area PDA, a first pad opening OPN1 that exposes a portion of each pad PD.

In the pad area PDA, a first insulating layer INS1 may be provided and/or formed on the via layer VIA including the first pad opening OPN1. The first insulating layer INS1 may be the first insulating layer INS1 described with reference to FIGS. 8 to 13. The first insulating layer INS1 may be partially open to expose each pad PD in the pad area PDA. For example, the first insulating layer INS1 may be partially open to include, in the pad area PDA, a second pad opening OPN2 corresponding to the first pad opening OPN1 of the via layer VIA so that a portion of each pad PD may be exposed.

A fourth insulating layer INS4 may be provided and/or formed on the first insulating layer INS1 including the second pad opening OPN2. The fourth insulating layer INS4 may be the fourth insulating layer INS4 described with reference to FIGS. 8 to 13. The fourth insulating layer INS4 may be partially open to expose each pad PD in the pad area PDA. For example, the fourth insulating layer INS4 may be partially open to include, in the pad area PDA, a second pad opening OPN2 corresponding to the second pad opening OPN2 of the first insulating layer INS1 so that a portion of each pad PD may be exposed.

A first capping layer CPL1 may be provided and/or formed on the fourth insulating layer INS4 including the second pad opening OPN2. The first capping layer CPL1 may be the first capping layer CPL1 described with reference to FIGS. 8 to 13. The first capping layer CPL1 may be partially open to expose each pad PD in the pad area PDA. For example, the first capping layer CPL1 may be partially open to include, in the pad area PDA, a second pad opening OPN2 corresponding to the second pad opening OPN2 of the fourth insulating layer INS4 so that a portion of each pad PD may be exposed.

A second capping layer CPL2 may be provided and/or formed on the first capping layer CPL1 including the second pad opening OPN2. The second capping layer CPL2 may be the second capping layer CPL2 described with reference to FIGS. 8 to 13. The second capping layer CPL2 may be partially open to expose each pad PD in the pad area PDA. For example, the second capping layer CPL2 may be partially open to include, in the pad area PDA, a second pad opening OPN2 corresponding to the second pad opening OPN2 of the first capping layer CPL1 so that a portion of each pad PD may be exposed.

A second layer SL may be provided and/or formed on the second capping layer CPL2 including the second pad opening OPN2. The second layer SL may be the second layer SL described with reference to FIGS. 8 to 13. The second layer SL may be partially open to expose each pad PD in the pad area PDA. For example, the second layer SL may be partially open to include, in the pad area PDA, a second pad opening OPN2 corresponding to the second pad opening OPN2 of the second capping layer CPL2 so that a portion of each pad PD may be exposed.

In the pad area PDA, the first insulating layer INS1, the fourth insulating layer INS4, the first capping layer CPL1, the second capping layer CPL2, and the second layer SL of the components disposed on each pad PD may be collectively etched by performing an etching process after the second layer SL is formed. Consequently, the first insulating layer INS1, the fourth insulating layer INS4, the first capping layer CPL1, the second capping layer CPL2, and the second layer SL each may include the second pad opening OPN2 corresponding to the first pad opening OPN1 of the via layer VIA.

As illustrated in FIG. 14B, each pad PD exposed through the first and second pad openings OPN1 and OPN2 may be electively connected with the driver (refer to "DIC" of FIG. 4B) by the connector CL and supply suitable signals (e.g., set or predetermined signals) and suitable voltages (e.g., set or predetermined voltages) from the driver DIC to the pixel PXL. In one or more embodiments, the connector CL may be formed of a conductive adhesive component including an anisotropic conductive film, but the present disclosure is not limited thereto.

In one or more embodiments, the first layer FL described with reference to FIGS. 8 to 13 may not be disposed in the pad area PDA. Because the first layer FL is not disposed in the pad area PDA, the first layer FL may be fundamentally prevented from being exposed through the etching process of forming the second pad opening OPN2. Therefore, a separation defect (e.g., delamination of the first layer FL) that may occur due to damage to the first layer FL by plasma used during the etching process may be prevented from being caused. Hence, the reliability of the display device DD may be enhanced.

Although in the foregoing embodiment the first layer FL has been described as being not disposed in the pad area PDA, the present disclosure is not limited thereto. In one or more embodiments, the first layer FL may be disposed at a position spaced from the second pad opening OPN2 that exposes each pad PD in one area of the pad area PDA, and may be completely covered with the second layer SL so that the first layer FL may be prevented from being exposed to the outside during the etching process. Detailed descriptions pertaining thereto will be made below with reference to FIG. 15.

Figure 15:
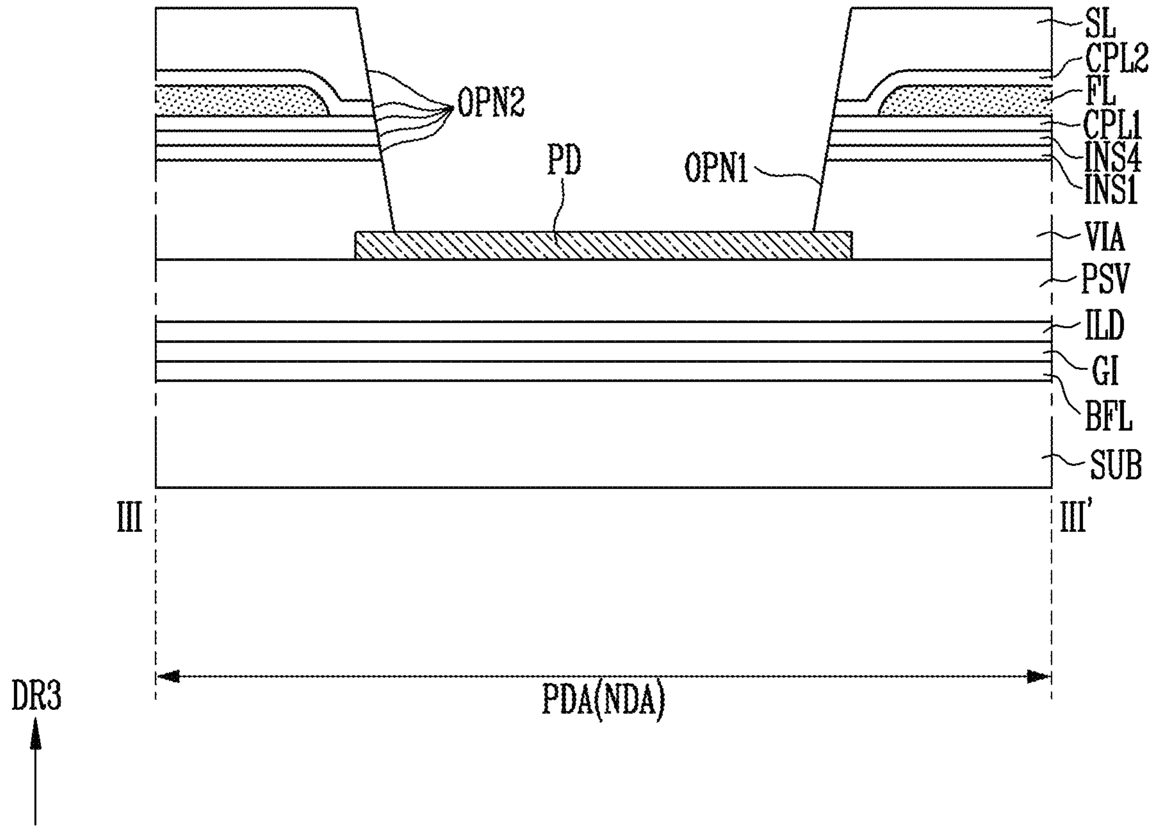
FIG. 15 schematically illustrates a pad area of FIG. 4A, and is a sectional view corresponding to the line III-III' of FIG. 4A.

FIG. 15 schematically illustrates the pad area PDA of FIG. 4A, and is a sectional view corresponding to the line III-III' of FIG. 4A.

The pad area PDA illustrated in FIG. 15, other than the fact that a first layer FL is provided, may have a structure (or configuration) substantially equal or similar to that of the pad area PDA of FIG. 14A.

Therefore, with regard to the pad area PDA of FIG. 15, the following description will be focused on differences from that of the foregoing embodiments, to avoid redundant explanation.

Referring to FIGS. 4A and 15, the first layer FL may be provided and/or formed on the first capping layer CPL1. The first layer FL may be the first layer FL described with reference to FIGS. 8 to 13. The first layer FL may be partially disposed on the first capping layer CPL1 in the pad area PDA. For example, the first layer FL may be provided and/or formed on the first capping layer CPL1 of the pad area PDA and spaced from the second pad opening OPN2 that exposes each pad PD. In one or more embodiments, the first layer FL may be made of inkjet type material that may be applied (in a coating manner) to a target portion by an inkjet printing method. Therefore, the first layer FL may be selectively disposed on only at least one area of the pad PDA so that the first layer FL may be spaced from the second pad opening OPN2 that exposes each pad PD.

The second capping layer CPL2 may be provided and/or formed on the first layer FL and the first capping layer CPL1. The second capping layer CPL2 may be disposed on the first layer FL and cover the first layer FL. For example, the second capping layer CPL2 may cover the entirety of the first layer FL.

The second layer SL may be provided and/or formed on the second capping layer CPL2. The second layer SL may be disposed on the second capping layer CPL2 and more reliably cover the entirety of the first layer FL disposed thereunder.

After the second layer SL is formed, the first insulating layer INS1, the fourth insulating layer INS4, the first capping layer CPL1, the second capping layer CPL2, and the second layer SL that are disposed on each pad PD may be collectively etched through an etching process, so that the second pad opening OPN2 corresponding to the first pad opening OPN1 of the via layer VIA may be formed. For example, the etching process may be a dry etching process.

The first layer FL may be partially applied (e.g., in a coating manner) to the first capping layer CPL1 of the pad area PDA by an inkjet printing method through a previous process under preset conditions (in which the first layer FL is spaced from the second pad opening OPN2 to be formed through a subsequent process). Hence, some of the components (e.g., the second capping layer CPL2 and the second layer SL) disposed on the first layer FL may be removed through the foregoing dry etching process so that, when the second pad opening OPN2 is formed, the first layer FL may be completely covered with the second capping layer CPL2 and the second layer SL rather than being exposed to the outside. In this case, the first layer FL may not be affected by (or not exposed to) plasma used during the dry etching process, so that a separation defect (e.g., a delamination phenomenon) of the first layer FL may be reduced or minimized and/or prevented from occurring, whereby the display device DD having improved reliability may be implemented.

Figure 16:
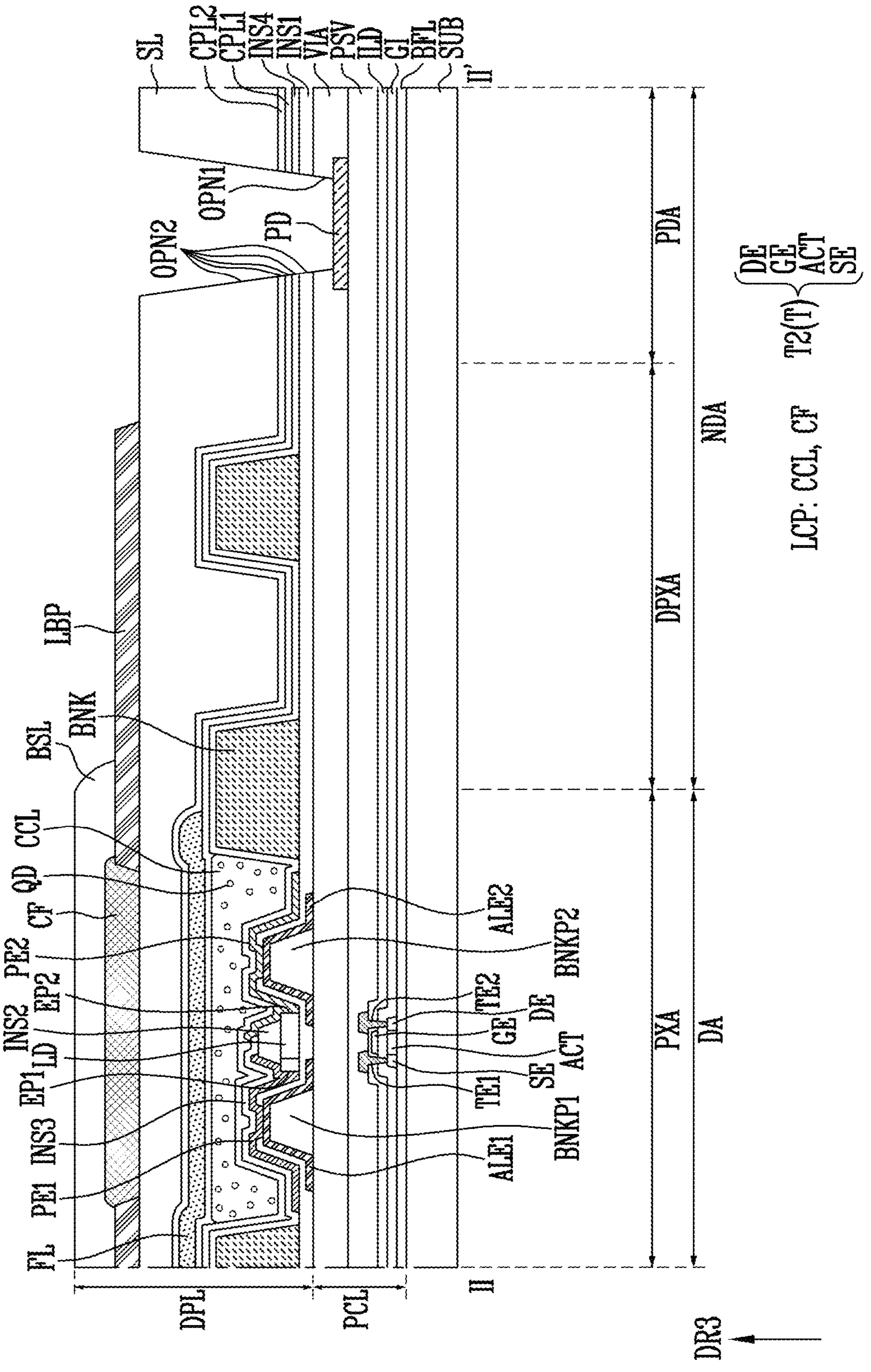
FIGS. 16 to 18 are schematically cross-sectional views taken along the line II-II' of FIG. 4A.
Figure 17:
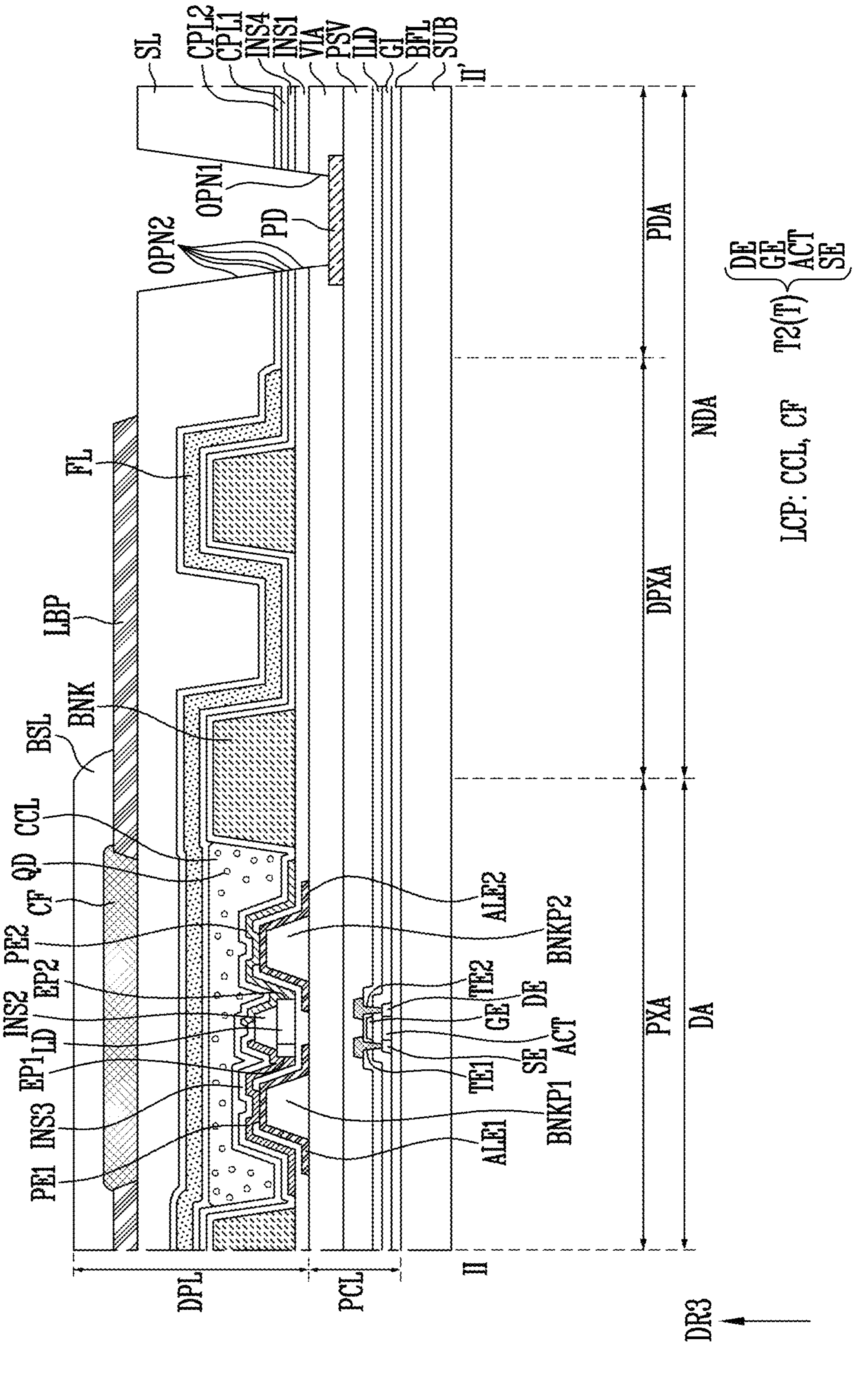
Figure 18:
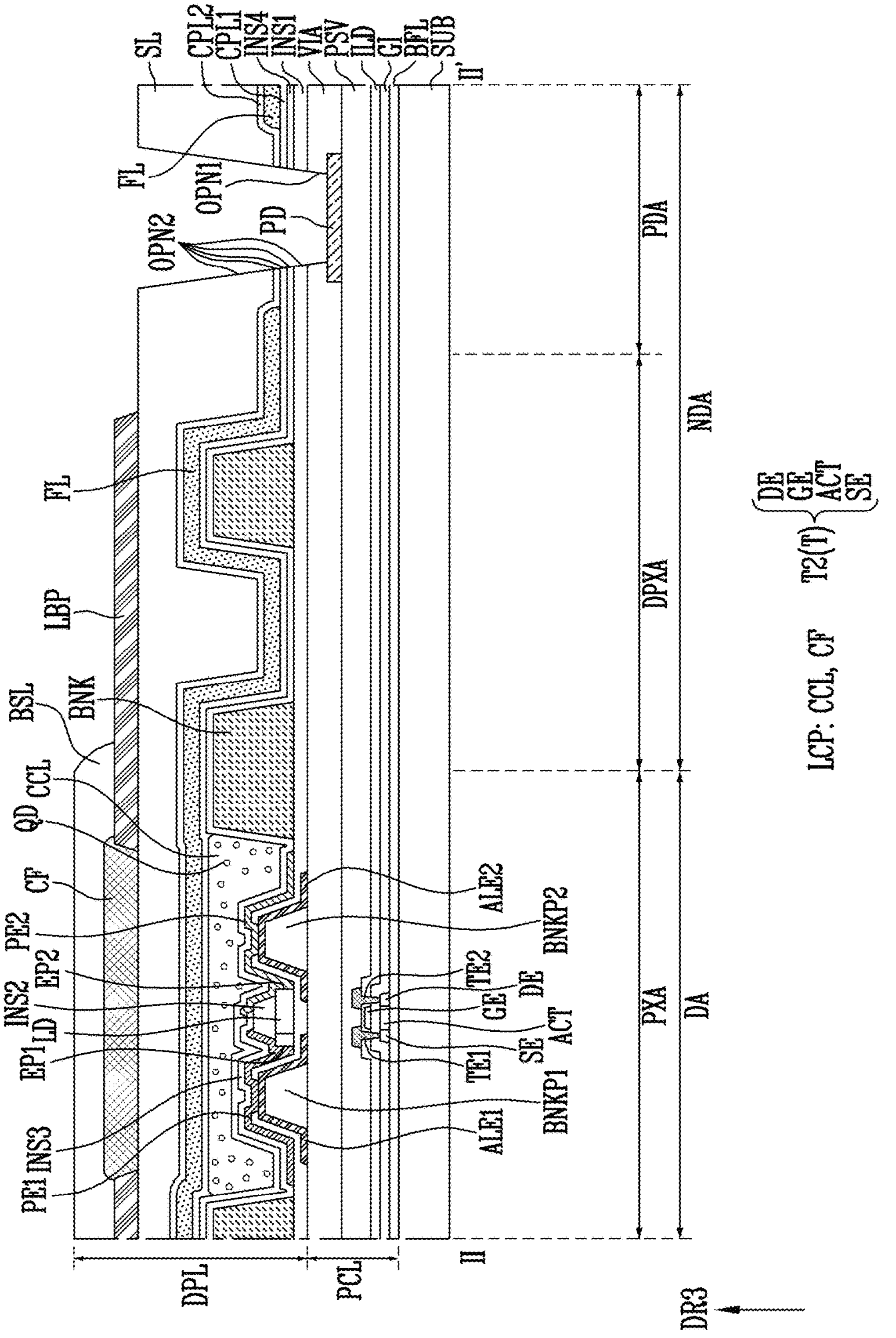

FIGS. 16 to 18 are schematically cross-sectional views taken along the line II-II' of FIG. 4A.

FIGS. 16 to 18 illustrate different embodiments pertaining to the position of the first layer FL. For example, FIG. 16 illustrates an embodiment in which the first layer FL is disposed in only the display area DA including the pixel area PXA and does not overlap a portion of an outermost bank BNK disposed in the dummy pixel area DPXA (or the bank disposed adjacent to the display area DA in the dummy pixel area DPXA). FIG. 17 illustrates an embodiment in which the first layer FL is disposed on the entirety of both the display area DA and the dummy pixel area DPXA in which the bank BNK is disposed. FIG. 18 illustrates an embodiment in which the first layer FL is disposed on the entirety of all of the display area DA, the dummy pixel area DPXA, and at least one area of the pad area PDA where the pad PD is disposed and the bank BNK is not disposed. For example, in the embodiment of FIG. 18 there is illustrated an example where the first layer FL does not overlap the pad PD.

The description with reference to FIGS. 16 to 18 will be focused on differences from the above-mentioned embodiments so as to avoid redundant description. Components that are not separately explained in the following description of the embodiment of FIGS. 16 to 18 comply with that of the foregoing embodiments. The same reference numeral will be used to designate the same component, and a similar reference numeral will be used to designate a similar component.

Referring to FIGS. 4A, and 16 to 18, the substrate SUB may include a display area DA and a non-display area NDA.

The display area DA may include a pixel area PXA in which the pixels PXL are disposed. In the pixel area PXA, the substrate SUB, the pixel circuit layer PCL, and the display element layer DPL may be provided in the pixel area PXA.

The non-display area NDA may include a dummy pixel area DPXA and a pad area PDA. The dummy pixel DPXL may be disposed in the dummy pixel area DPXA. At least one pad PD may be disposed in the pad area PDA.

In one or more embodiments, some components included in the pixel circuit layer PCL in the display area DA (or the pixel area PXA) may be provided in common in the dummy pixel area DPXA and the pad area PDA. For example, the buffer layer BFL, the gate insulating layer GI, the interlayer insulating layer ILD, the passivation layer PSV, and the via layer VIA that are included in the pixel circuit layer PCL in the display area DA (or the pixel area PXA) may be provided in common in the dummy pixel area DPXA and the pad area PDA. The via layer VIA provided in the pad area PDA may include a first pad opening OPN1 that exposes the pad PD.

In one or more embodiments, some components included in the display element layer DPL in the display area DA (or the pixel area PXA) may be provided in common in the dummy pixel area DPXA and/or the pad area PDA. For example, the first insulating layer INS1, the fourth insulating layer INS4, the first capping layer CPL1, the second capping layer CPL2, and the second layer SL that are included in the display element layer DPL in the display area DA (or the pixel area PXA) may be provided in common in the dummy pixel area DPXA and the pad area PDA. The first insulating layer INS1, the fourth insulating layer INS4, the first capping layer CPL1, the second capping layer CPL2, and the second layer SL that are provided in the pad area PDA each may include a second pad opening OPN2 formed to expose each of the pads PD. The second pad opening OPN2 may correspond to the first pad opening OPN1.

In one or more embodiments, the light block pattern LBP and the bank BNK that are included in the display element layer DPL in the display area DA (or the pixel area PXA) may be provided in the dummy pixel area DPXA.

The first layer FL may be disposed on the first capping layer CPL1 in the display area DA (or the pixel area PXA). The first layer FL may be applied to the first capping layer CPL1 by an inkjet printing method and cured through a curing process so that the position thereof is fixed.

As illustrated in FIG. 16, the first layer FL may be disposed on the entirety of the first capping layer CPL1 in the display area DA (or the pixel area PXA) such that the first layer FL does not overlap a portion of the bank BNK disposed in the dummy pixel area DPXA (or the bank BNK disposed in the dummy pixel area DPXA at a position closest to the display area DA). The first layer FL may be disposed in only the display area DA and spaced from the second pad opening OPN2 of the pad area PDA by a sufficient distance.

The first layer FL may be completely covered with the second capping layer CPL2 and the second layer SL that are disposed thereover in the display area DA (or the pixel area PXA) so that the first layer FL may be prevented from being exposed to the outside during the etching process of forming the second pad opening OPN2 in the pad area PDA. Therefore, a separation defect (e.g., a delamination phenomenon) of the first layer FL may be prevented from occurring.

In one or more embodiments, as illustrated in FIG. 17, the first layer FL may be disposed on the overall surface of the first capping layer CPL1 in both the display area DA (or the pixel area PXA) and the dummy pixel area DPXA. For example, the first layer FL may extend from the first capping layer CPL1 in the display area DA (or the pixel area PXA) to the first capping layer CPL1 in the dummy pixel area DPXA. In other words, the first layer FL may be disposed on only the first capping layer CPL1 in the display area DA (or the pixel area PXA) and the first capping layer CPL1 in the dummy pixel area DPXA and thus spaced from the second pad opening OPN2 of the pad area PDA by a sufficient distance. The first layer FL may be completely covered with the second capping layer CPL2 and the second layer SL that are disposed thereover in the dummy pixel area DPXA so that the first layer FL may be prevented from being exposed to the outside during the etching process of forming the second pad opening OPN2 in the pad area PDA. Therefore, a separation defect (e.g., delamination phenomenon) of the first layer FL may be prevented from occurring.

In one or more embodiments, as illustrated in FIG. 18, the first layer FL may be disposed on the overall surface of the first capping layer CPL1 in all of the display area DA (or the pixel area PXA), the dummy pixel area DPXA, and at least one area of the pad area PDA. For example, the first layer FL may extend from the first capping layer CPL1 in the display area DA to the first capping layer CPL1 in the pad area PDA via the first capping layer CPL1 in the dummy pixel area DPXA. In other words, the first layer FL may be disposed on only the first capping layer CPL1 in the display area DA (or the pixel area PXA), the first capping layer CPL1 in the dummy pixel area DPXA, and the first capping layer CPL1 in at least one area of the pad area PDA, and thus spaced from the second pad opening OPN2 of the pad area PDA by a sufficient distance. The first layer FL may be completely covered with the second capping layer CPL2 and the second layer SL that are disposed thereover in at least one area of the pad area PDA and may be spaced from the second pad opening OPN2, so that the first layer FL may be prevented from being exposed to the outside during the etching process of forming the second pad opening OPN2 in the pad area PDA. Therefore, a separation defect (e.g., a delamination phenomenon) of the first layer FL may be prevented from occurring.

Figure 19:
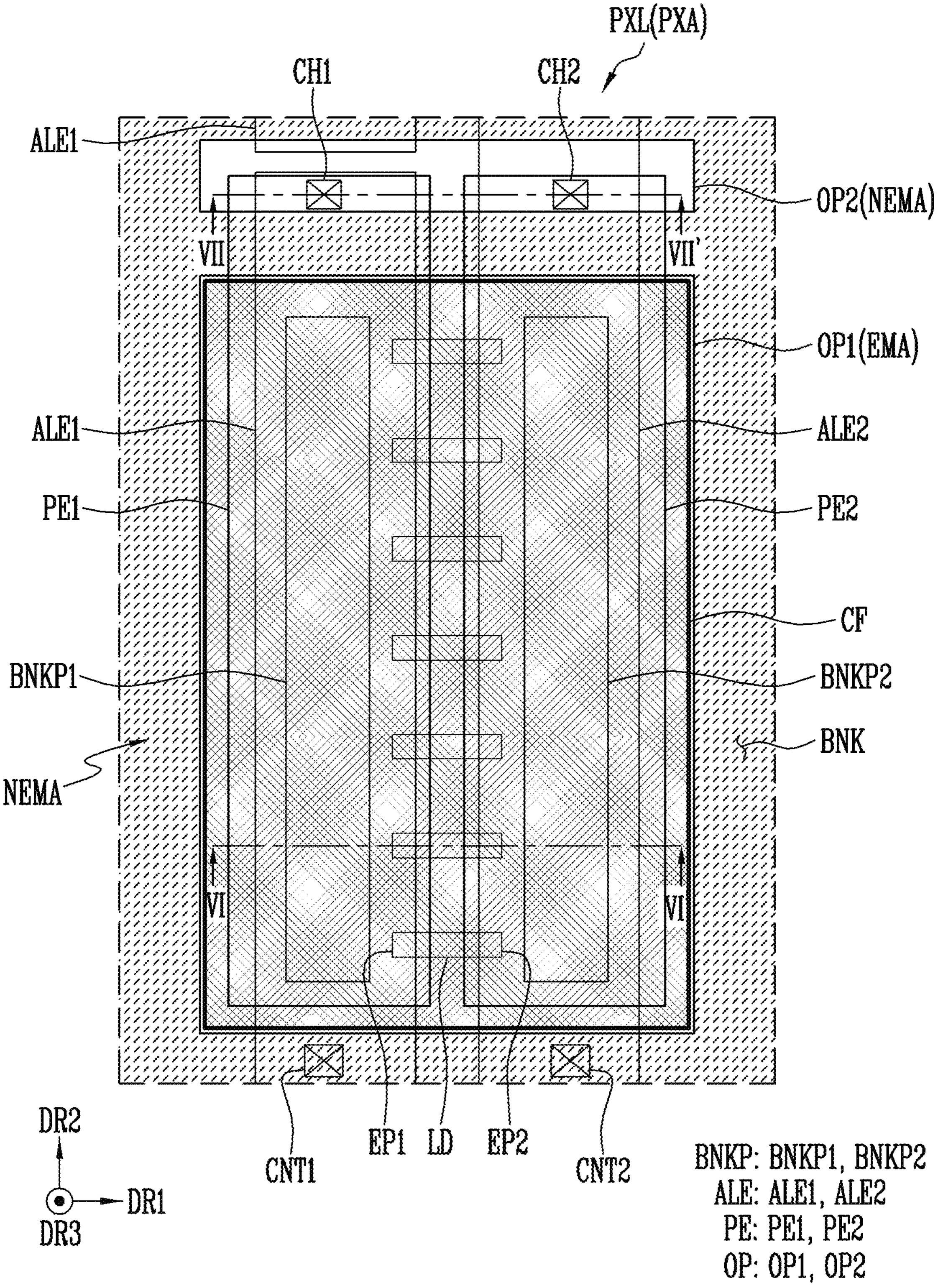
FIG. 19 is a plan view schematically illustrating each pixel illustrated in FIG. 4A.
Figure 20:
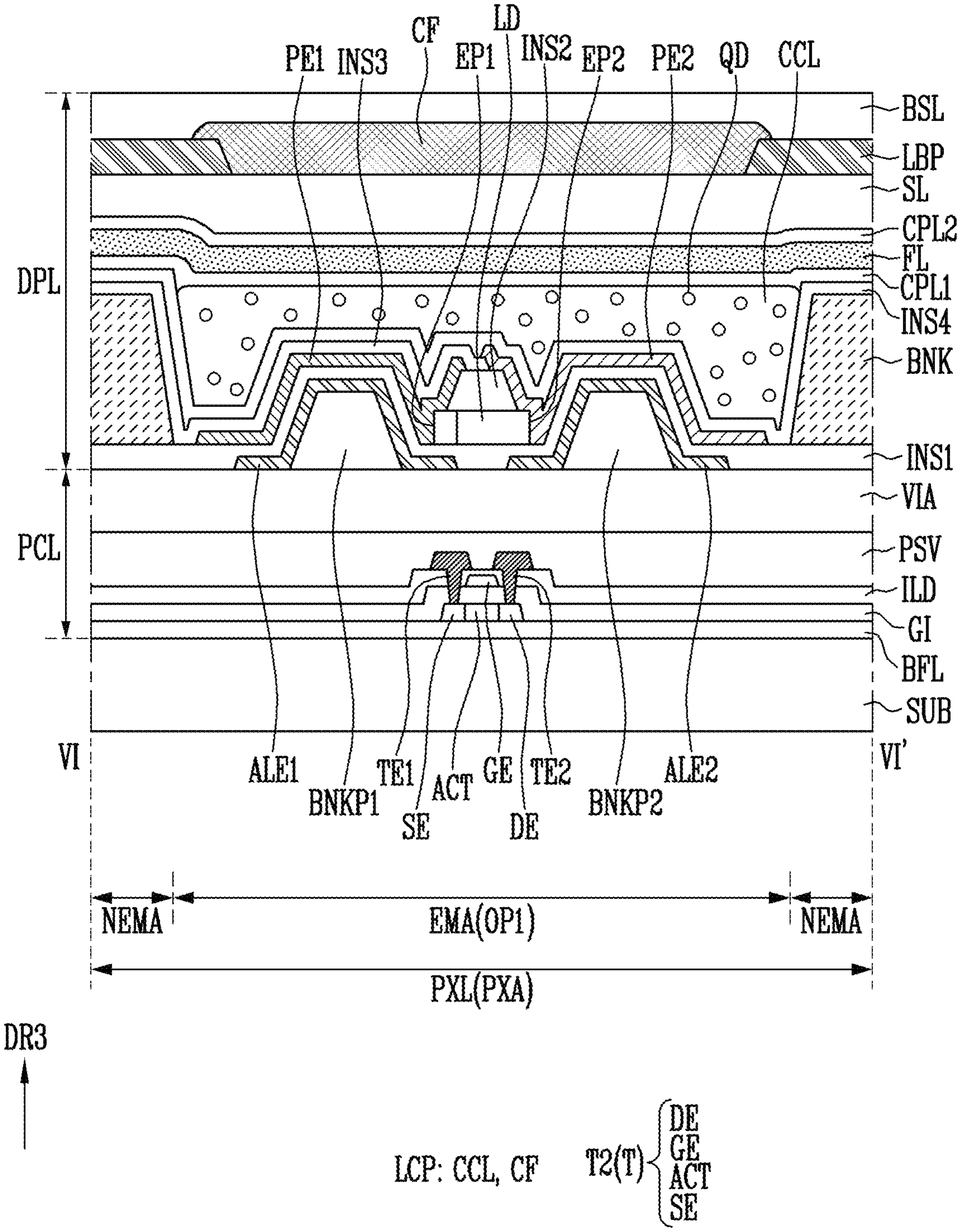
FIG. 20 is a schematically cross-sectional view taken along the line VI-VI' of FIG. 19.
Figure 21:
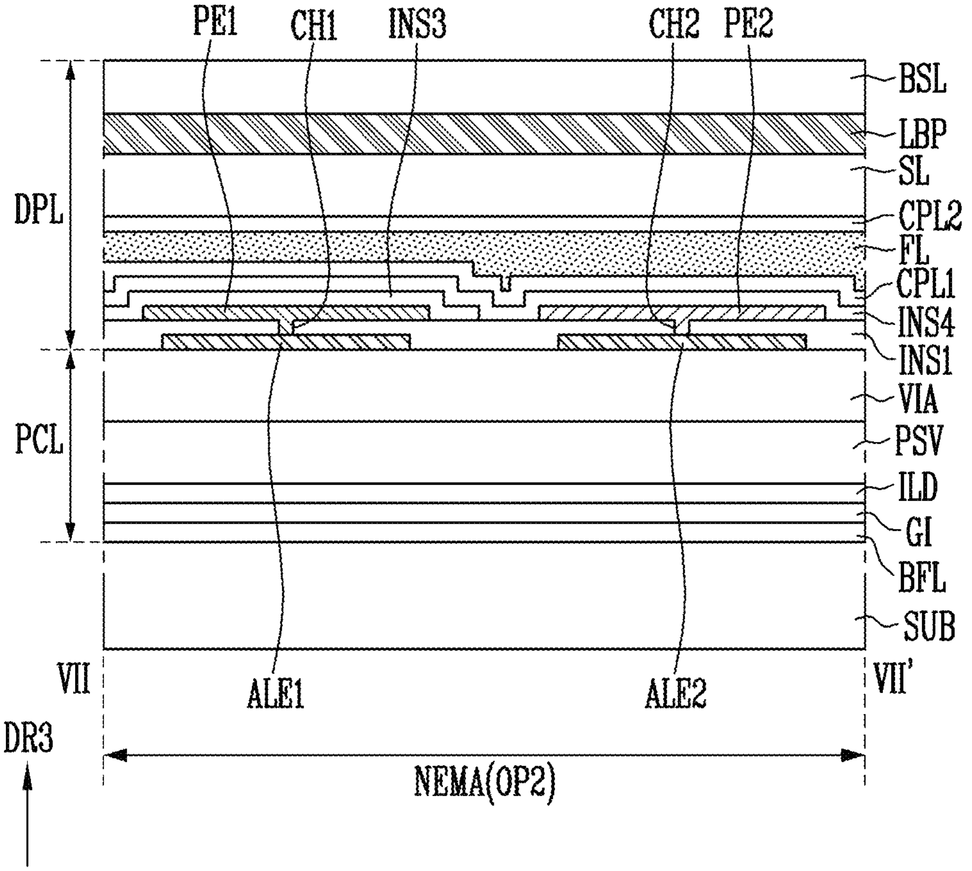
FIG. 21 is a schematically cross-sectional view taken along the line VII-VII' of FIG. 19.
Figure 22A:
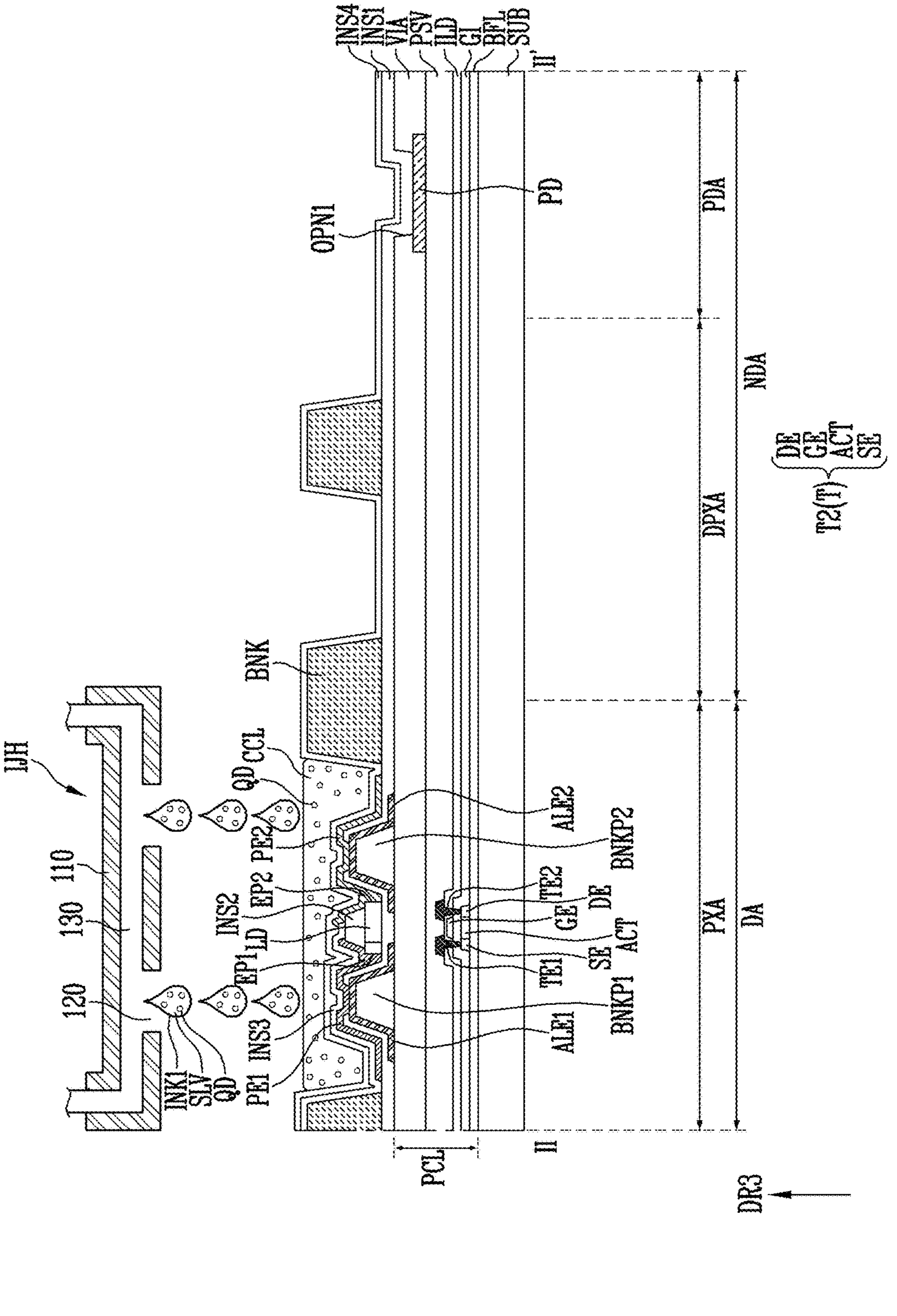
FIGS. 22A to 22I are views for schematically describing a method of fabricating the display device in accordance with one or more embodiments, and are schematically cross-sectional views corresponding to the line II-II' of FIG. 4A.
Figure 22B:
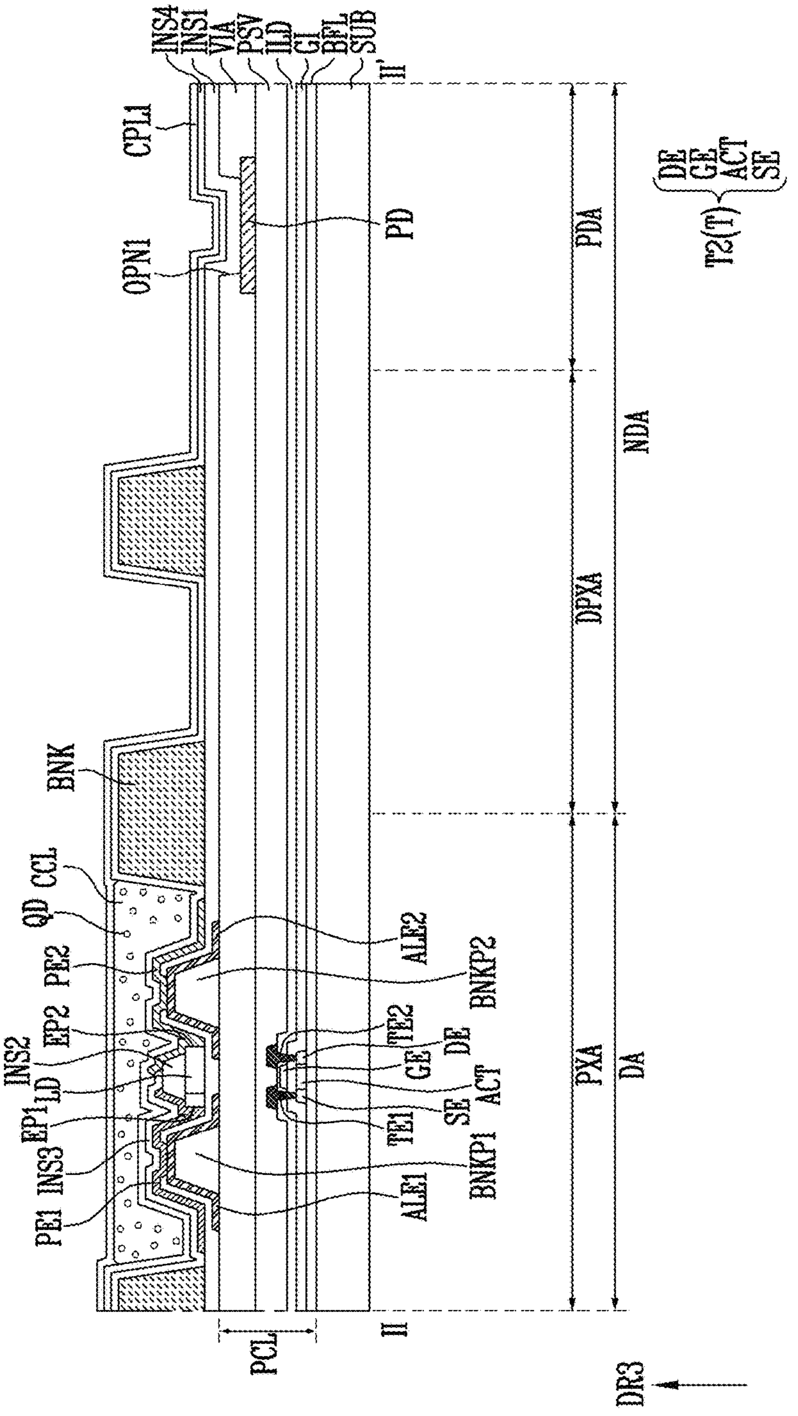
Figure 22C:
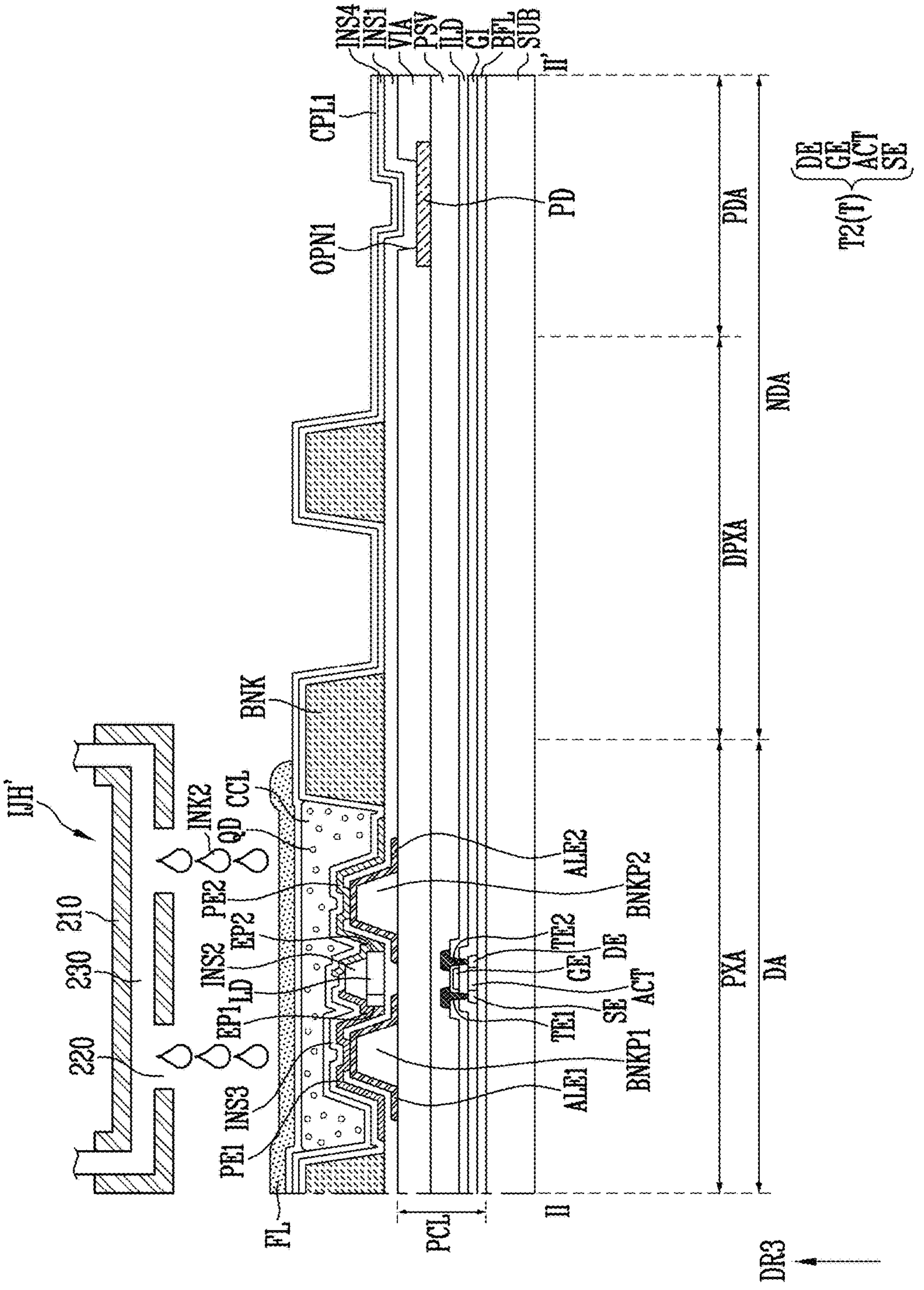
Figure 22D:
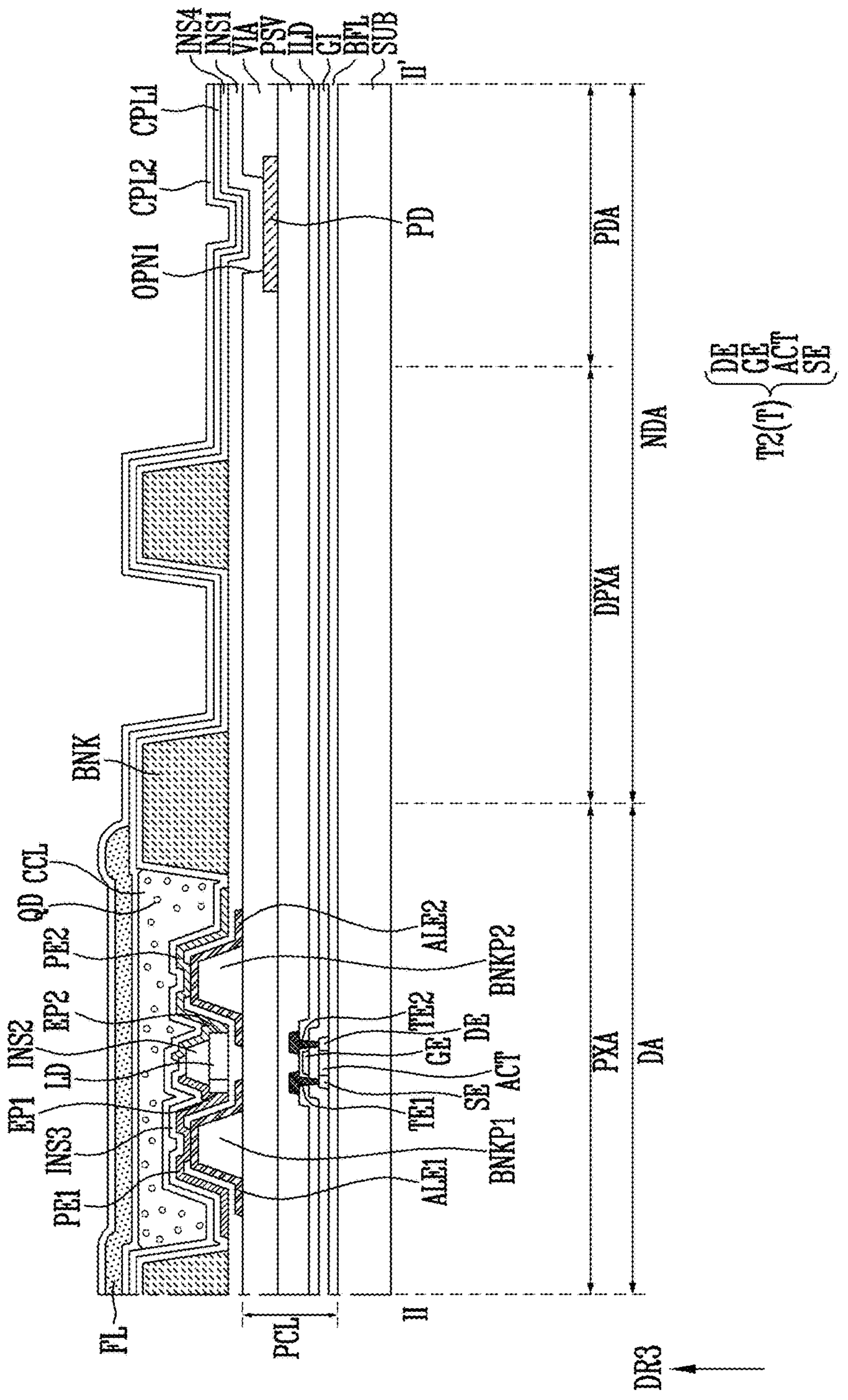
Figure 22E:
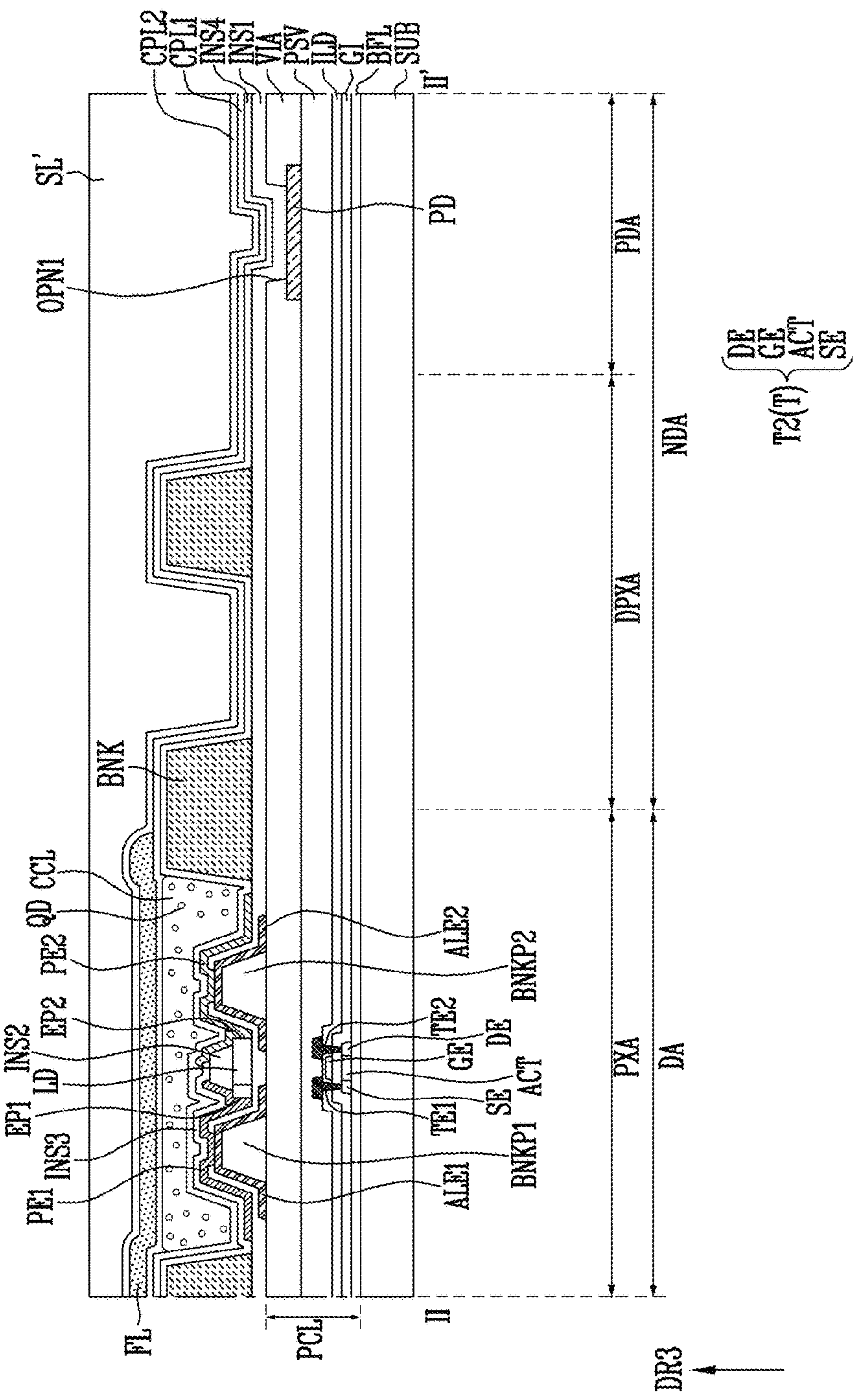
Figure 22F:
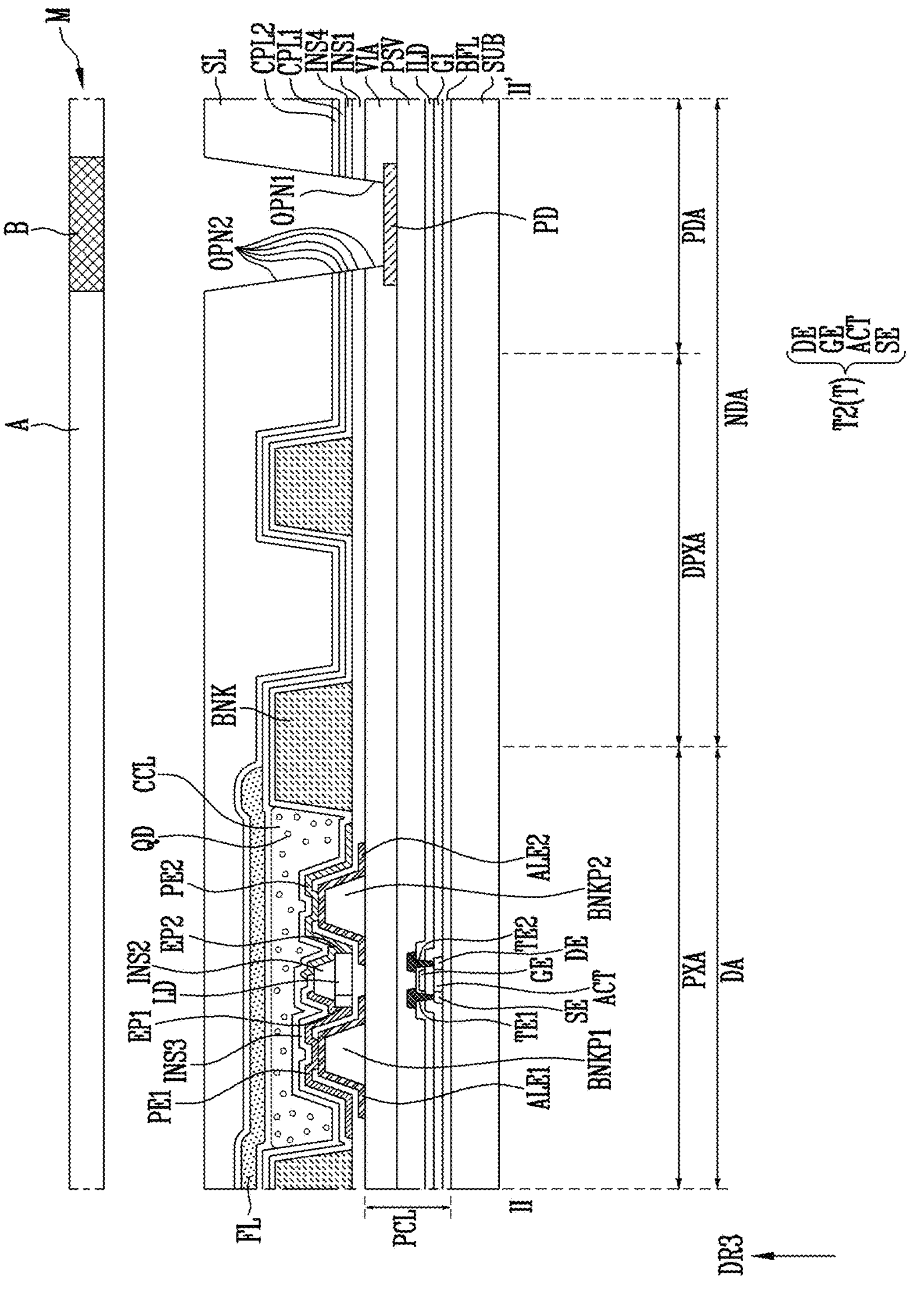
Figure 22G:
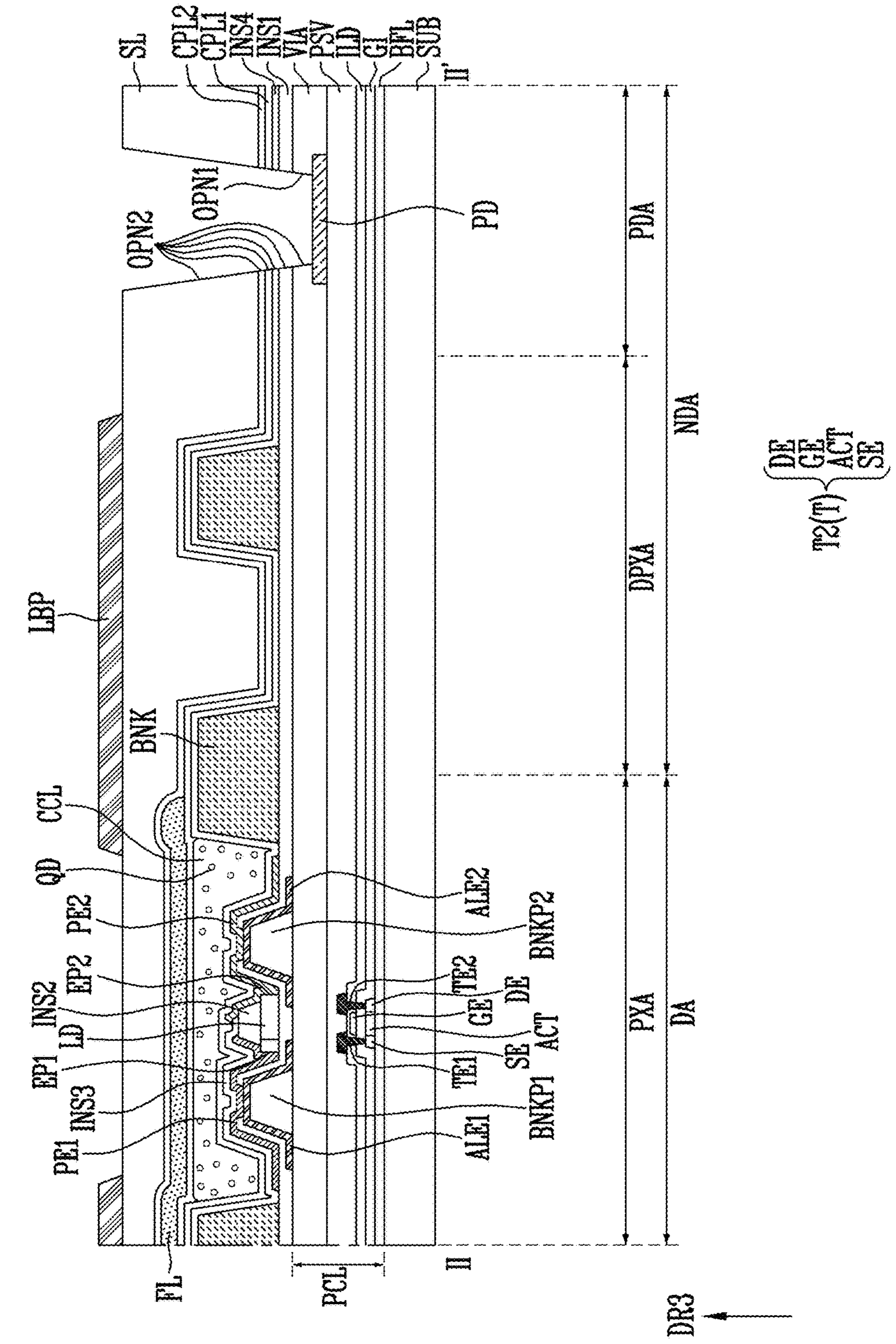
Figure 22H:
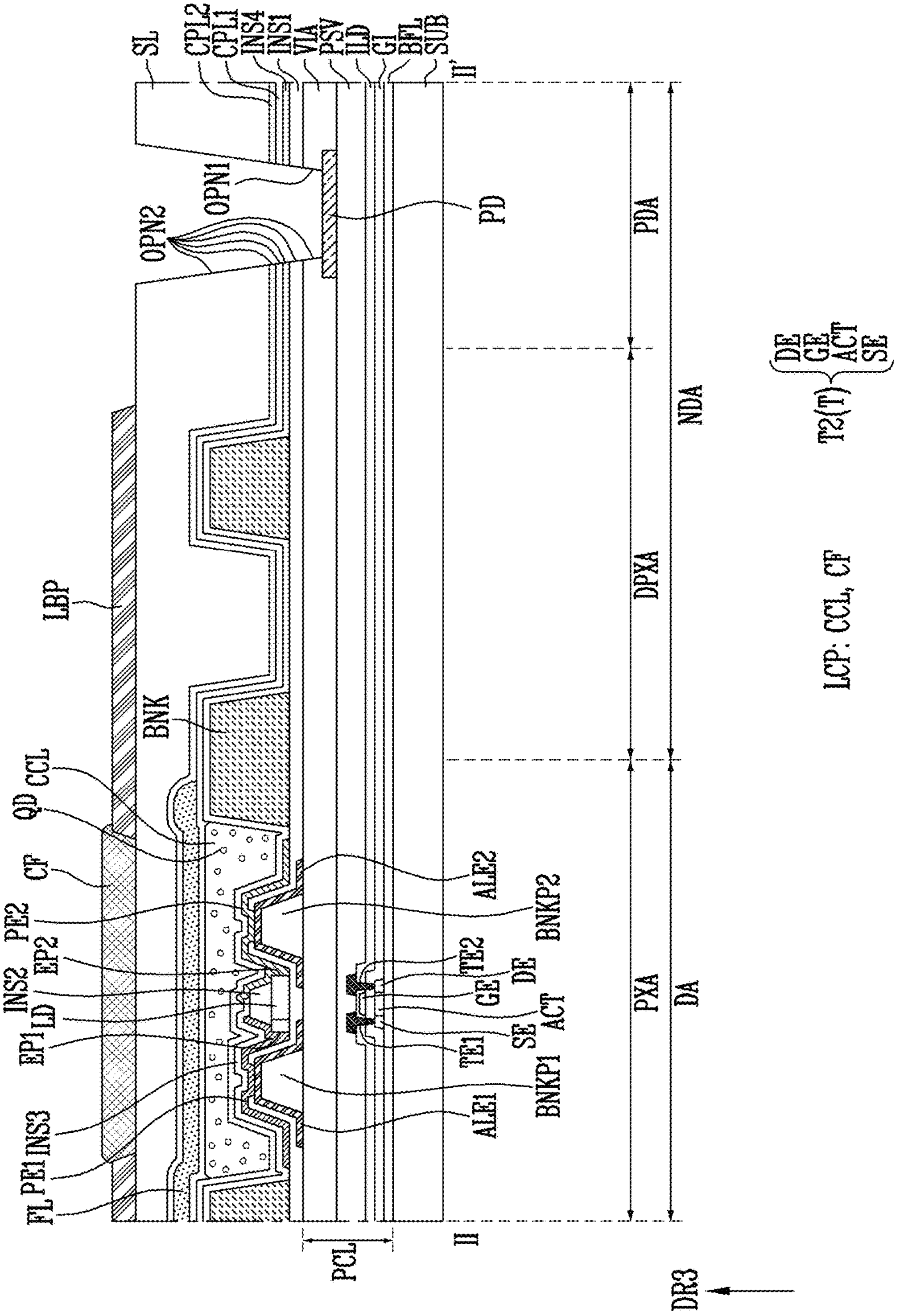
Figure 22I:
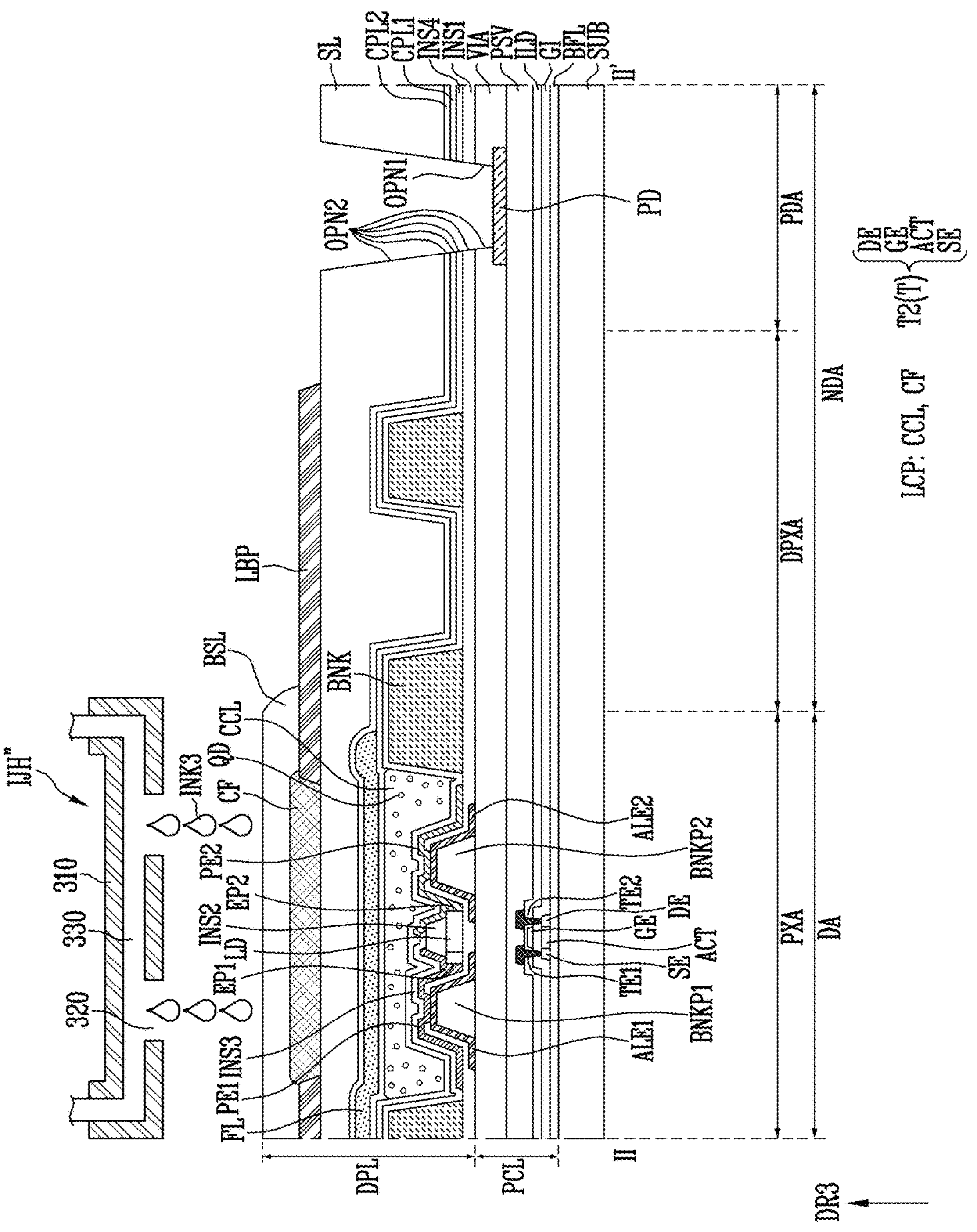

FIG. 19 is a plan view schematically illustrating each pixel PXL illustrated in FIG. 4A. FIG. 20 is a schematically cross-sectional view taken along the line VI-VI' of FIG. 19. FIG. 21 is a schematically cross-sectional view taken along the line VII-VII' of FIG. 19.

The pixel PXL illustrated in FIGS. 19 to 21, other than the fact that electrical connection between the pixel electrode PE and the alignment electrode ALE is formed in the second opening OP2 of the bank BNK, may have a configuration substantially equal or similar to that of the pixel PXL illustrated in FIGS. 7 to 13.

Therefore, to avoid redundant explanation, the description of the pixel PXL of FIGS. 19 to 21 will be focused on differences from that of the foregoing embodiments.

Referring to FIGS. 4A, and 19 to 21, the pixel electrode PE and the alignment electrode ALE may be electrically connected to each other in the non-emission area NEMA of the pixel PXL. For example, the first pixel electrode PE1 and the first alignment electrode ALE1 may be electrically and/or physically connected to each other through a first contact hole CH1 in the second opening OP2 (or the electrode separation area) of the bank BNK included in the non-emission area NEMA. The second pixel electrode PE2 and the second alignment electrode ALE2 may be electrically and/or physically connected to each other through a second contact hole CH2 in the second opening OP2 of the bank BNK.

The first and second contact holes CH1 and CH2 may be disposed in the second opening OP2 of the bank BNK that is an electrode separation area, and may be formed by removing portions of at least one insulating layer disposed between the alignment electrode ALE and the pixel electrode PE. For example, the first contact hole CH1 may be located in the second opening OP2 of the bank BNK and formed by removing a portion of the first insulating layer INS1 disposed between the first alignment electrode ALE1 and the first pixel electrode PE1. The first contact hole CH1 may expose one area of the first alignment electrode ALE1 in at least the non-emission area NEMA. The second contact hole CH2 may be located in the second opening OP2 of the bank BNK and formed by removing a portion of the first insulating layer INS1 disposed between the second alignment electrode ALE2 and the second pixel electrode PE2. The second contact hole CH2 may expose one area of the second alignment electrode ALE2 in at least the non-emission area NEMA.

If electrical connection between the first pixel electrode PE1 and the first alignment electrode ALE1 and electrical connection between the second pixel electrode PE2 and the second alignment electrode ALE2 are formed in the second opening OP2 of the bank BNK that is an electrode separation area (e.g., if the first pixel electrode PE1 and the first alignment electrode ALE1 are electrically connected to each other in the non-emission area NEMA, and the second pixel electrode PE2 and the second alignment electrode ALE2 are electrically connected to each other in the non-emission area NEMA), the first insulating layer INS1 disposed between the first pixel electrode PE1 and the first alignment electrode ALE1 and between the second pixel electrode PE2 and the second alignment electrode ALE2 may not be open in at least the emission area EMA, as illustrated in FIG. 20. Consequently, in at least the emission area EMA, the first and second alignment electrodes ALE1 and ALE2 may be completely covered with the first insulating layer INS1.

FIGS. 22A to 22I are views for schematically describing a method of fabricating the display device in accordance with one or more embodiments, and are schematically cross-sectional views corresponding to the line II-II' of FIG. 4A.

Herein, there is illustrated the case where the steps of fabricating the display device DD are sequentially performed according to the sectional views, but without changing the scope of the present disclosure, some steps illustrated as being successively performed may be concurrently (e.g., simultaneously) performed, the sequence of the steps may be changed, some steps may be skipped, or another step may be further included between the steps.

The description with reference to FIGS. 22A to 22I will be focused on differences from the above-mentioned embodiments so as to avoid redundant description.

Referring to FIGS. 4A, 7, 16, and 22A, first ink INK1 may be supplied (or input), by an inkjet printing method, onto the fourth insulating layer INS4 disposed in the emission area EMA of the pixel PXL that is defined by the bank BNK.

An inkjet head unit IJH may be disposed such that a nozzle 120 thereof is disposed over the substrate SUB including the pixel circuit layer PCL, the bank patterns BNKP, the alignment electrodes ALE, the first insulating layer INS1, the bank BNK, the light emitting elements LD, the second insulating layer INS2, the pixel electrodes PE, the third insulating layer INS3, and the fourth insulating layer INS4.

The inkjet head unit IJH may include a print head 110, and at least one nozzle 120 located on a lower surface of the print head 110. The print head 110 may have a shape extending in one direction, but the present disclosure is not limited thereto. The print head 110 may include an internal tube 130 formed in the direction in which the print head 110 extends. The nozzle 120 may be coupled to the internal tube 130 of the print head 110. The first ink INK1 including a solvent SLV and a plurality of color conversion particles QD included (or dispersed) in the solvent SLV may be supplied to the internal tube 130. The first ink INK1 may flow along the internal tube 130 and may be supplied to the emission area EMA defined by the bank BNK through the nozzle 120. The first ink INK1 may be supplied onto the fourth insulating layer INS4 disposed in the emission area EMA through the nozzle 120. A supply rate of the first ink INK1 may be adjusted in response to a signal applied to the nozzle 120.

After the first ink INK1 is supplied onto the fourth insulating layer INS4 of the emission area EMA of the pixel PXL through the nozzle 120, the color conversion layer CCL including the color conversion particles QD may be formed by curing the first ink INK1 through a curing process such as a thermal curing process or a photo-curing process. The color conversion layer CCL may be disposed on the fourth insulating layer INS4 and correspond to the light emitting elements LD in at least the emission area EMA. The color conversion layer CCL may be disposed in only the pixel area PXA (or the display area DA) and may not be disposed in the dummy pixel area DPXA and the pad area PDA. Here, each pad PD disposed in the pad area PDA may be at least partially exposed through the first pad opening OPN1 of the via layer VIA. A portion of each exposed pad PD may be covered with the first insulating layer INS1 and the fourth insulating layer INS4.

Referring to FIGS. 4A, 7, 16, 22A, and 22B, the first capping layer CPL1 may be formed in the display area DA (or the pixel area PXA), the dummy pixel area DPXA, and the pad area PDA by a chemical vapor deposition method or the like.

The first capping layer CPL1 may be formed on the color conversion layer CCL and the fourth insulating layer INS4 in the display area DA (or the pixel area PXA) and on the fourth insulating layer INS4 in each of the dummy pixel area DPXA and the pad area PDA.

The first capping layer CPL1 may be an inorganic layer (or an inorganic insulating layer) including inorganic material. For example, the first capping layer CPL1 may include at least one of metal oxides such as silicon nitride ($SiN_x$), silicon oxide ($SiO_x$), silicon oxynitride ($SiO_xN_y$), and aluminum oxide ($AlO_x$).

Referring to FIGS. 4A, 7, 16, and 22A to 22C, second ink INK2 may be applied to the first capping layer CPL1 in the display area DA (or the pixel area PXA) by an inkjet printing method. For example, another inkjet head unit IJH' may be disposed such that a nozzle 220 thereof is located over the first capping layer CPL1 in the display area DA by a preset distance. Thereafter, the second ink INK2 may be applied (in a coating manner) to the first capping layer CPL1. The inkjet head unit IJH' may include a print head 210, and the nozzle 220 located on a lower surface of the print head 210. The nozzle 220 may be coupled to the internal tube 230 of the print head 210. The second ink INK2 may be supplied to the internal tube 230. The second ink INK2 may flow along the internal tube 230 and may be applied to the first capping layer CPL1 disposed in the display area DA through the nozzle 220. In one or more embodiments, the second ink INK2 may include solids and a solvent. Here, the solids may include resin and hollow silica particles.

After the second ink INK2 is supplied onto the first capping layer CPL1 in the display area DA through the nozzle 220, the first layer FL formed of a porous organic layer may be formed by curing the second ink INK2 through a curing process such as a thermal curing process or a photo-curing process. The first layer FL may be disposed on the overall surface of the first capping layer CPL1 in at least the display area DA.

The first layer FL may be disposed in only the display area DA and may not be disposed in the dummy pixel area DPXA and the pad area PDA. However, the present disclosure is not limited thereto. In one or more embodiments, the position of the nozzle 220 of the inkjet head unit IJH' may be changed, so that the second ink INK2 that is base material of the first layer FL may be applied to each of a portion of the first capping layer CPL1 of the dummy pixel area DPXA and a portion of the first capping layer CPL1 of the pad area PDA. As a result, the first layer FL may be disposed in a portion of the dummy pixel area DPXA and/or a portion of the pad area PDA.

The first layer FL formed on the first capping layer CPL1 in the display area DA (or the pixel area PXA) may have a thickness ranging from 0.1 μm to 5 μm and a refractive index ranging from 1.1 to 1.3 through the forgoing process, but the present disclosure is not limited thereto. In one or more embodiments, the first layer FL may have a thickness ranging from 0.5 μm to 2.5 μm.

Referring to FIGS. 4A, 7, 16, 22A, and 22D, the second capping layer CPL2 may be formed in the display area DA (or the pixel area PXA), the dummy pixel area DPXA, and the pad area PDA by a chemical vapor deposition method or the like.

The second capping layer CPL2 may be formed on the first layer FL in the display area DA (or the pixel area PXA) and on the first capping layer CPL1 in each of the dummy pixel area DPXA and the pad area PDA. The first layer FL may be covered with the second capping layer CPL2 in the display area DA (or the pixel area PXA).

The second capping layer CPL2 may be an inorganic layer (or an inorganic insulating layer) including inorganic material. For example, the second capping layer CPL2 may include at least one of metal oxides such as silicon nitride ($SiN_x$), silicon oxide ($SiO_x$), silicon oxynitride ($SiO_xN_y$), and aluminum oxide ($AlO_x$).

Referring to FIGS. 4A, 7, 16, 22A, and 22E, an organic material layer SL' may be formed in the display area DA (or the pixel area PXA), the dummy pixel area DPXA, and the pad area PDA. The organic material layer SL' may be formed of an organic layer (or an organic insulating layer) including organic material as base material for forming the second layer SL. For example, the organic material layer SL' may be made of transparent organic material.

The organic material layer SL' may be formed on the second capping layer CPL2 in each of the display area DA (or the pixel area PXA), the dummy pixel area DPXA, and the pad area PDA, and cover the second capping layer CPL2. The organic material layer SL' may be formed to have a substantially planar surface (or upper surface) in the entirety of the display area DA (or the pixel area PXA), the dummy pixel area DPXA, and the pad area PDA.

Referring to FIGS. 4A, 7, 16, and 22A to 22F, the second layer SL including the second pad opening OPN2 that exposes each pad PD in the pad area PDA may be formed by performing an etching process after a mask M is disposed over the organic material layer SL'. The mask M may include a block portion A and a transmission portion B. The foregoing etching process may be a dry etching process.

If the dry etching process is performed after the mask M is disposed over the organic material layer SL' such that the transmission portion B of the mask M corresponds to the first pad opening OPN1 of the via layer VIA, the organic material layer SL', the second capping layer CPL2, the first capping layer CPL1, the fourth insulating layer INS4, and the first insulating layer INS1 may be collectively etched by plasma passing through the transmission portion B. Hence, the organic material layer SL', the second capping layer CPL2, the first capping layer CPL1, the fourth insulating layer INS4, and the first insulating layer INS1 each may have a second pad opening OPN2 that exposes at least a portion of each of the pads PD in at least the pad area PDA.

The organic material layer SL' etched to include the second pad opening OPN2 through the foregoing etching process may eventually become the second layer SL.

While the foregoing etching process is performed, the first layer FL may be disposed in the display area DA (or the pixel area PXA) and covered with the second capping layer CPL2 and the second layer SL that are disposed over the first layer FL, so that the first layer FL may be prevented from being exposed to the outside. Hence, the first layer FL may not be affected by plasma used during the foregoing etching process, so that a separation defect (e.g., a delamination phenomenon) of the first layer FL may be prevented from occurring.

Referring to FIGS. 4A, 7, 16, and 22A to 22G, the light block pattern LBP may be formed on the second layer SL having a planar surface.

The light block pattern LBP may be formed on one surface of the second layer SL in the display area DA (or the pixel area PXA) and on one surface of the second layer SL in the dummy pixel area DPXA. The light block pattern LBP may not be formed in the pad area PDA, but the present disclosure is not limited thereto. In one or more embodiments, the light block pattern LBP may be located in one area of the pad area PDA within a range in which the light block pattern LBP does not affect electrical connection between the driver (refer to "DIC" of FIG. 4B) and each pad PD exposed through the second pad opening OPN2.

Referring to FIGS. 4A, 7, 16, and 22A to 22H, the color filter CF may be formed in the emission area EMA of the display area DA (or the pixel area PXA). The color filter CF may be formed on one surface of the second layer SL in the emission area EMA and partially overlap the light block pattern LBP.

The color filter CF may correspond to the color conversion layer CCL, and form the light conversion pattern LCP, along with the color conversion layer CCL.

Referring to FIGS. 4A, 7, 16, and 22A to 22I, third ink INK3 may be applied to the color filter CF and the light block pattern LBP in the display area DA by an inkjet printing method. For example, another inkjet head unit IJH" may be disposed such that a nozzle 320 thereof is located over the color filter CF and the light block pattern LBP in the display area DA by a preset distance. Thereafter, the third ink INK3 may be applied (in a coating manner) to the color filter CF and the light block pattern LBP. The inkjet head unit IJH" may include a print head 310, and the nozzle 320 located on a lower surface of the print head 310. The nozzle 320 may be coupled to the internal tube 330 of the print head 310. The third ink INK3 may be supplied to the internal tube 330. The third ink INK3 may flow along the internal tube 330 and may be applied to the color filter CF and the light block pattern LBP through the nozzle 320.

After the third ink INK3 is supplied onto the color filter CF and the light block pattern LBP in the display area DA through the nozzle 320, the base layer BSL may be formed by curing the third ink INK3 through a curing process such as a thermal curing process or a photo-curing process. The base layer BSL may be disposed on the light block pattern LBP and the color filter CF in the display area DA.

In the display device DD formed by the forgoing fabrication method, the first layer FL may not be formed in the pad area PDA, so that the first layer FL may be fundamentally prevented from being exposed through an etching process of exposing each pad PD. Consequently, a separation defect that may be caused by damage to the first layer FL due to plasma used during the etching process may be prevented from occurring. Hence, the reliability of the display device DD may be enhanced.

Figure 23:
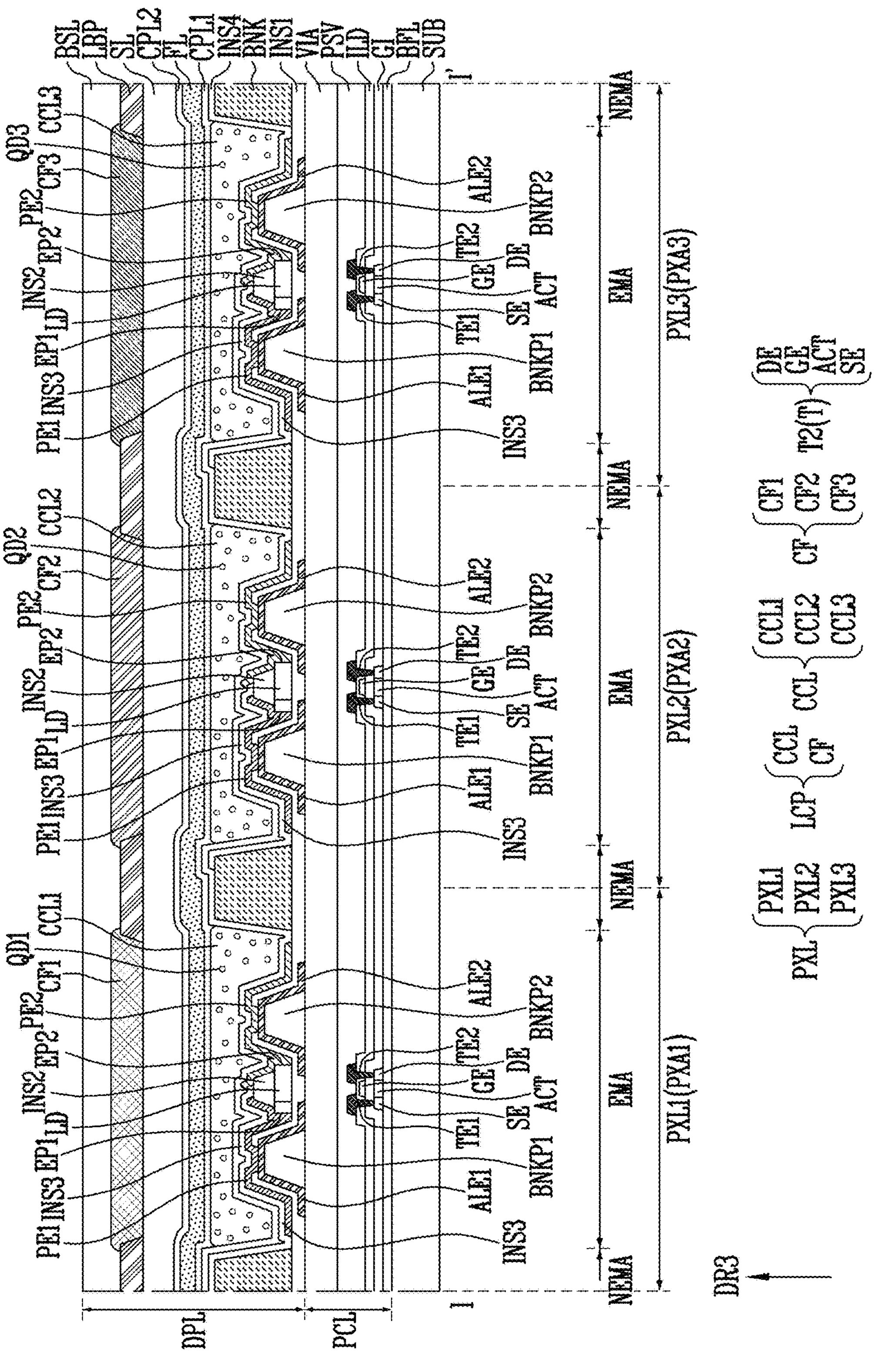
FIG. 23 is a schematically cross-sectional view taken along the line I-I' of FIG. 4A.

FIG. 23 is a schematically cross-sectional view taken along the line I-I' of FIG. 4A.

To avoid redundant explanation, the description of first to third pixels PXL1, PXL2, and PXL3 of FIG. 23 will be focused on differences from those of the foregoing embodiments. Components that are not separately explained in the following description of the embodiment comply with that of the foregoing embodiments. The same reference numeral will be used to designate the same component, and a similar reference numeral will be used to designate a similar component.

For the sake of explanation, FIG. 23 illustrates only some components of each of the first to third pixels PXL1, PXL2, and PXL3.

Referring to FIGS. 4A and 23, the first pixel PXL1 (or a first sub-pixel), the second pixel PXL2 (or a second sub-pixel), and the third pixel PXL3 (or a third sub-pixel) may be arranged along one direction. Each of the first to third pixels PXL1, PXL2, and PXL3 may have the same configuration as that of the pixel PXL described with reference to FIGS. 7 to 13.

The display area DA of the substrate SUB may include a first pixel area PXA1 in which the first pixel PXL1 is provided, a second pixel area PXA2 in which the second pixel PXL2 is provided, and a third pixel area PXA3 in which the third pixel PXL3 is provided. In one or more embodiments, the first pixel PXL1 may be a red pixel, the second pixel PXL2 may be a green pixel, and the third pixel PXL3 may be a blue pixel. However, the present disclosure is not limited thereto. In one or more embodiments, the second pixel PXL2 may be a red pixel, the first pixel PXL1 may be a green pixel, and the third pixel PXL3 may be a blue pixel. Alternatively, in one or more embodiments, the third pixel PXL3 may be a red pixel, the first pixel PXL1 may be a green pixel, and the second pixel PXL2 may be a blue pixel.

Each of the first, second, and third pixels PXL1, PXL2, and PXL3 may include an emission area EMA. Furthermore, each of the first, second, and third pixels PXL1, PXL2, and PXL3 may include a non-emission area NEMA adjacent to the emission area EMA of the corresponding pixel PXL. The bank BNK may be disposed in the non-emission area NEMA.

Each of the first, second, and third pixels PXL1, PXL2, and PXL3 may include a substrate SUB, the a pixel circuit layer PCL, and a display element layer DPL.

The pixel circuit layer PCL of each of the first, second, and third pixels PXL1, PXL2, and PXL3 may include a buffer layer BFL disposed on the substrate SUB, at least one transistor T disposed on the buffer layer BFL, a passivation layer PSV disposed on the transistor T, and a via layer VIA disposed on the passivation layer PSV. The transistor T may be the second transistor T2.

The display element layer DPL of the first pixel PXL1 may include first and second bank patterns BNKP1 and BNKP2, first and second alignment electrodes ALE1 and ALE2, a first insulating layer INS1, a bank BNK, a second insulating layer INS2, at least one light emitting element LD, a third insulating layer INS3, first and second pixel electrodes PE1 and PE2, and a fourth insulating layer INS4. Furthermore, the display element layer DPL of the first pixel PXL1 may include a first color conversion layer CCL1, a first capping layer CPL1, a first layer FL, a second capping layer CPL2, a second layer SL, a first color filter CF1, a light block pattern LBP, and a base layer BSL.

The first color conversion layer CCL1 may be supplied (or input), by an inkjet printing method, to the emission area EMA of the first pixel PXL1 defined by the bank BNK. The first color conversion layer CCL1 may include first color conversion particles QD1 for converting light emitted from the light emitting element LD to red light. For example, the first color conversion particles QD1 may be red quantum dots. The first color filter CF1 may be a red color filter.

The display element layer DPL of the second pixel PXL2 may include first and second bank patterns BNKP1 and BNKP2, first and second alignment electrodes ALE1 and ALE2, a first insulating layer INS1, a bank BNK, a second insulating layer INS2, at least one light emitting element LD, a third insulating layer INS3, first and second pixel electrodes PE1 and PE2, and a fourth insulating layer INS4. Furthermore, the display element layer DPL of the second pixel PXL2 may include a second color conversion layer CCL2, a first capping layer CPL1, a first layer FL, a second capping layer CPL2, a second layer SL, a second color filter CF2, a light block pattern LBP, and a base layer BSL.

The second color conversion layer CCL2 may be supplied (or input), by an inkjet printing method, to the emission area EMA of the second pixel PXL2 defined by the bank BNK. The second color conversion layer CCL2 may include second color conversion particles QD2 for converting light emitted from the light emitting element LD to green light. For example, the second color conversion particles QD2 may be green quantum dots. The second color filter CF2 may be a green color filter.

The display element layer DPL of the third pixel PXL3 may include first and second bank patterns BNKP1 and BNKP2, first and second alignment electrodes ALE1 and ALE2, a first insulating layer INS1, a bank BNK, a second insulating layer INS2, at least one light emitting element LD, a third insulating layer INS3, first and second pixel electrodes PE1 and PE2, and a fourth insulating layer INS4. Furthermore, the display element layer DPL of the third pixel PXL3 may include a third color conversion layer CCL3, a first capping layer CPL1, a first layer FL, a second capping layer CPL2, a second layer SL, a third color filter CF3, a light block pattern LBP, and a base layer BSL.

The third color conversion layer CCL3 may be supplied (or input), by an inkjet printing method, to the emission area EMA of the third pixel PXL3 defined by the bank BNK. The third color conversion layer CCL3 may include third color conversion particles QD3 for converting light emitted from the light emitting element LD to blue light. For example, the third color conversion particles QD3 may be blue quantum dots. In one or more embodiments, the third pixel PXL3 may include a light scattering layer including light scattering particles, in lieu of the third color conversion layer CCL3 including the third color conversion particles QD3. The third color filter CF3 may be a blue color filter.

The first capping layer CPL1 of each of the first, second, and third pixels PXL1, PXL2, and PXL3 may be disposed on the color conversion layer CCL of the corresponding pixel PXL and the fourth insulating layer INS4 on the bank BNK. In one or more embodiments, the first capping layer CPL1 may be provided in common to the first, second, and third pixels PXL1, PXL2, and PXL3. In other words, the first capping layer CPL1 may be a common layer provided to adjacent pixels PXL.

The first layer FL of each of the first, second, and third pixels PXL1, PXL2, and PXL3 may be disposed on the first capping layer CPL1. The first layer FL may be provided in common to the first, second, and third pixels PXL1, PXL2, and PXL3. In other words, the first layer FL may be a common layer provided to adjacent pixels PXL. The first layer FL may be applied to the overall surface of the first capping layer CPL1 by an inkjet printing method and cured through a curing process. In other words, the first layer FL may change, using a difference in refractive index, the direction of a path of a lost part of light emitted from each of the first, second, and third color conversion layers CCL1, CCL2, and CCL3 to the frontal direction (or the image display direction of the display device DD), thus enhancing frontal light output luminance.

The second capping layer CPL2 of each of the first, second, and third pixels PXL1, PXL2, and PXL3 may be disposed on the overall surface of the first layer FL. The second capping layer CPL2 may be provided in common to the first, second, and third pixels PXL1, PXL2, and PXL3. In other words, the second capping layer CPL2 may be a common layer provided to adjacent pixels PXL. The second capping layer CPL2 may be disposed on the first layer FL and cover the first layer FL to protect the first layer FL.

The second layer SL of each of the first, second, and third pixels PXL1, PXL2, and PXL3 may be disposed on the overall surface of the second capping layer CPL2. The second layer SL may be provided in common to the first, second, and third pixels PXL1, PXL2, and PXL3. In other words, the second layer SL may be a common layer provided to adjacent pixels PXL. The second layer SL may be disposed on the second capping layer CPL2 and cover the second capping layer CPL2 that covers the first layer FL, thus more reliably protecting the first layer FL during the fabrication process.

In a display device and a method of fabricating the display device in accordance with one or more embodiments, a first layer may be formed selectively on only a specific area, so that the first layer may be prevented from being exposed to the outside during a process of forming a pad opening (e.g., an opening that exposes a portion of a pad) of a second layer.

Therefore, a separation defect (or a delamination phenomenon) of the first layer may be prevented from occurring during the foregoing process. As a result, a display device having enhanced reliability and a method of fabricating the display device may be provided.

The effects, aspects, and features of the present disclosure are not limited by the foregoing, and other various effects, aspects, and features are anticipated herein.

While various embodiments have been described above, those skilled in the art will appreciate that various modifications, additions and substitutions are possible, without departing from the scope of the present disclosure.

Therefore, the embodiments disclosed in this specification are only for illustrative purposes rather than limiting the technical scope of the present disclosure. The scope of the present disclosure may be defined by the accompanying claims and equivalents thereof.

What is claimed is:

1. A display device comprising:

a substrate including a display area including a pixel area, and a non-display area including a pad area, the non-display area being located on at least one side of the display area;

a pixel in the pixel area, the pixel including an emission area in which at least one light emitting element is located, and a non-emission area adjacent to the emission area;

a pad in the pad area, the pad being electrically connected to the pixel;

a first layer on the light emitting element at the pixel area; and a second layer in the pixel area and the pad area, the second layer including a pad opening exposing at least a portion of the pad, wherein the first layer comprises an organic layer comprising a hollow particle, wherein the first layer is spaced from the pad opening and covered with the second layer, and wherein the second layer covers a first area of the pad and exposes a second area of the pad.

2. The display device according to claim 1, wherein the pixel comprises:

one or more banks in the non-emission area of the pixel and the non-display area, the one or more banks including a first opening corresponding to the emission area of the pixel and a second opening spaced from the first opening;

the light emitting element in the first opening;

a first electrode and a second electrode in at least the emission area and electrically connected to the light emitting element;

a color conversion layer on the first and the second electrodes, the color conversion layer being located at the emission area and corresponding to the light emitting element, the color conversion layer comprising color conversion particles; and a color filter on the second layer and corresponding to the color conversion layer.

3. The display device according to claim 2, wherein the first layer is on the color conversion layer and is configured to receive a portion of light from the light emitting element that is not converted to a different color light by the color conversion layer, and wherein the second layer is on the first layer and comprises an organic layer having a planar surface.

4. The display device according to claim 3, wherein the first layer is not in the pad area.

5. The display device according to claim 3, wherein the first layer extends from the pixel area to one area of the pad area, and wherein the second layer is on the first layer and covers the first layer.

6. The display device according to claim 3, wherein the non-display area further includes a dummy pixel area between the display area and the pad area, and wherein the substrate, a pixel circuit layer, and at least one bank from among the one or more banks are in the dummy pixel area.

7. The display device according to claim 6, wherein the first layer extends from the pixel area to the dummy pixel area, and wherein the second layer is on the first layer and covers the first layer.

8. The display device according to claim 6, further comprising:

a first capping layer between the color conversion layer and the first layer; and a second capping layer between the first layer and the second layer.

9. The display device according to claim 8, wherein the first and second capping layers are located in the pixel area, the dummy pixel area, and the pad area.

10. The display device according to claim 9, wherein each of the first and the second capping layers comprises an inorganic layer.

11. The display device according to claim 10, wherein the first and the second capping layers have openings in the pad area so that at least a portion of the pad exposed through the pad opening of the second layer is exposed.

12. The display device according to claim 8, further comprising a base layer on the second layer, wherein the base layer comprises a window component.

13. The display device according to claim 12, further comprising a third layer on the base layer, wherein the third layer comprises a low reflective film.

14. The display device according to claim 12, wherein the pixel further comprises a light block pattern between the second layer and the base layer, the light block pattern corresponding to the non-emission area.

15. The display device according to claim 14, wherein the light block pattern comprises a black matrix.

16. The display device according to claim 14, wherein the light block pattern comprises a first color filter, a second color filter, and a third color filter on one surface of the second layer, and wherein the first, the second, and the third color filters comprise respective different color filter materials.

17. An electronic device comprising:

a substrate including a display area and a non-display area, the display area including a pixel area including an emission area and a non-emission area, and the non-display area including a dummy pixel area and a pad area, the non-display area being located on at least one side of the display area;

a pixel circuit layer in the pixel area and including at least one transistor;

a pad in the pad area, and electrically connected to a pixel;

one or more banks on the pixel circuit layer, the one or more banks corresponding to the non-emission area of the pixel area and the non-display area;

at least one light emitting element on the pixel circuit layer, the light emitting element corresponding to the emission area and electrically connected to the transistor;

a first electrode and a second electrode in at least the emission area and electrically connected to the light emitting element;

a color conversion layer on the first and the second electrodes, the color conversion layer being located in the emission area and corresponding to the light emitting element, the color conversion layer comprising color conversion particles;

a first capping layer in the display area, the dummy pixel area, and the pad area, the first capping layer being directly on the color conversion layer in the display area;

a first layer in the display area and located directly on the first capping layer;

a second capping layer in the display area, the dummy pixel area, and the pad area, the second capping layer being directly on the first layer and the first capping layer;

a second layer on the second capping layer in the display area, the dummy pixel area, and the pad area, the second layer including a pad opening exposing at least a portion of the pad; and a color filter on the second layer and corresponding to the emission area, wherein the first layer is spaced from the pad opening and covered with the second layer, and wherein the second layer covers a first area of the pad and exposes a second area of the pad.

18. The electronic device according to claim 17, wherein the first layer is on the color conversion layer and comprises an organic layer configured to receive a portion of light from the light emitting element that is not converted to a different color light by the color conversion layer, and wherein the second layer is on the first layer and comprises an organic layer having a planar surface.

19. The electronic display device according to claim 18, wherein the first layer is not disposed in the pad area.

20. A method of fabricating a display device, comprising:

preparing a substrate including a display area including an emission area and a non-emission area, and a non-display area including a pad area;

forming a pixel circuit layer including at least one transistor on the substrate in the display area, and forming a pad on the substrate in the non-display area, the pad being electrically connected to the pixel circuit layer;

forming a bank on the pixel circuit layer in the non-emission area;

disposing, on the pixel circuit layer in the emission area, a light emitting element electrically connected to the transistor;

forming a first electrode and a second electrode that are electrically connected to the light emitting element;

forming a color conversion layer comprising color conversion particles on the first and the second electrodes;

forming a first capping layer on the color conversion layer and the bank;

forming a first layer on the first capping layer on the color conversion layer;

forming a second capping layer on the first layer and the first capping layer; and forming, on the second capping layer, a second layer including a pad opening exposing at least a portion of the pad, wherein the first layer is spaced from the pad opening and covered with the second layer, and wherein the second layer covers a first area of the pad and exposes a second area of the pad.

* * * * *